(12) United States Patent
Hirose et al.

(10) Patent No.: US 8,018,046 B2
(45) Date of Patent: *Sep. 13, 2011

(54) PRINTED WIRING BOARD WITH NOTCHED CONDUCTIVE TRACES

(75) Inventors: Naohiro Hirose, Ibi-gun (JP); Takashi Kariya, Ibi-gun (JP); Yoji Mori, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 93 days.

This patent is subject to a terminal disclaimer.

(21) Appl. No.: 12/389,456

(22) Filed: Feb. 20, 2009

(65) Prior Publication Data
US 2009/0159327 A1    Jun. 25, 2009

Related U.S. Application Data

(60) Continuation of application No. 11/078,342, filed on Mar. 14, 2005, now Pat. No. 7,525,190, which is a division of application No. 10/108,628, filed on Mar. 29, 2002, now Pat. No. 7,332,816, which is a continuation of application No. 09/700,592, filed as application No. PCT/JP99/02512 on May 13, 1999, now Pat. No. 6,407,345.

(30) Foreign Application Priority Data

| May 19, 1998 | (JP) | 10-155329 |
|---|---|---|
| May 22, 1998 | (JP) | 10-140694 |
| May 22, 1998 | (JP) | 10-140695 |
| Apr. 1, 1999 | (JP) | 11-094725 |

(51) Int. Cl.
*H01L 23/12* (2006.01)
*H05K 1/00* (2006.01)
*H05K 7/00* (2006.01)

(52) U.S. Cl. ... 257/700; 257/701; 257/758; 257/E23.01; 361/777; 174/250

(58) Field of Classification Search .................. None
See application file for complete search history.

(56) References Cited

U.S. PATENT DOCUMENTS 3,654,583 A    4/1972   Mancini
(Continued)

FOREIGN PATENT DOCUMENTS

EP    0 373 356    6/1990
(Continued)

OTHER PUBLICATIONS

Microfilm of the specification and drawings annexed to the request of Japanese Utility Model Application No. 62-121766 (Laid -open No. 64-26873)(Sharp Corp.), Feb. 15, 1989 Claims; figs. 1 to 7.

*Primary Examiner* — Alonzo Chambliss
(74) *Attorney, Agent, or Firm* — Oblon, Spivak, McClelland, Maier & Neustadt, L.L.P.

(57) ABSTRACT

A printed wiring board including a core substrate, a build-up layer formed over the core substrate and including a first insulating layer, a conductor layer formed over the first insulating layer, and a second insulating layer formed over the conductor layer, and one or more wiring patterns formed over the first insulating layer. The conductor layer includes conductor portions, and the conductor portions have notched portions, respectively, facing each other across the wiring pattern.

9 Claims, 33 Drawing Sheets

U.S. PATENT DOCUMENTS

| | | | |
|---|---|---|---|
| 4,551,789 | A | 11/1985 | Schettler et al. |
| 4,710,593 | A | 12/1987 | Hall, Jr. et al. |
| 4,791,238 | A | 12/1988 | Kanno et al. |
| 5,030,799 | A | 7/1991 | Fukuta |
| 5,056,216 | A | 10/1991 | Madou et al. |
| 5,184,095 | A | 2/1993 | Hanz et al. |
| 5,196,251 | A | 3/1993 | Bakhru et al. |
| 5,227,588 | A | 7/1993 | Schreiber et al. |
| 5,278,727 | A | 1/1994 | Westbrook et al. |
| 5,315,072 | A | 5/1994 | Arai et al. |
| 5,329,423 | A | 7/1994 | Scholz |
| 5,340,947 | A | 8/1994 | Credle et al. |
| 5,510,580 | A | 4/1996 | Shirai et al. |
| 5,517,758 | A | 5/1996 | Nakamura |
| 5,536,907 | A | 7/1996 | Miyawaki et al. |
| 5,675,299 | A | 10/1997 | Suski |
| 5,956,843 | A | 9/1999 | Mizumoto et al. |
| 6,020,561 | A | 2/2000 | Ishida et al. |
| 6,042,685 | A | 3/2000 | Shinada et al. |
| 6,323,439 | B1 | 11/2001 | Kambe et al. |
| 6,353,999 | B1 | 3/2002 | Cheng |
| 6,407,345 | B1 | 6/2002 | Hirose et al. |
| 6,518,663 | B1 | 2/2003 | James et al. |
| 6,759,921 | B1 | 7/2004 | Govind et al. |
| 7,332,816 | B2 * | 2/2008 | Hirose et al. .......... 257/776 |
| 7,525,190 | B2 * | 4/2009 | Hirose et al. .......... 257/700 |

FOREIGN PATENT DOCUMENTS

| | | |
|---|---|---|
| JP | 51-074274 | 6/1976 |
| JP | 53-135585 | 11/1978 |
| JP | 57-056935 | 4/1982 |
| JP | 60-164389 | 8/1985 |
| JP | 61-255039 | 11/1986 |
| JP | 64-026873 | 2/1989 |
| JP | 01-300590 | 12/1989 |
| JP | 02-203587 | 8/1990 |
| JP | 03-003768 | 1/1991 |
| JP | 03-040482 | 2/1991 |
| JP | 03-073438 U | 7/1991 |
| JP | 03-228393 | 10/1991 |
| JP | 03-233991 | 10/1991 |
| JP | 03-244181 | 10/1991 |
| JP | 05-206591 | 8/1993 |
| JP | 05-335780 | 12/1993 |
| JP | 06-037201 | 2/1994 |
| JP | 07-066552 | 3/1995 |
| JP | 07-154039 | 6/1995 |
| JP | 08-130361 | 5/1996 |
| JP | 08-213763 | 8/1996 |
| JP | 08-264956 | 10/1996 |
| JP | 09-008460 | 1/1997 |
| JP | 09-018097 | 1/1997 |
| JP | 09-289380 | 11/1997 |
| JP | 09-298364 | 11/1997 |
| JP | 09-312471 | 12/1997 |
| JP | 10-041610 | 2/1998 |
| JP | 10-233578 | 9/1998 |
| WO | 98/11605 | 3/1998 |

* cited by examiner

Fig. 7
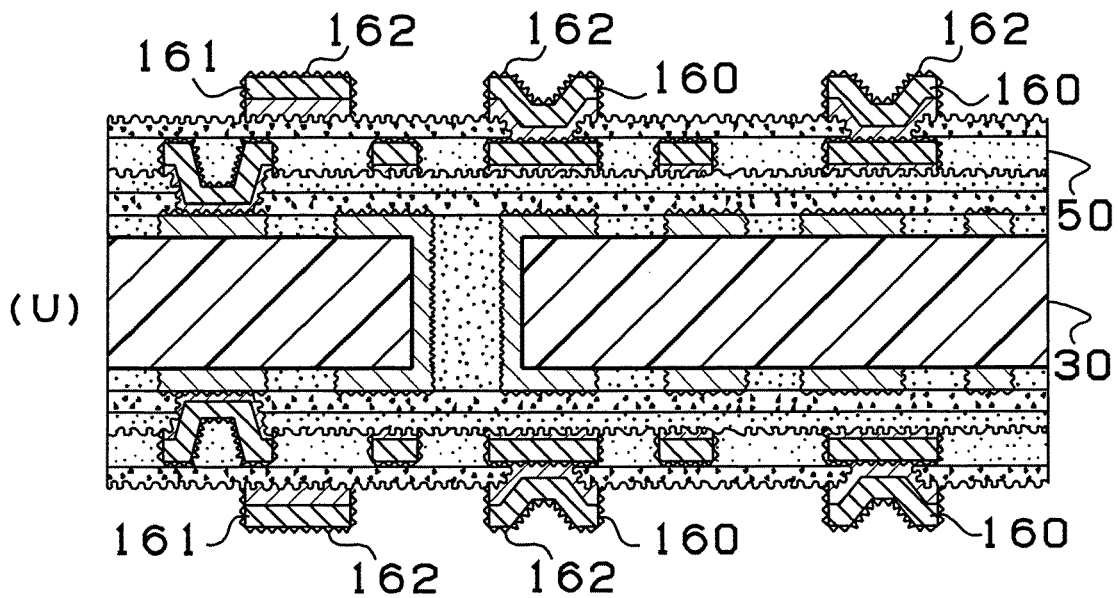
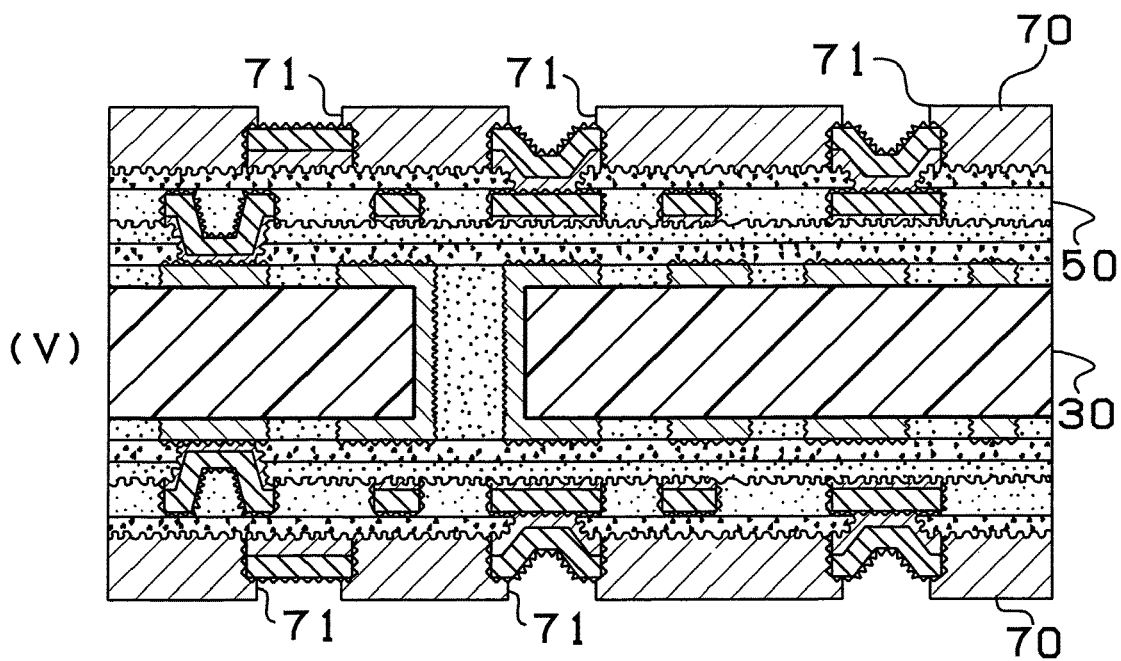

Fig. 8
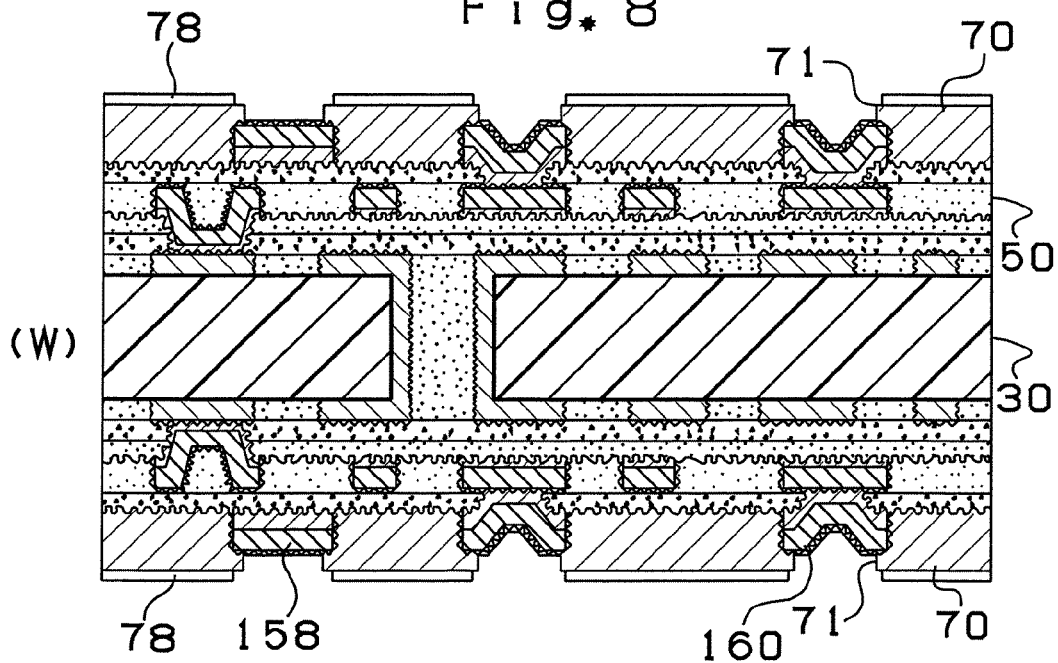
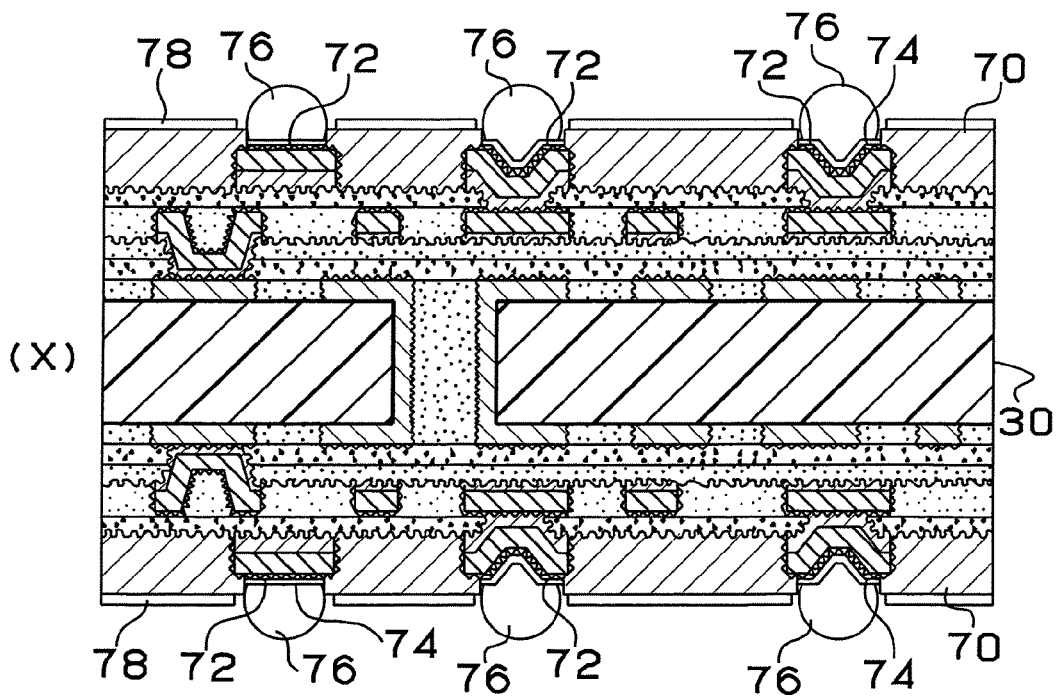

Fig. 12
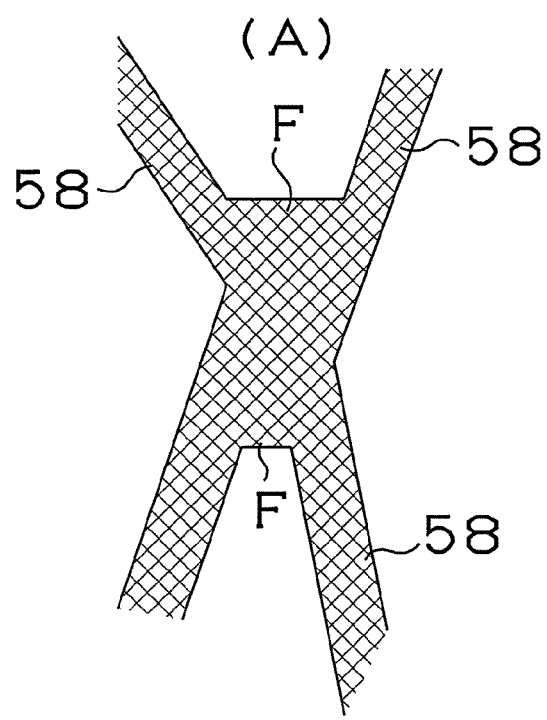
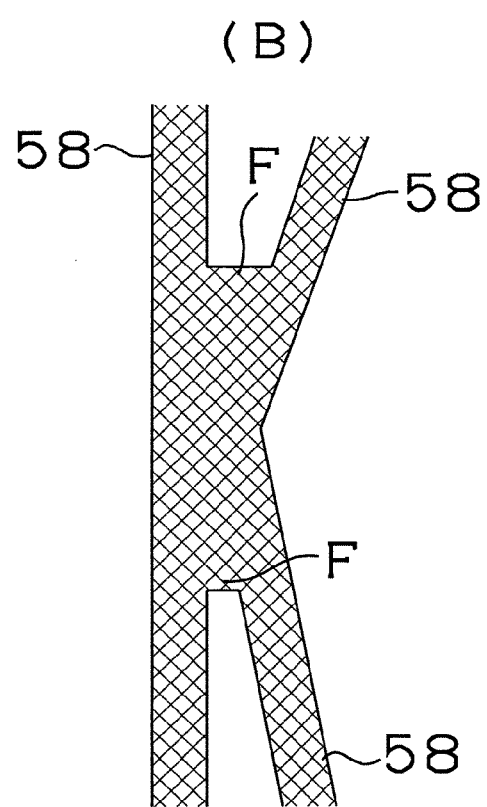

Fig. 14
(A)
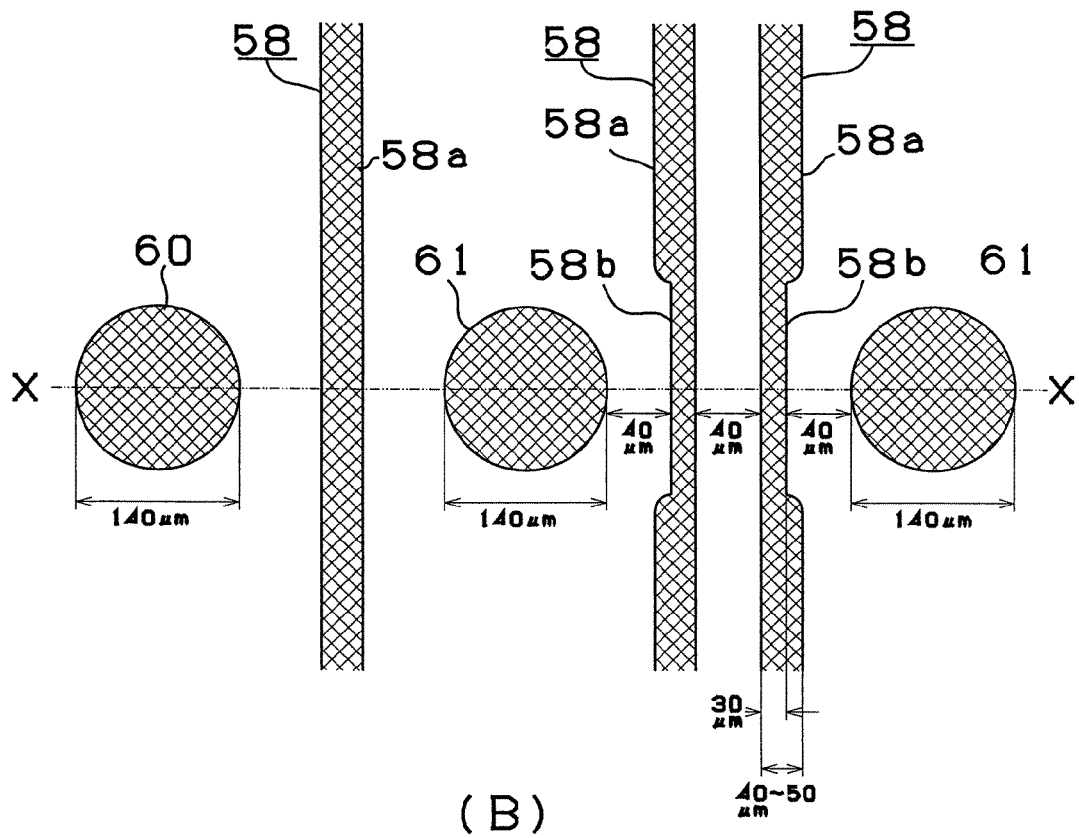
(B)
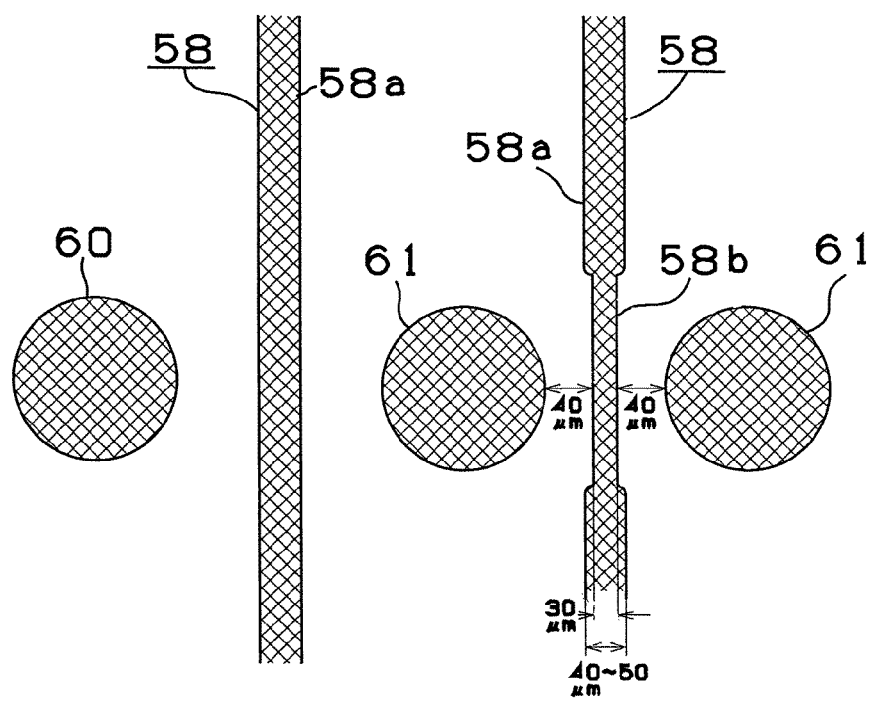

Fig. 15
(C)
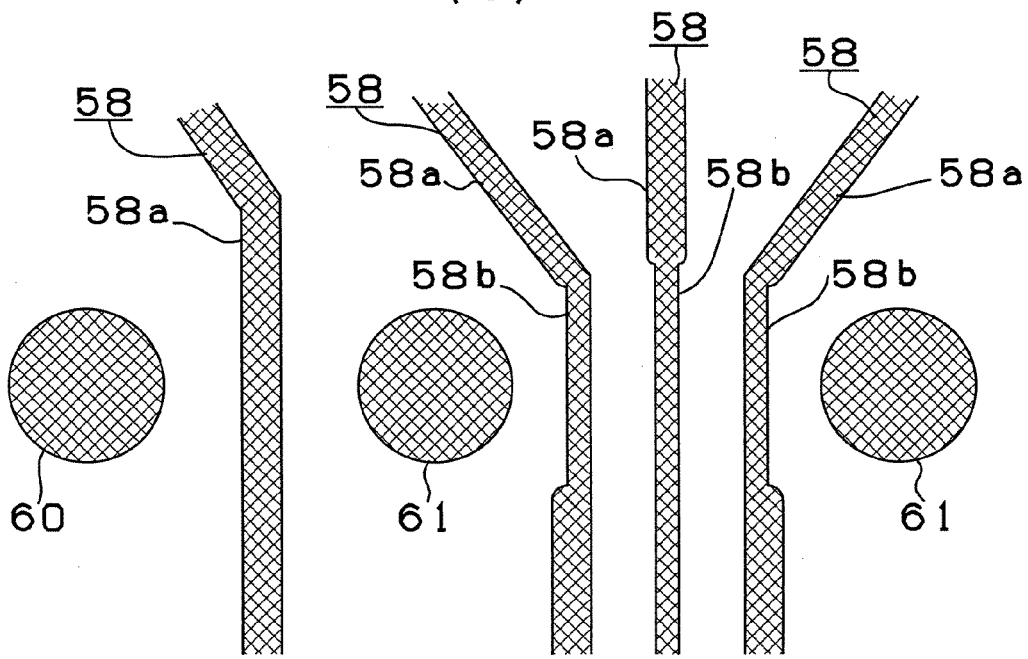
(D)
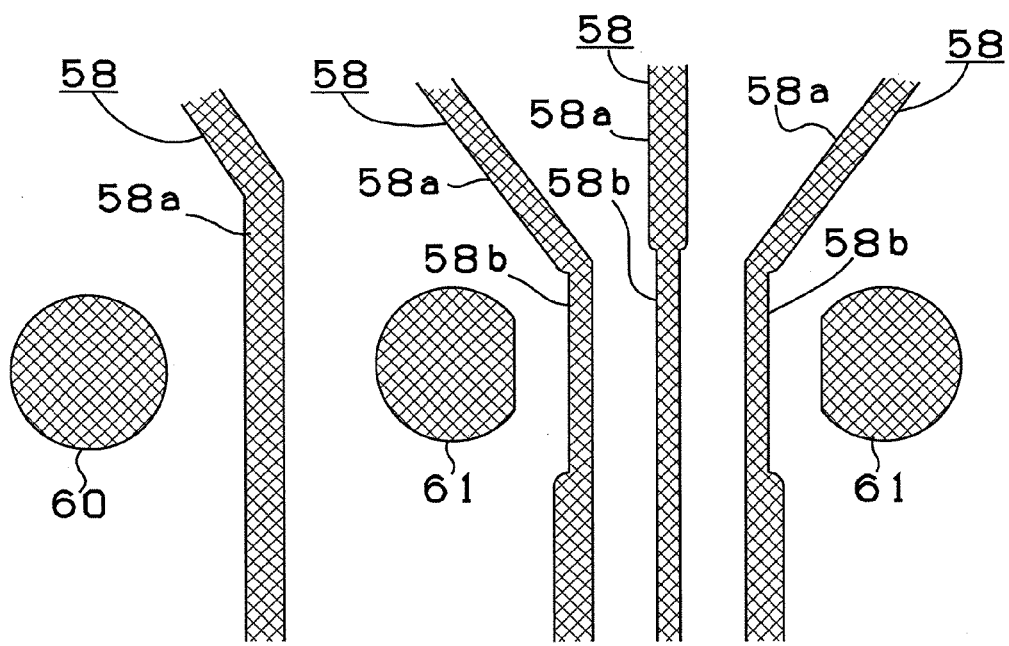

Fig. 19
(A)
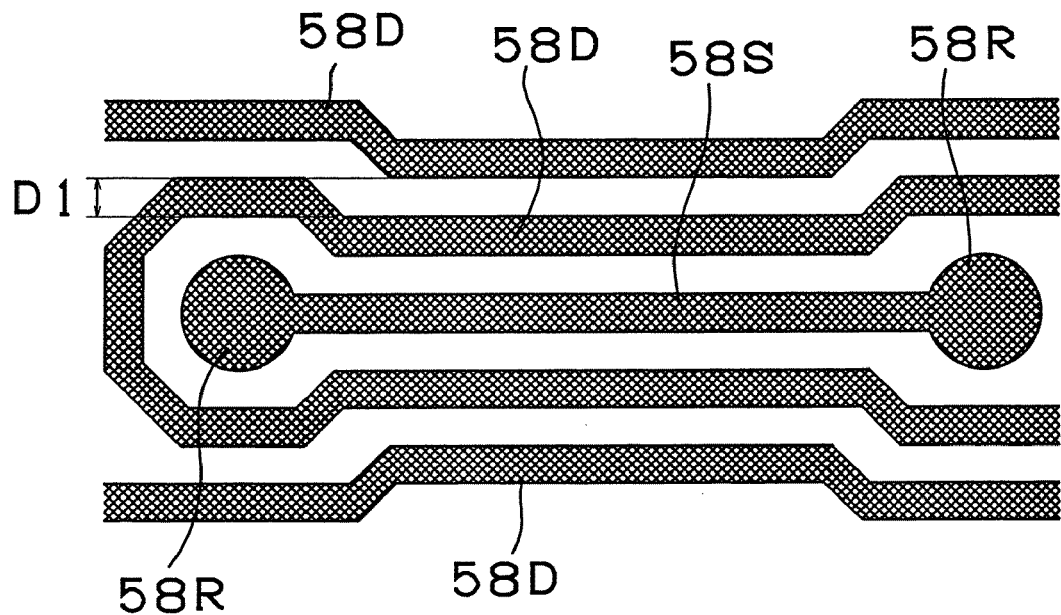
(B)
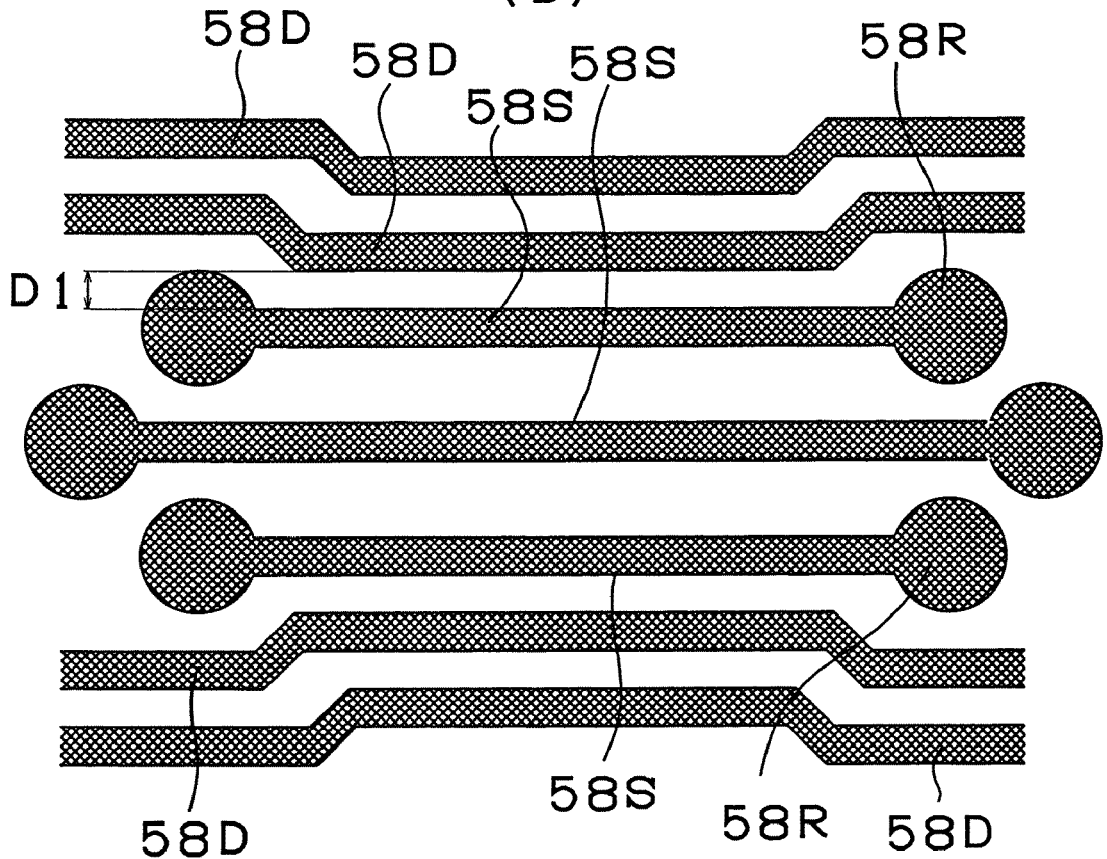

Fig. 20
(C)
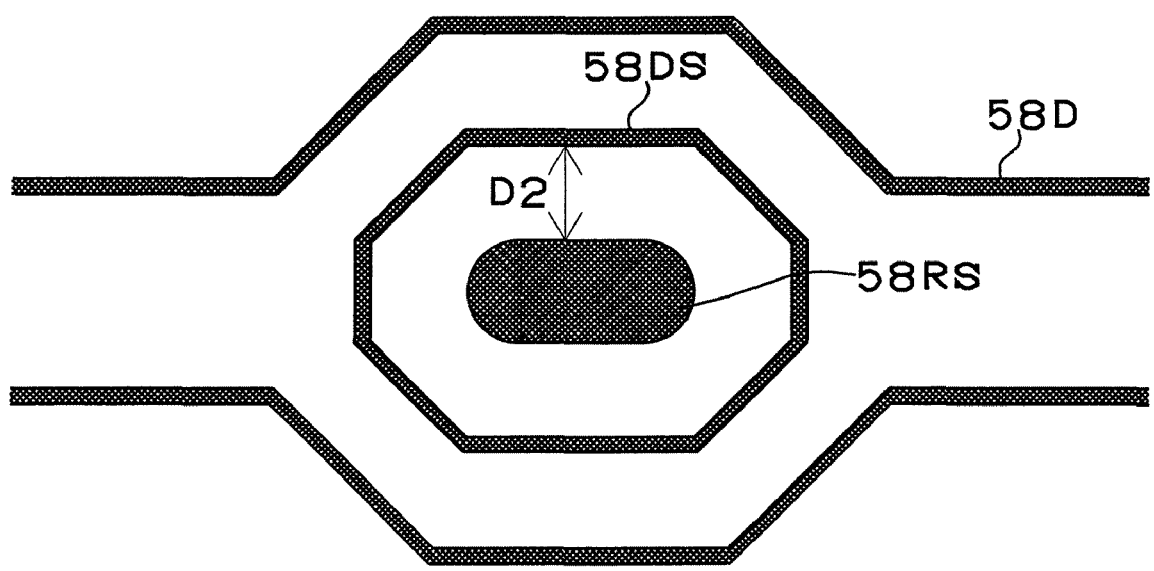
(C')
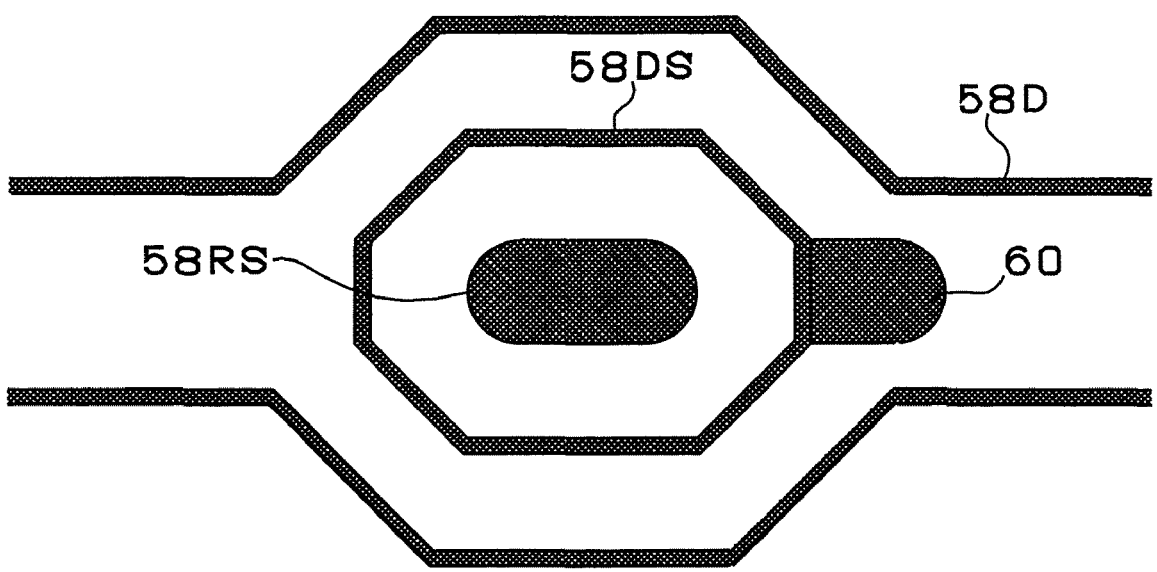

Fig. 22
(E)
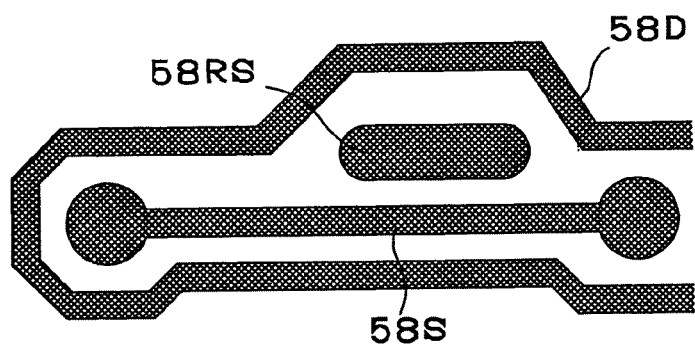
(F)
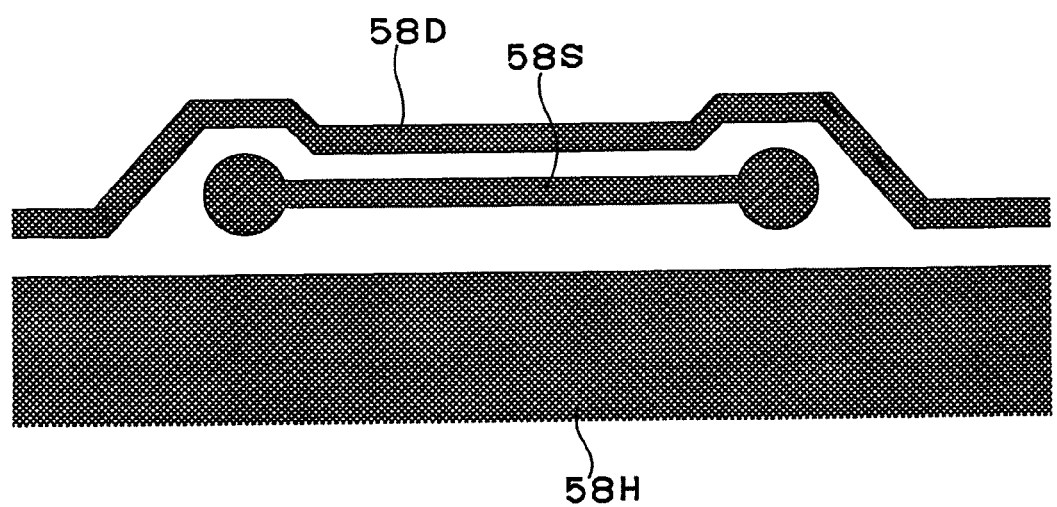

Fig. 26
(L)
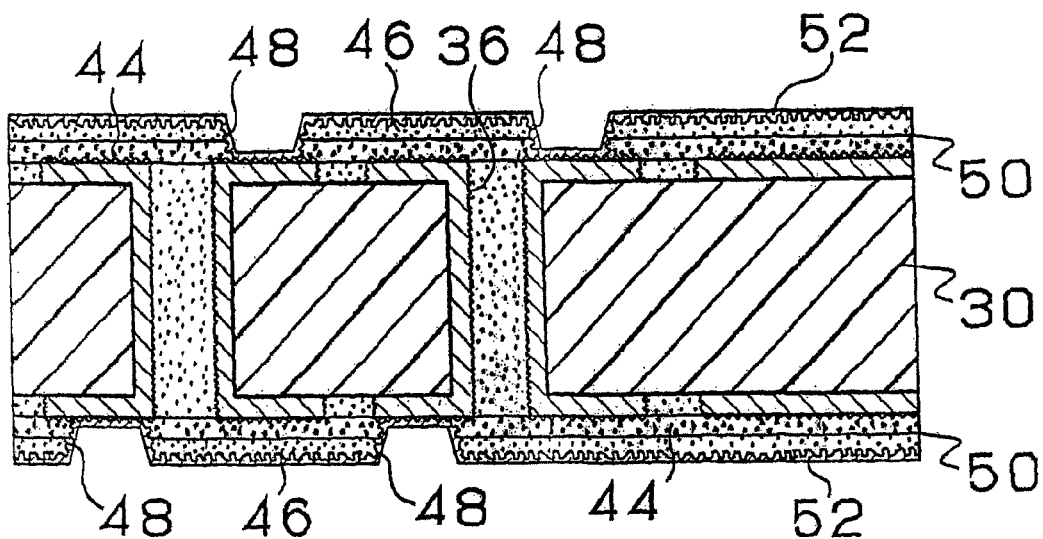
(M)
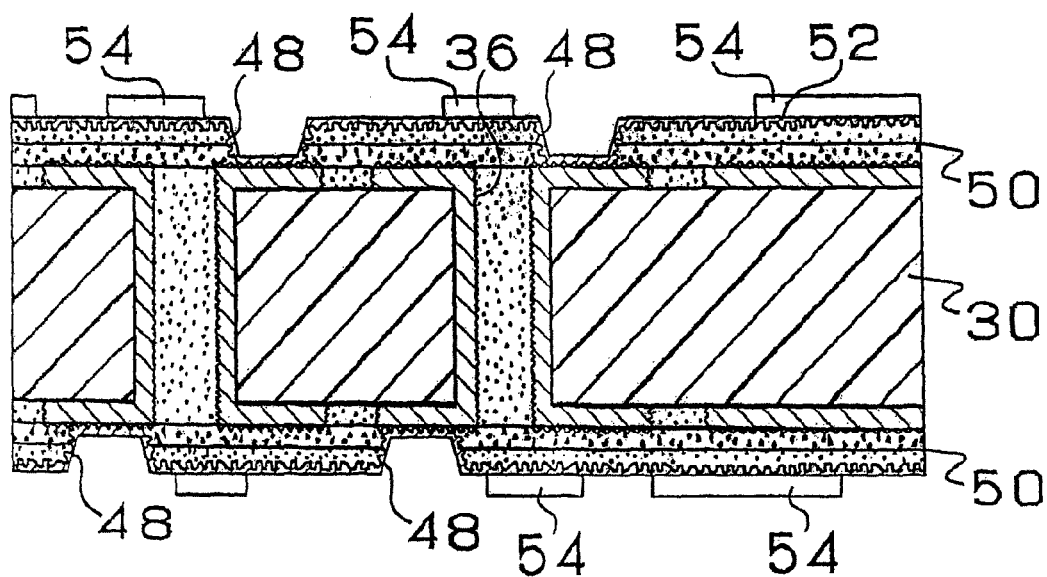

Fig. 27
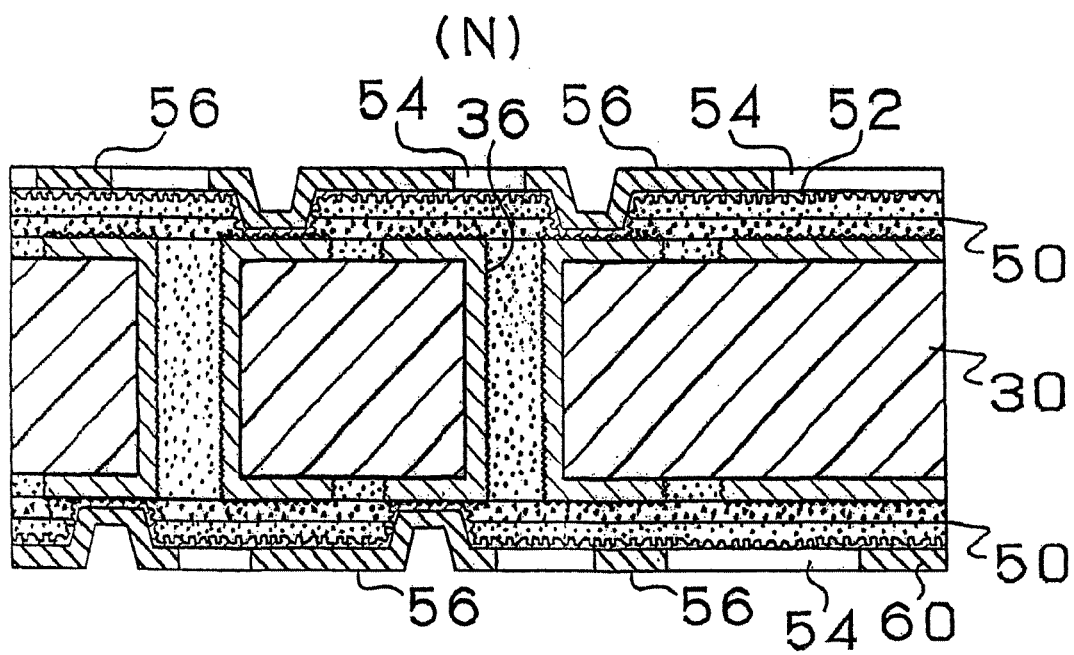
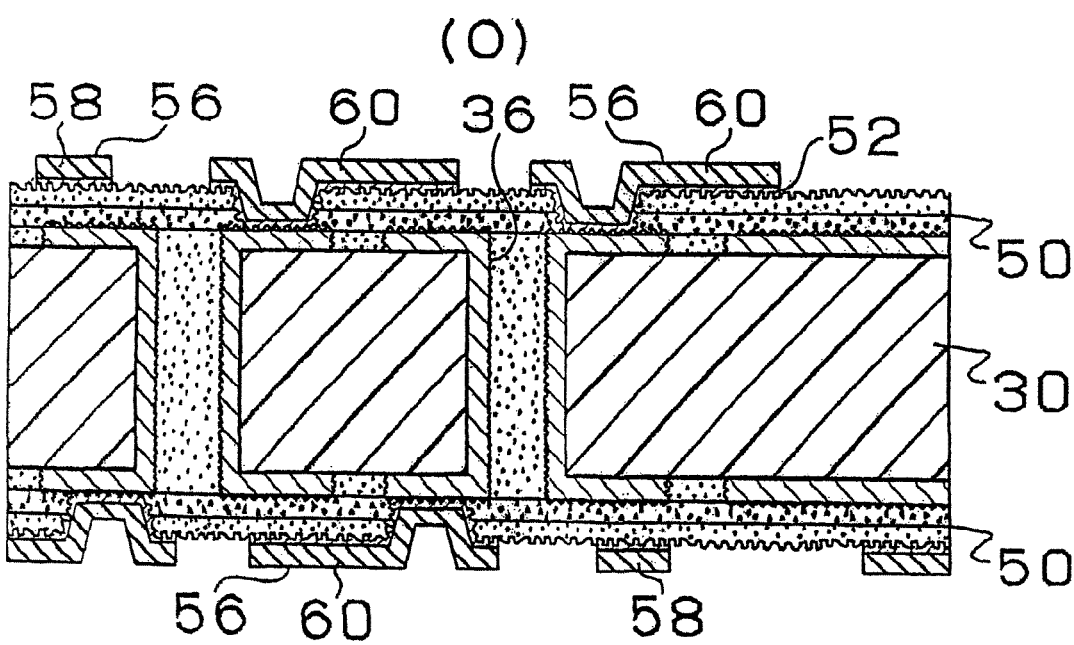

Fig. 28
(P)
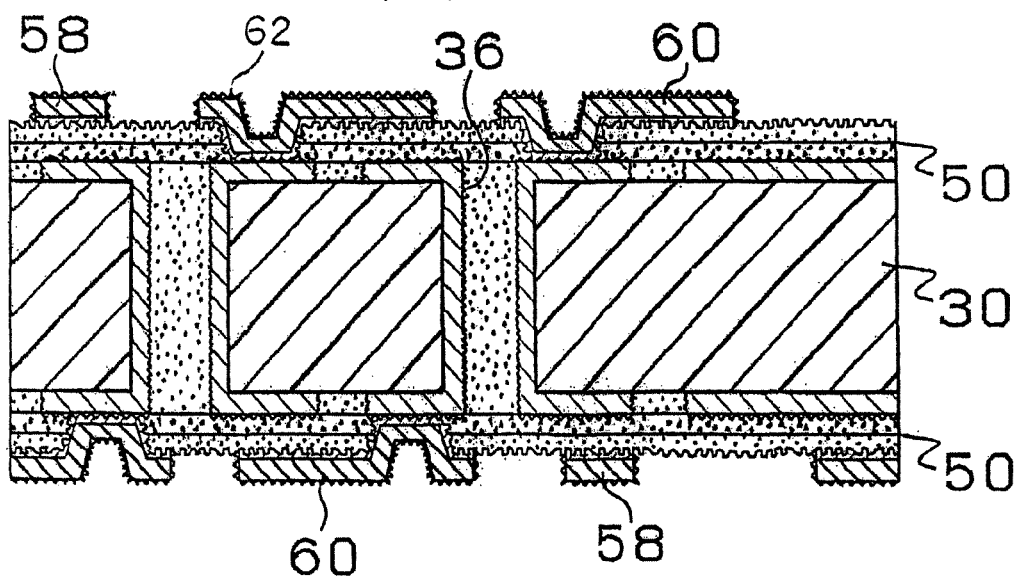
(Q)
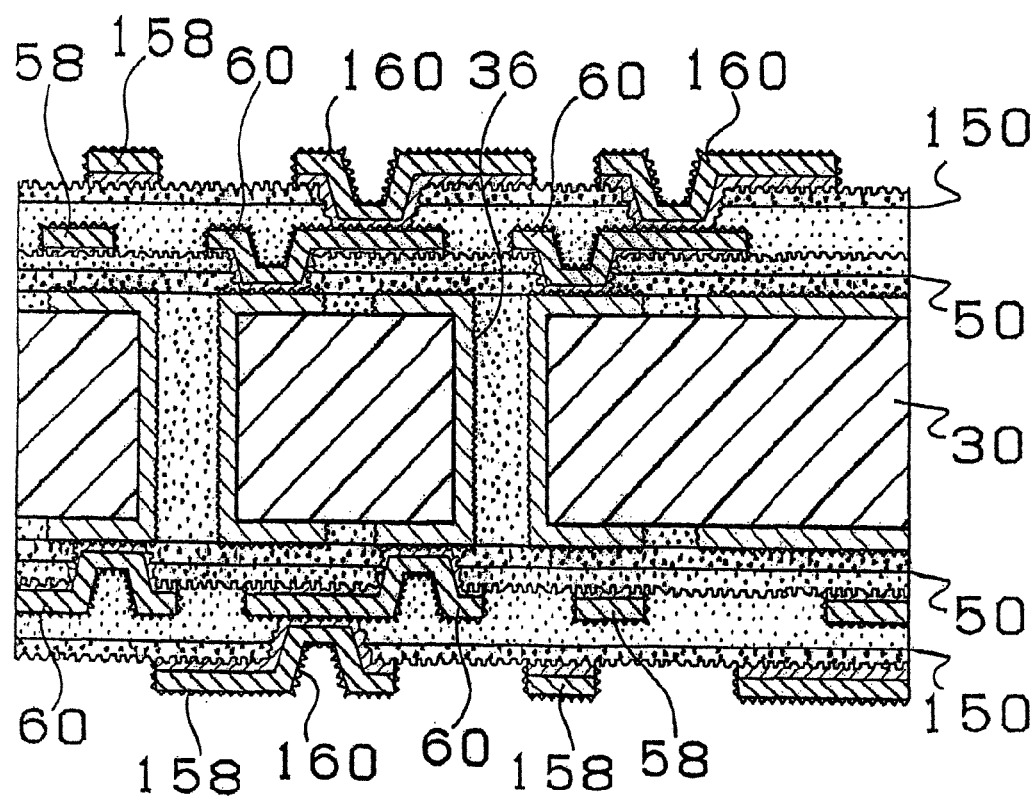

Fig. 29
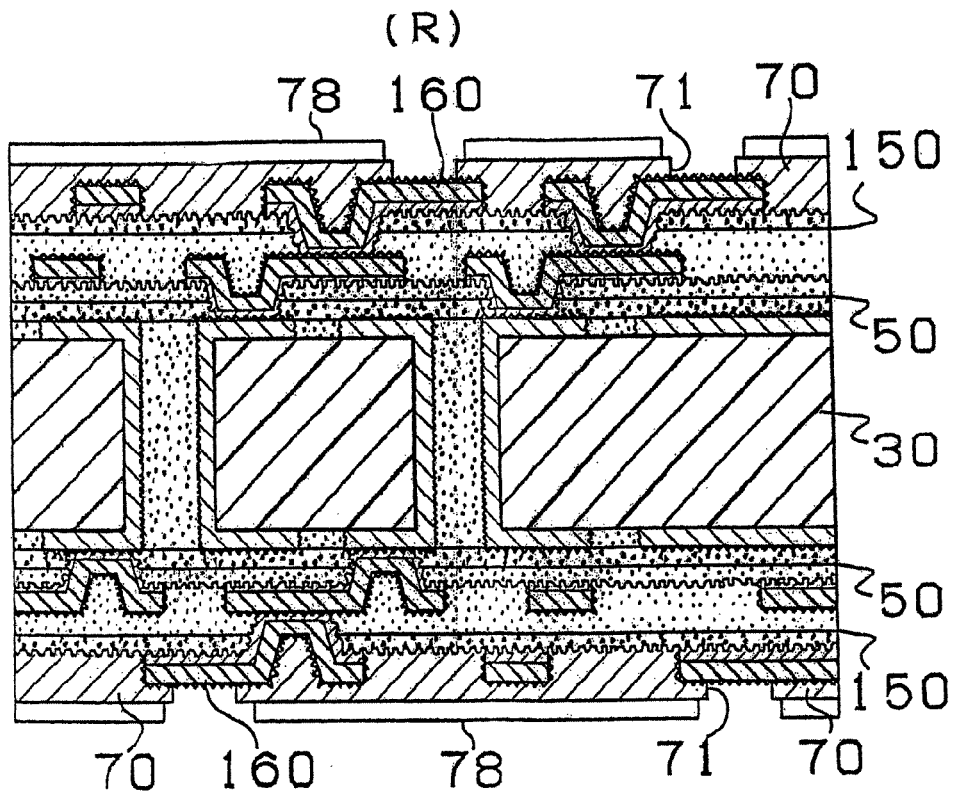
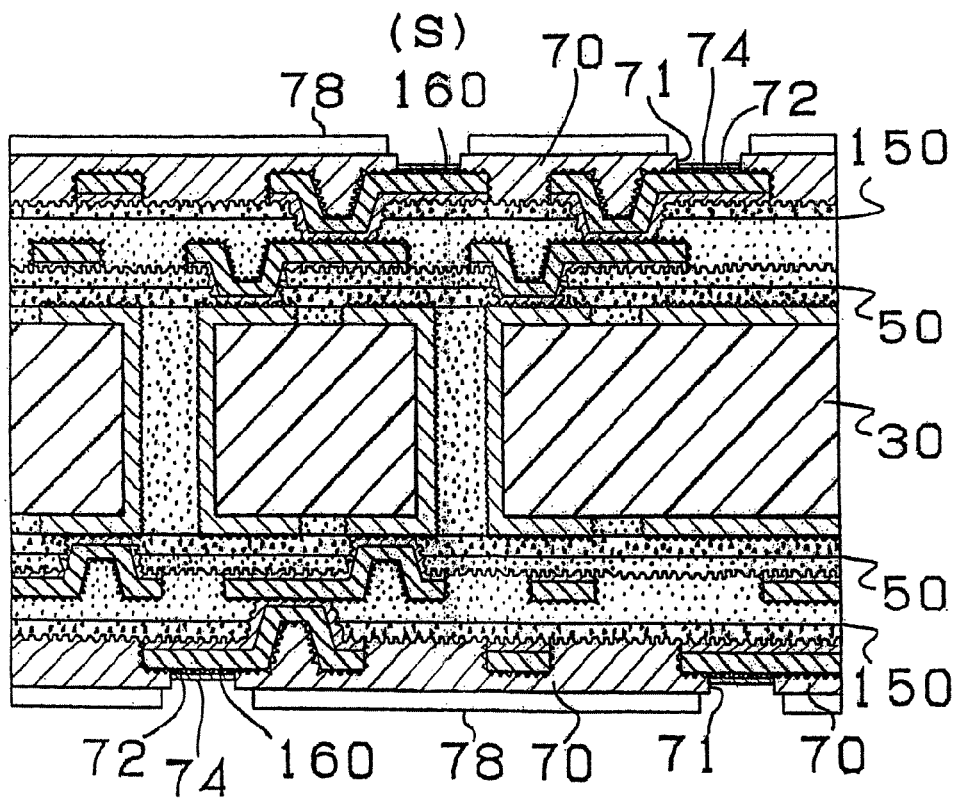

Fig. 33
(A)
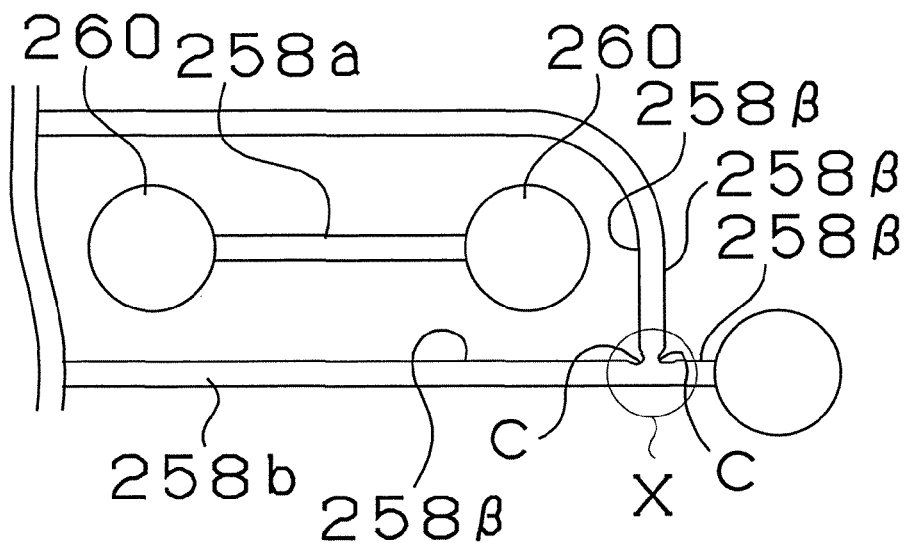
(B)
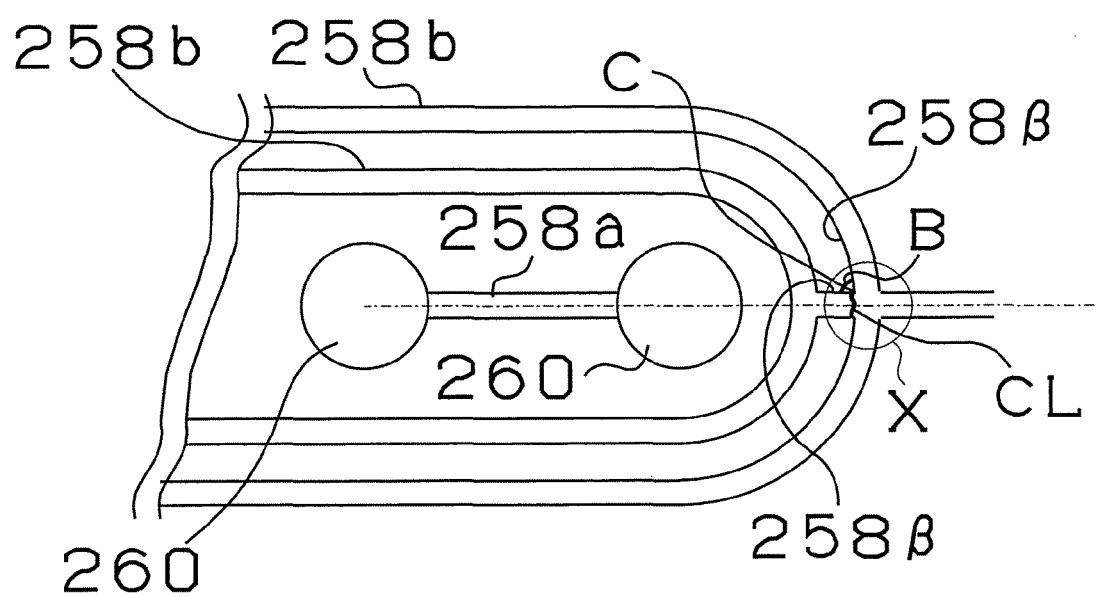

PRINTED WIRING BOARD WITH NOTCHED CONDUCTIVE TRACES

This application is a continuation of and claims the benefit of priority 35 U.S.C. §120 from U.S. Ser. No. 11/078,342, filed Mar. 14, 2005 incorporated by reference. U.S. Ser. No. 11/078,342 is a divisional of U.S. Ser. No. 10/108,628, filed Mar. 29, 2002 (Now, U.S. Pat. No. 7,332,816), and a continuation of U.S. Ser. No. 09/700,592, filed Nov. 17, 2000 (Now U.S. Pat. No. 6,407,345). The U.S. Ser. No. 09/700,592 is a National Stage of PCT/JP99/02512, filed May 13, 1999. This application also claims the benefit of priority 35 U.S.C. §119 from Japanese Patent Application Nos. 10-155329, filed May 19, 1998; 10-140694, filed May 22, 1998; 10-140695, filed May 22, 1998 and 11-094725, filed Apr. 1, 1999. This invention also relates to a printed wiring board forming a wiring pattern thereon and in particular relates to a printed wiring board able to be suitably used in a multilayer build-up wiring board and a manufacturing method of the printed wiring board.

TECHNICAL FIELD

BACKGROUND ART

A method for alternately building-up an insulating layer and a conductor layer in a core substrate is adopted at present to realize an increase in density of the multilayer printed wiring board. Here, there are two kinds of methods constructed by full additive and semi-additive methods as the built-up method. A manufacturing process of a conductor circuit onto an interlayer resin insulating layer of the multilayer printed wiring board using this semi-additive method will be explained next with reference to FIG. 32.

First, an insulating layer 250 having an opening 250a as a via hole is formed on each of both faces of a core substrate 230. An electroless plating copper film 252 is uniformly formed on a surface of the interlayer resin insulating layer 250 (FIG. 32(A)). An unillustrated resist film for forming a resist is adhered onto the electroless plating copper film 252. Thereafter, the resist film is exposed and developed and a resist 254 for plating is formed (FIG. 32(B)). Thereafter, an electrolytic plating copper film 256 is deposited in a nonforming portion of the resist 254 by dipping the core substrate 230 into an electrolytic plating liquid and flowing an electric current through the electroless plating copper film 252 (FIG. 32(C)). Wiring patterns 258a, 258b and a via hole 260 are then formed by separating the resist 254 and separating the electroless plating copper film 252 below the resist 254 by etching. Similar processes are repeated and an interlayer resin insulating layer 350, a wiring pattern 358 and a via hole 360 are further formed (FIG. 32(E)).

FIG. 33(B) shows a B-B section of FIG. 32(E). At present a design of pulling-out wiring branched from one main wiring is adopted to prevent disconnection in the multilayer printed wiring board. Therefore, a crossing portion X formed in a T-character shape is formed as shown in FIGS. 33(A) and 33(B).

However, there is a case in which the wiring pattern is disconnected in the above crossing portion X. Namely, the wiring pattern 258 is formed in the nonforming portion of the resist 254 as mentioned above with reference to FIG. 32(C). However, as shown by the crossing portion X in FIG. 33(A), no plating liquid can be sufficiently moved around a corner portion C in which wall faces 258β, 258β of the wiring pattern 258 in the crossing portion cross at an angle (here a right angle) equal to or smaller than 90°. Accordingly, the wiring pattern is made thin so that disconnection is caused in a particular case.

Further, as shown in FIG. 33(B), the wiring pattern 258b formed by a metal such as copper, etc. is suddenly curved in the crossing portion X. Therefore, a case in which stress is concentrated to the corner portion C of the crossing portion in repetition of thermal contraction and a crack CL is thereby caused in the wiring pattern and the wiring pattern is thus disconnected.

Furthermore, when the wiring pattern 258b is coated with the interlayer resin insulating layer 350 as mentioned above with reference to FIG. 32(E), there is a case whereby an air bubble B is left between the wiring pattern 258b and the interlayer resin insulating layer 350 in the corner portion C of the crossing portion as shown in FIG. 33(B). At this point, when the air bubble B is left in a lower layer of the interlayer resin insulating layer 350, the air bubble B is expanded in the thermal contraction of the printed wiring board and causes a breakdown of the printed wiring board.

In a further background art of the present invention, a multilayer build-up wiring board is formed by alternately laminating an interlayer resin insulating layer and a wiring layer on a core substrate. The multilayer build-up wiring board is mainly manufactured by an additive method at present. The above wiring layer is formed in an opening portion of a resist formed on the interlayer resin insulating layer by electrolysis or by electroless plating. Upper and lower wiring layers are electrically connected to each other by a via hole extending through the interlayer resin insulating layer. Each of these wiring layers is constructed by a via hole land used as a receiving pan of the via hole, a wiring pattern, a solid portion having a high potential applied by a power source, etc. and having a function similar to the function of a capacitor electrode, etc. Here, minimum values of a size of the via hole land, a width of the wiring pattern and an insulating distance between the via hole land and the wiring pattern are determined by resolution of the resist, an attaching degree of plating, etc. The via hole land and the wiring pattern are manufactured by setting the size, the width and the insulating distance to be greater than these minimum values respectively.

The multilayer build-up wiring board for a package functions as a connector for electrically connecting an electronic part such as an IC chip, etc. mounted on an upper face of the multilayer build-up wiring board to a printed wiring board such as a mother board, etc. located on a lower face of the multilayer build-up wiring board. Here, it is required that a line width of the wiring pattern, an insulating distance and a land diameter are reduced to cope with an increase in density of a connecting portion of the electronic part and the printed wiring board. However, when these values are set smaller than the above minimum values respectively, no desirable wiring can be formed by dispersion of a slight process condition in order that the probability of generation of disconnection of the wiring, a short-circuit of wirings, etc. is increased and yield is reduced.

In contrast to this, it is also possible to cope with the above increase in density by increasing the number of build-up layers of the multilayer build-up wiring board without reducing the line width of the wiring pattern and the insulating distance. However, if the number of build-up layers is increased, a manufacturing process becomes exponentially complicated and reliability and yield are reduced.

Here, in the further background art of the present invention, thick and thin portions of the wiring pattern are formed in the multilayer build-up wiring board of the prior art so that resistance is not uniform and has a inferior influence on propagation of an electric signal. Further, no thickness of an interlayer resin insulating layer (30 µm) formed on an upper layer of the wiring pattern (having 15 µm average in thickness) is uniformed so that no electric characteristics of the wiring board can be constantly set. Therefore, it is difficult to improve performance of the multilayer build-up wiring board.

When the inventors of this application investigated this cause, it was found that the thickness of the interlayer resin insulating layer was dispersed by an arranging density of the wiring pattern. For example, there is a case in which the thickness of the interlayer resin insulating layer is thin in a high wiring density portion and is thick in a low wiring density portion (having no signal line therearound). In contrast to this, there is also a case in which the thickness of the interlayer resin insulating layer is thick in a high wiring density portion and is thin in a low wiring density portion.

It is considered from these facts initially that the thickness of the interlayer resin insulating layer is dispersed by plating thickness. In particular, it is considered that the thickness of a signal line is increased in the low wiring density portion since an electric field is concentrated to this low wiring density portion in electrolytic plating. In contrast to this, it is considered that the thickness of the signal line is reduced in the high wiring density portion since the electric field is dispersed.

Furthermore, for a second reason it is considered that the thickness of the wiring pattern is dispersed by a moving-round of an etching liquid. The multilayer build-up wiring board at present is mainly formed by the semi-additive method to obtain higher performance. In the semi-additive method, after an electroless plating film is uniformly formed in the interlayer resin insulating layer, a resist pattern is formed and a conductor layer is formed by forming an electrolytic plating film in a nonforming portion of the resist by flowing an electric current through the electroless plating film. Here, after the electrolytic plating film is formed and the resist is separated, the electroless plating film below the resist is removed therefrom by light etching. However, in this light etching, no etching liquid can be sufficiently moved around the high wiring density portion so that the thickness of the wiring pattern can be increased. In contrast to this, the etching liquid is moved around the low wiring density portion excessively so that the thickness of the wiring pattern is reduced and a line width is also narrowed in a particular case.

In a further background art of the present invention, a conductor layer within a multilayer core substrate and a build-up wiring layer in a package substrate in the prior art are connected to each other by arranging an inner layer pad wired to a surface of the multilayer core substrate from a through hole and connecting a via hole to this inner layer pad. Namely, the inner layer pad for connecting the via hole to an upper layer is added to a land of the through hole, or the inner layer pad for connecting the via hole is connected to the land of the through hole through wiring.

However, in a land shape of the prior art, a through hole distance is widened to hold mutual insulation of the inner layer pad and the number of through holes formed in the multilayer core substrate is limited by this land shape.

In contrast to this, the number of bumps formed on a rear face of the package substrate is set to be greater than the number of bumps formed on a front side of the package substrate. This is because wirings from plural bumps on the rear face are connected to the bumps on the front side while these wirings on the rear face are integrated with each other.

For example, power lines requiring low resistance to a signal line are set to 20 lines in the bumps on the rear face (on a mother board side), but are integrated as one line on the front face (an IC chip side).

Here, it is desirable to set the number of upper build-up wiring layers and the number of lower build-up wiring layers to be equal to each other, i.e., minimize the layer numbers that wirings can be integrated with each other at the same pace in build-up wiring layers formed on the front side of the core substrate and build-up wiring layers formed on the rear side of the core substrate. However, as mentioned above, the number of through holes able to be formed in the multilayer core substrate is limited. Therefore, in the package substrate of the prior art, wirings are integrated with each other to a certain extent in the build-up wiring layers on the rear side and are then connected to the build-up wiring layers on the front side through the through holes of the multilayer core substrate. Namely, since the wiring density is reduced in the build-up wiring layers on the front side, the same layer number as the number of build-up wiring layers on the rear side is not originally required. However, when the number of build-up wiring layers on the front and rear sides are set to be different to each other, a warp is caused by an asymmetric property. Therefore, the number of build-up wiring layers on the front and rear sides are set to be equal to each other. Namely, since the number of through holes formed in the multilayer core substrate is limited, the number of build-up wiring layers on the rear side must be increased and build-up wiring layers on the front side must be further formed to such a degree that the number of build-up wiring layers on the front side is equal to the increased number of build-up wiring layers on the rear side.

Namely, in the printed wiring board (package substrate) of the prior art, since the number of build-up layers is increased, problems exist whereby the connection reliability of upper and lower layers is reduced and the cost of the package substrate is increased and, thickness and weight of the package substrate is excessively increased.

To solve the above-mentioned problems, an object of the present invention is to provide a printed wiring board and a manufacturing method of the printed wiring board in which there is no disconnection caused in a wiring pattern.

An object of the present invention is to provide a printed wiring board of high density which is able to be manufactured with a high yield.

An object of the present invention is to provide a printed wiring board having superior uniform properties of thickness of a wiring pattern and an interlayer resin insulating layer.

An object of the present invention is to provide a printed wiring board which is able to reduce the number of build-up layers by increasing the density of through holes formed in a core substrate and to provide a manufacturing method of the printed wiring board.

DISCLOSURE OF THE INVENTION

To achieve the above objects, claim 1 resides in a printed wiring board having a wiring pattern on a substrate having an insulating substrate or an interlayer resin insulating layer, and technically characterized in that a filet is added to a crossing portion of said wiring pattern.

In the printed wiring board of claim 1, since the filet is added to the crossing portion of the wiring pattern of the printed wiring board, no wiring pattern is made thin and is disconnected in the crossing portion. Further, no crack is caused by thermal contraction.

Claim 2 resides in a printed wiring board having a wiring pattern on a substrate having an insulating substrate or an interlayer resin insulating layer, and technically characterized in that a filet is added to a corner portion equal to or smaller than 90° in a crossing portion of said wiring pattern.

In the printed wiring board of claim 2, since the filet is added to the corner portion equal to or smaller than 90° in the crossing portion of the wiring pattern of the printed wiring board, no wiring pattern is made thin and is disconnected in the crossing portion. Further, no crack is caused by thermal contraction.

In the printed wiring board of claim 3, the filet is added to the crossing portion of the wiring pattern of the printed wiring board and no stress is concentrated to the crossing portion so that no wiring pattern is disconnected. Further, no air bubbles are left between the crossing portion of the wiring pattern and the interlayer resin insulating layer so that reliability of the printed wiring board is improved.

Claim 4 resides in a manufacturing method of a printed wiring board comprising:

a process for forming a resist having an opening portion for forming a wiring pattern on a substrate having an insulating substrate or an interlayer resin insulating layer; and a process for forming the wiring pattern by depositing a metallic layer in the opening portion of the resist;

the manufacturing method being technically characterized in that a corner portion equal to or smaller than 90° in a crossing portion of the wiring pattern is chamfered in the process for forming said resist.

In the manufacturing method of the printed wiring board of claim 4, the corner portion equal to or smaller than 90° in the crossing portion of the wiring pattern is chamfered in the process for forming the resist having the opening portion for forming the wiring pattern, and the resist is formed. The wiring pattern is formed such that this chamfering portion is set to a filet. Here, since the filet is added to the corner portion, no wiring pattern is made thin and is disconnected in the crossing portion.

Claim 5 resides in a manufacturing method of a printed wiring board technically characterized in that the manufacturing method comprises:

a process for forming a resist having an opening portion for forming a wiring pattern by chamfering a corner portion equal to or smaller than 90° in a crossing portion of the wiring pattern in a process for forming the resist on a substrate having an insulating substrate or an interlayer resin insulating layer;

a process for forming the wiring pattern by depositing a metallic layer in the opening portion of the resist;

a process for forming the interlayer resin insulating layer in an upper layer of said wiring pattern; and a process for forming the wiring pattern in an upper layer of said interlayer resin insulating layer.

In the printed wiring board of claim 5, the resist is formed by chamfering a portion constituting the corner portion equal to or smaller than 90° in the crossing portion of the wiring pattern in the process for forming the resist having the opening portion for forming the wiring pattern. The wiring pattern is formed such that the chamfering portion is set to a filet. Thereafter, the interlayer resin insulating layer and the wiring pattern are further formed. Here, since the filet is added to the corner portion, no wiring pattern is made thin and is disconnected in the crossing portion. Further, since the filet is added to the corner portion, no stress is concentrated to the crossing portion in order that no wiring pattern be disconnected. Further, no air bubbles are left between the crossing portion of the wiring pattern and the interlayer resin insulating layer. Accordingly, reliability of the printed wiring board is improved.

To achieve the above objects, claim 6 resides in a printed wiring board having a conductor portion and a wiring pattern and technically characterized in that a narrow width portion is formed in the wiring pattern in accordance with a distance from an adjacent conductor portion.

In the printed wiring board of claim 6, the narrow width portion is formed in the wiring pattern in accordance with a distance from an adjacent conductor portion so that the insulating distance between the wiring pattern and the conductor portion is held and density of the wiring pattern can be increased. Here, no width of the wiring pattern is narrowed in a portion capable of holding the insulating distance from the conductor portion so that possibility of disconnection is reduced and yield is increased.

Claim 7 resides in a printed wiring board having conductor portions and a wiring pattern and technically characterized in that the width of a portion of said wiring pattern located between said conductor portions is narrowed.

In the printed wiring board of claim 7, the insulating distances between the wiring pattern and the conductor portions are held and wiring density can be increased by narrowing the width of the portion of the wiring pattern located between the conductor portions. Here, no width of the wiring pattern is narrowed in a portion capable of holding the insulating distances between the wiring pattern and the conductor portions, i.e., a portion unlocated between the conductor portions. Therefore, possibility of disconnection is reduced and yield is increased.

In the printed wiring board of claim 8, the width of the wiring pattern is narrowed on its central side when one wiring pattern is located between the conductor portions. Therefore, the insulating distances from both the conductor portions can be held.

In claim 7, claim 9 is technically characterized in that, when the said wiring patterns are located between the said conductor portions, widths of the wiring patterns are respectively narrowed on sides opposed to the conductor portions.

In the printed wiring board of claim 9, the widths of the wiring patterns are respectively narrowed on sides opposed to the conductor portions when the two wiring patterns are located between the conductor portions. Therefore, the insulating distances from both the conductor portions can be held.

In claim 7, claim 10 is technically characterized in that, when at least three said wiring patterns are located between said conductor portions, a width of at least one portion of a central wiring pattern except for wiring patterns on both sides of the central wiring pattern is narrowed on a central side, and widths of the wiring patterns on both the sides are respectively narrowed on sides opposed to the conductor portions.

In the printed wiring board of claim 10, when three wiring patterns or more are located between the conductor portions, the width of at least one portion of the central wiring pattern except for the wiring patterns on both the sides is narrowed on the central side, and the widths of the wiring patterns on both the sides are respectively narrowed on sides opposed to the conductor portions. Therefore, the insulating distances from both the conductor portions and the insulating distances between the wiring patterns can be held.

In the printed wiring board of claim 11, wiring pattern sides of the conductor portions are notched. Therefore, the insulating distances between the wiring patterns and both the conductor portions can be held.

In the printed wiring board of claim 12, the pitch of wiring patterns of a multilayer build-up wiring board can be narrowed. Therefore, wiring density can be increased without increasing the number of build-up layers.

In the printed wiring board of claim 13, the pitch between via hole lands or pads for mounting can be narrowed. Therefore, wiring density can be increased without increasing the number of build-up layers.

To achieve the above objects, claim 14 resides in a printed wiring board having an interlayer resin insulating layer and a conductor layer alternately laminated with each other, and technically characterized in that a dummy conductor is arranged around a wiring pattern constituting said conductor layer.

Claim 15 resides in a printed wiring board having an interlayer resin insulating layer and a conductor layer alternately laminated with each other, and technically characterized in that a dummy conductor is arranged around plural wiring patterns constituting said conductor layer.

In the invention of each of claims 14 and 15, the dummy conductor is arranged around the wiring patterns. Accordingly, when the conductor layer is formed by electrolytic plating, no concentration of an electric field is caused and the wiring patterns can be formed in predetermined thicknesses. Therefore, an isolated wiring pattern and a wiring pattern in a close portion can be formed in uniform thicknesses. Further, the thickness of the interlayer resin insulating layer in an upper layer of the wiring patterns can be uniformed. Accordingly, electric characteristics of the printed wiring board can be improved. It is carefully additionally noted that the wiring patterns and the dummy conductor in the present invention may not be formed on a so-called core substrate.

In the invention of claim 16, a width of the dummy conductor is set to one to three times a minimum width of the wiring pattern. Therefore, no concentration of an electric field is caused and the wiring pattern and the dummy conductor can be formed in predetermined thicknesses.

In the invention of claim 17, the distance between the dummy conductor and the wiring pattern is set to one to three times a minimum width of the wiring pattern. Therefore, no concentration of an electric field is caused, and the wiring pattern and the dummy conductor can be formed in predetermined thicknesses.

Claim 18 resides in a printed wiring board having an interlayer resin insulating layer and a conductor layer alternately laminated with each other, and technically characterized in that a dummy conductor is arranged around an isolated land constituting said conductor layer.

In the invention of claim 18, the dummy conductor is arranged around the isolated land. Therefore, when the conductor layer is formed by electrolytic plating, there is no concentration of an electric field caused and the isolated land can be formed in a predetermined thickness. Therefore, the isolated land and a land in a close portion can be formed in uniform thicknesses so that electric characteristics of the printed wiring board can be improved.

In the invention of claim 19, a peripheral portion of the isolated land is surrounded by the dummy conductor. Therefore, it is possible that from the exterior the isolated land which is influenced by noises, etc. can be reduced.

In the invention of claim 20, the width of the dummy conductor is set to 1/6 to 3 times a diameter of the land. Therefore, no concentration of an electric field is caused, and the land and the dummy conductor can be formed in predetermined thicknesses.

In the invention of claim 21, a minimum distance between the dummy conductor and the isolated land is set to 1/6 to 3 times the land diameter. Therefore, no concentration of an electric field is caused, and the land and the dummy conductor can be formed in predetermined thicknesses.

Claim 22 resides in a printed wiring board having an interlayer resin insulating layer and a conductor layer alternately laminated with each other, and technically characterized in that a dummy conductor is arranged in said conductor layer and a filet is formed in a crossing portion of this dummy conductor and another dummy conductor.

In the invention of claim 22, the dummy conductors can be properly connected to each other since the filet is formed in the crossing portion of the dummy conductors.

Claim 23 resides in a printed wiring board having an interlayer resin insulating layer and a conductor layer alternately laminated with each other, and technically characterized in that a dummy conductor is arranged in said conductor layer and a filet is formed in a right angle or acute angle portion in a crossing portion of this dummy conductor and another dummy conductor.

In the invention of claim 23, the filet is formed in the right angle or acute angle portion in the crossing portion of the dummy conductors. Therefore, no right angle and acute angle portions are formed so that no crack is caused by stress concentration caused by a corner portion.

In the printed wiring board of claim 24, interlayer resin insulating layers and conductor layers are alternately laminated with each other, and build-up wiring layers are formed on both faces of a core substrate by connecting the conductor layers to each other by a via hole, and the printed wiring board is technically characterized in that a circular land is formed in a through hole formed in said core substrate and the via hole is connected to this land.

In the printed wiring board of claim 24, the via hole is formed on the land of the through hole and no pad for connection of the via hole is added to the land so that the number of through holes arranged in the core substrate can be increased.

In the printed wiring board of claim 25, a radius of the through hole is set to be equal to or smaller than 175 μm and is equal to or greater than 125 μm. When the radius of the through hole exceeds 175 μm, the number of through holes arranged in the core substrate is reduced. In contrast to this, when the radius of the through hole is smaller than 125 μm, it is difficult to form the through hole by a drill. On the other hand, a radius of the land is greater by 75 μm to 175 μm than the radius of the through hole. This is because 75 μm in total is obtained as a minimum value able to be technically set by adding a diameter 25 μm of the via hole, an error ±12.5 (25 in total) μm of an opening for the via hole with respect to the land, and an error 25 μm of the land with respect to a passing hole. On the other hand, this is also because 175 μm is obtained in total as a minimum value capable of being economically set in mass production by adding a diameter 35 μm of the via hole, an error ±20 (40 in total) μm of the opening for the via hole with respect to the land, and an error 100 μm of the land with respect to the passing hole. Namely, the via hole can be arranged technically and economically on the land by forming the land such that the radius of the land is greater by 75 μm to 175 μm than the radius of the through hole.

A manufacturing method of a printed wiring board in claim 26 is technically characterized in that the manufacturing method comprises:

(a) a process for boring a passing hole for a through hole in a substrate for multiple chamfering by a drill;

(b) a process for forming a metallic film within said passing hole;

(c) a process for forming a land in an opening portion of said passing hole;

(d) a process for coating said substrate with resin constituting an interlayer resin insulating layer;

(e) a process for performing position alignment with said land and forming an opening having a diameter equal to or smaller than 35 μm in said resin on said land; and (f) a process for forming a metallic film in said opening and setting this opening to a via hole;

a radius of said land is set to be equal to or greater than a value obtained by adding a radius of said passing hole, an error range of the land with respect to said passing hole, the opening diameter, and an error range of the opening with respect to said land, and is also set to be equal to or smaller than 700 μm.

In the invention of claim 26, the radius of the land is set to be equal to or greater than a value obtained by adding a radius of the passing hole, an error range of the land with respect to the passing hole, the opening diameter, and an error range of the opening with respect to said land. Accordingly, the via hole can be formed on the land. Here, when the land diameter is set to be equal to or smaller than 700 μm, an arranging density of the through hole can be increased in comparison with a construction in which a land for arranging the via hole is added to the land of the prior art.

In the invention of claim 27, the radius of the land is set to range from 200 μm to 350 μm. This is because 200 μm is obtained in total as a minimum value able to be technically set by adding a radius 125 μm of the through hole, a diameter 25 μm of the via hole, an error ±12.5 (25 in total) μm of an opening for the via hole with respect to the land, and an error 25 μm of the land with respect to a passing hole. On the other hand, 350 μm is obtained in total (radius) as a minimum value able to be economically set in mass production by adding a radius 175 μm of the through hole, a diameter 35 μm of the via hole, an error ±20 (40 in total) μm of the opening for the via hole, and an error 100 μm of the land with respect to the passing hole. The via hole can be arranged on the land by setting the land radius to this value in a high economical range capable of being technically set.

A full additive method or a semi-additive method can be adopted in the above printed wiring board. In the full additive method, a plating resist is formed on a substrate and a metallic layer is deposited in an opening portion of this plating resist and is set to a wiring pattern. In the semi-additive method, after a metallic layer is formed on a substrate, a plating resist is formed and a metallic layer is further deposited in an opening portion of this plating resist. After the plating resist is removed, a wiring pattern is formed by removing the metallic layer below the plating resist.

In the present invention, it is desirable to use an adhesive for electroless plating as the above interlayer resin insulating layer. In this adhesive for electroless plating, it is optimal that heat resisting resin particles soluble to a hardened acid or oxidizing agent are dispersed into unhardened heat resisting resin which is difficult to be soluble to an acid or an oxidizing agent.

The heat resisting resin particles are dissolved and removed by processing these resin particles using an acid or an oxidizing agent and a coarsened face constructed by an anchor formed in the shape of an octopus trap can be formed on a layer surface.

In the above adhesive for electroless plating, the above heat resisting resin particles particularly hardened are desirably constructed by using ① heat resisting resin powder having an average particle diameter equal to or smaller than 10 μm, ② cohesive particles formed by aggregating heat resisting resin powder having an average particle diameter equal to or smaller than 2 μm, ③ a mixture of heat resisting powder resin powder having an average particle diameter from 2 to 10 μm and heat resisting resin powder having an average particle diameter equal to or smaller than 2 μm, ④ pseudo-particles in which at least one kind of heat resisting resin powder or inorganic powder having an average particle diameter equal to or smaller than 2 μm is attached to the surface of heat resisting resin powder having an average particle diameter from 2 to 10 μm, ⑤ a mixture of heat resisting powder resin powder having an average particle diameter from 0.1 to 0.8 μm and heat resisting resin powder having an average particle diameter greater than 0.8 μm and smaller than 2 μm, and ⑥ heat resisting powder resin powder having an average particle diameter from 0.1 to 1.0 μm. This is because these materials can form a more complicated anchor.

A depth of the coarsened face is preferably set to secure a close attaching property such that Rmax=0.01 to 20 μm. In particular, Rmax preferably ranges from 0.1 to 5 μm in the semi-additive method since an electroless plating film can be removed while the close attaching property is secured.

The heat resisting resin difficult to be soluble to an acid or an oxidizing agent mentioned above is desirably constructed by "a resin complex constructed by thermosetting resin and thermoplastic resin", or "a resin complex constructed by photosensitive resin and thermoplastic resin". The former has a high heat resisting property. The latter is desirable since the opening for the via hole can be formed by photolithography.

The above thermosetting resin can be constructed by using epoxy resin, phenol resin, polyimide resin, etc. When the thermosetting resin is photosensitized, a thermosetting group acrylic-reacts on methacrylic acid, acrylic acid, etc. Acrylate of the epoxy resin is particularly optimal.

The epoxy resin can be constructed by using epoxy resin of novolak type such as phenol novolak type, cresol novolak type, etc., dicyclopentadiene-modified alicyclic epoxy resin, etc.

The thermoplastic resin can be constructed by using polyether sulfone (PES), polysulfone (PSF), polyphenylene sulfone (PPS), polyphenylene sulfide (PPES), polyphenyl ether (PPE), polyether imide (PI), etc.

A mixing ratio of the thermosetting resin (photosensitive resin) and the thermoplastic resin is preferably set such that thermosetting resin (photosensitive resin)/thermoplastic resin=95/5 to 50/50. This is because a high toughness value can be secured without reducing a heating resisting property.

A mixing weight ratio of the above heat resisting resin particles is set preferably to range from 5 to 50 weight % and to desirably range from 10 to 40 weight % with respect to the solid content of a heat resisting resin matrix.

The heat resisting resin particles are preferably constructed by amino resin (melamine resin, urea resin, guanamine resin), epoxy resin, etc.

The adhesive may be constructed by two layers having different compositions.

Various kinds of resins can be used as a solder resist layer added to a surface of the multilayer build-up wiring board.

For example, it is possible to use bisphenol A-type epoxy resin, acrylate of bisphenol A-type epoxy resin, novolak type epoxy resin, resin formed by hardening acrylate of novolak type epoxy resin by an amine-system hardening agent, an imidazole hardening agent, etc.

There is a case in which such a solder resist layer is separated since the solder resist layer is constructed by resin having a stiff skeleton. Therefore, the separation of the solder resist layer can be also prevented by arranging a reinforcing layer.

The above acrylate of the novolak type epoxy resin can be constructed by using epoxy resin in which glycidyl ether of phenol novolak and cresol novolak reacts with acrylic acid, methacrylic acid, etc.

The above imidazole hardening agent is desirably formed in a liquid state at 25° C. since the imidazole hardening agent can be uniformly mixed in the liquid state.

Such a liquid state imidazole hardening agent can be constructed by using 1-benzyl-2-methylimidazole (product name: 1B2MZ), 1-cyanoethyl-2-ethyl-4-methylimidazole (product name: 2E4MZ-CN) and 4-methyl-2-ethylimidazole (product name: 2E4MZ).

An adding amount of this imidazole hardening agent is desirably set to range from 1 to 10 weight % with respect to a total solid content of the above solder resist composition substance. This is because the imidazole hardening agent is easily uniformed and mixed if the adding amount lies within this range.

A composition substance prior to the hardening of the above solder resist is desirably constructed by using a solvent of a glycol ether system as a solvent.

In the solder resist layer using such a composition substance, no free acid is caused and no copper pad surface is oxidized. Further, a harmful property with respect to a human body is low.

Such a solvent of the glycol ether system is constructed by using the following structural formula, it is particularly desirably using at least one kind elected from diethylene glycol dimethyl ether (DMDG) and triethylene glycol dimethyl ether (DMTG). This is because these solvents can perfectly dissolve benzophenone and Michler's ketone as reaction starting agents at a heating temperature from about 30 to 50° C.

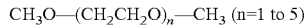

$CH_3O$—$(CH_2CH_2O)_n$—$CH_3$ (n=1 to 5)

This solvent of the glycol ether system preferably has 10 to 70 wt % with respect to a total weight amount of the solder resist composition substance.

As explained above, various kinds of antifoaming and leveling agents, thermosetting resin for improving a heat resisting property and an antibasic property and giving a flexible property, a photosensitive monomer for improving resolution, etc. can be further added to the solder resist composition substance.

For example, the leveling agent is preferably constructed by monomer of acrylic ester. A starting agent is preferably constructed by Irugacure 1907 manufactured by CHIBA-GAIGI. A photosensitizer is preferably constructed by DETX-S manufactured by NIHON KAYAKU.

Further, a coloring matter and a pigment may be added to the solder resist composition substance since a wiring pattern can be hidden. This coloring matter is desirably constructed by using phthalocyaline green.

Bisphenol type epoxy resin can be used as the above thermosetting resin as an adding component. In this bisphenol type epoxy resin, there are bisphenol A-type epoxy resin and bisphenol F-type epoxy resin. The former is preferable when an antibasic property is seriously considered. The latter is preferable when low viscosity is required (when a coating property is seriously considered).

A polyhydric acrylic-system monomer can be used as the above photosensitive monomer as an adding component since the polyhydric acrylic-system monomer can improve resolution. For example, DPE-6A manufactured by NIHON KAYAKU and R-604 manufactured by KYOEISYA KAGAKU can be used as the polyhydric acrylic-system monomer.

These solder resist composition substances preferably have 0.5 to 10 Pa·s in viscosity at 25° C. and more desirably have 1 to 10 Pa·s in viscosity since these solder resist composition substances are easily coated by a roll coater in these cases.

BRIEF DESCRIPTION OF THE DRAWINGS

FIG. 7 is a process view of the manufacturing method of the multilayer printed wiring board in accordance with the first embodiment.

FIG. 8 is a process view of the manufacturing method of the multilayer printed wiring board in accordance with the first embodiment.

FIG. 12 is an explanatory view showing the wiring pattern in the first embodiment.

FIG. 14(A) is a transversal sectional view taken along line A-A of the multilayer build-up wiring board shown in FIG. 13, and FIG. 14(B) is a plan view showing an example of a wiring pattern.

FIG. 15 is a plan view showing an example of the wiring pattern.

FIG. 19(A) is an enlarged view of an A-portion in FIG. 18 and FIG. 19(B) is an enlarged view of a B-portion in FIG. 18.

FIG. 20(C) is an enlarged view of a C-portion in FIG. 18 and FIG. 20(C') is an enlarged view of an isolated land.

FIG. 22 is an enlarged view of a signal line and a dummy conductor.

FIG. 26 is a manufacturing process view of the printed wiring board in accordance with the fourth embodiment.

FIG. 27 is a manufacturing process view of the printed wiring board in accordance with the fourth embodiment.

FIG. 28 is a manufacturing process view of the printed wiring board in accordance with the fourth embodiment.

FIG. 29 is a manufacturing process view of the printed wiring board in accordance with the fourth embodiment.

FIG. 33(A) is a view showing a wiring pattern of the multilayer printed wiring board of the prior art, and FIG. 33(B) is a cross-sectional view taken along line B-B of FIG. 32(E).

BEST MODES FOR EMBODYING THE INVENTION

Figure 1:
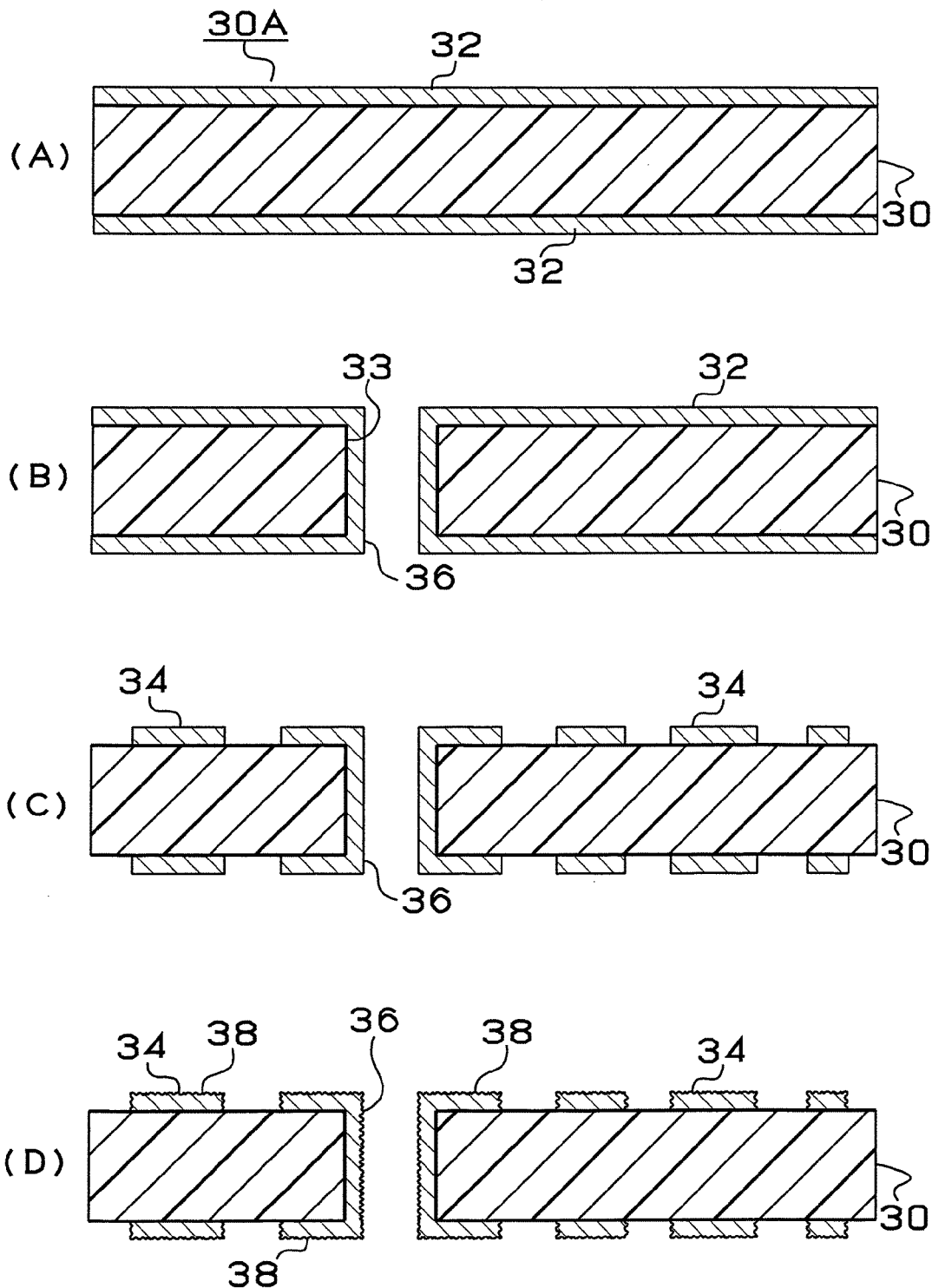
FIG. 1 is a process view of a manufacturing method of a multilayer printed wiring board in accordance with a first embodiment of the present invention.
Figure 2:
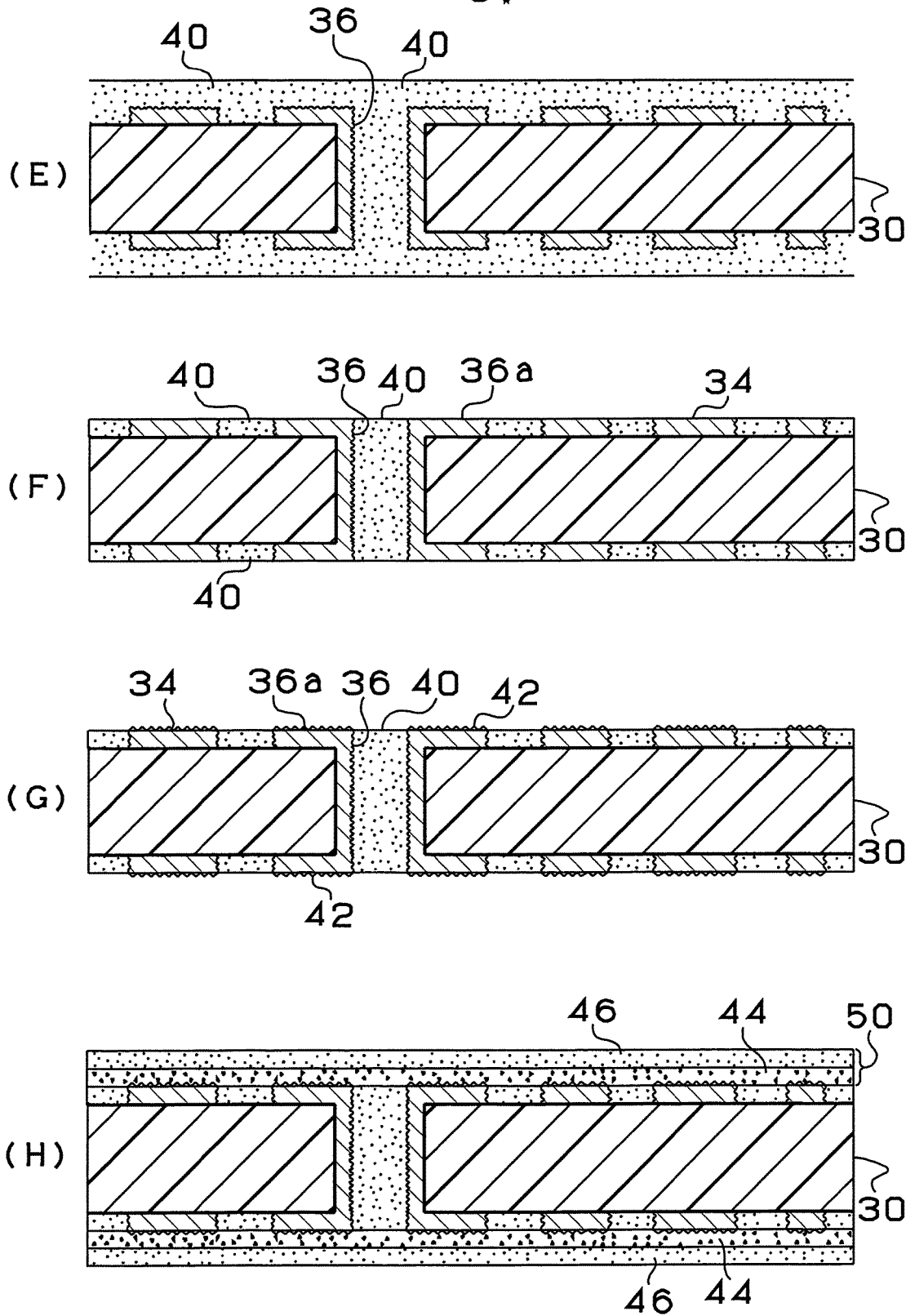
FIG. 2 is a process view of the manufacturing method of the multilayer printed wiring board in accordance with the first embodiment.
Figure 3:
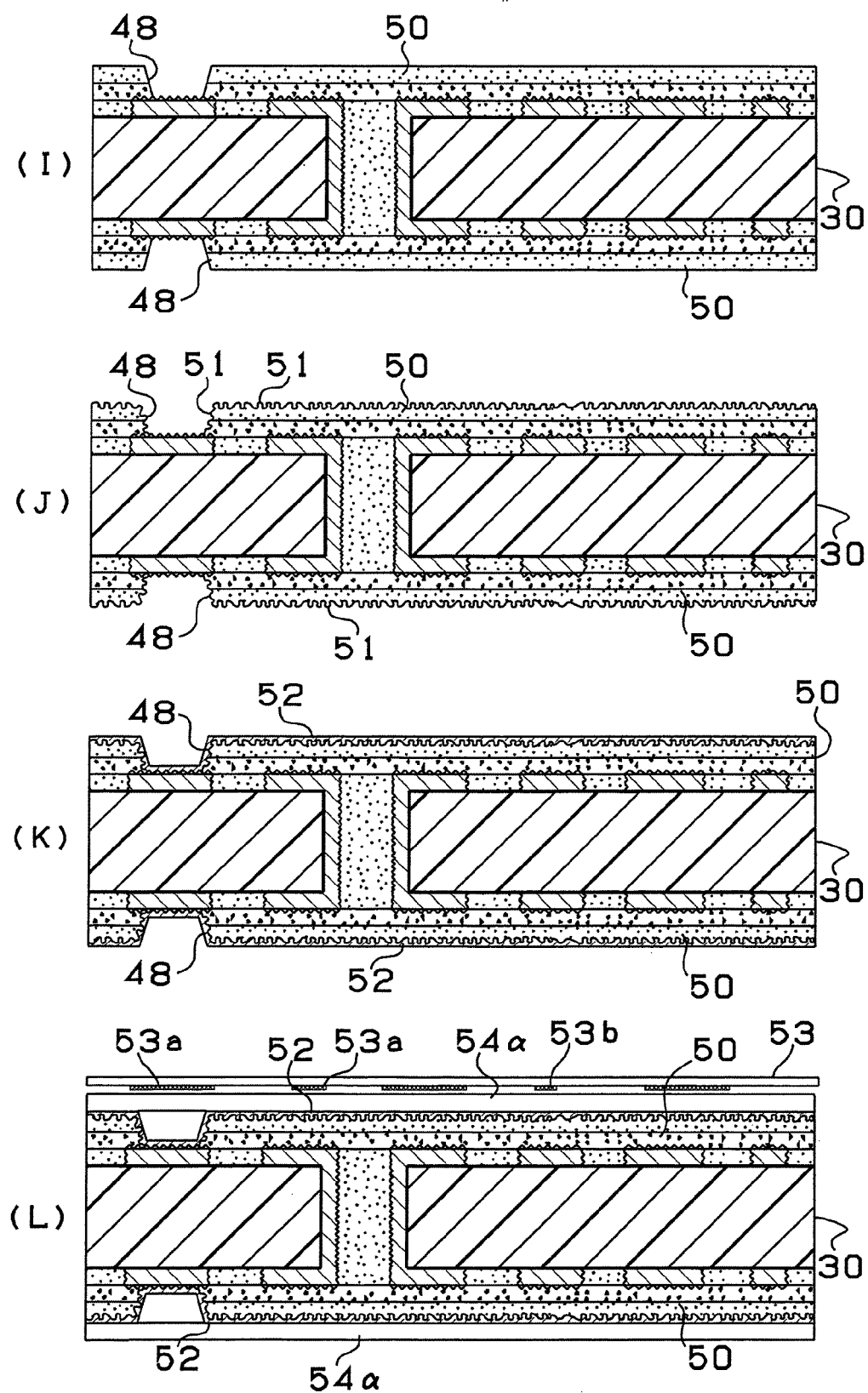
FIG. 3 is a process view of the manufacturing method of the multilayer printed wiring board in accordance with the first embodiment.
Figure 4:
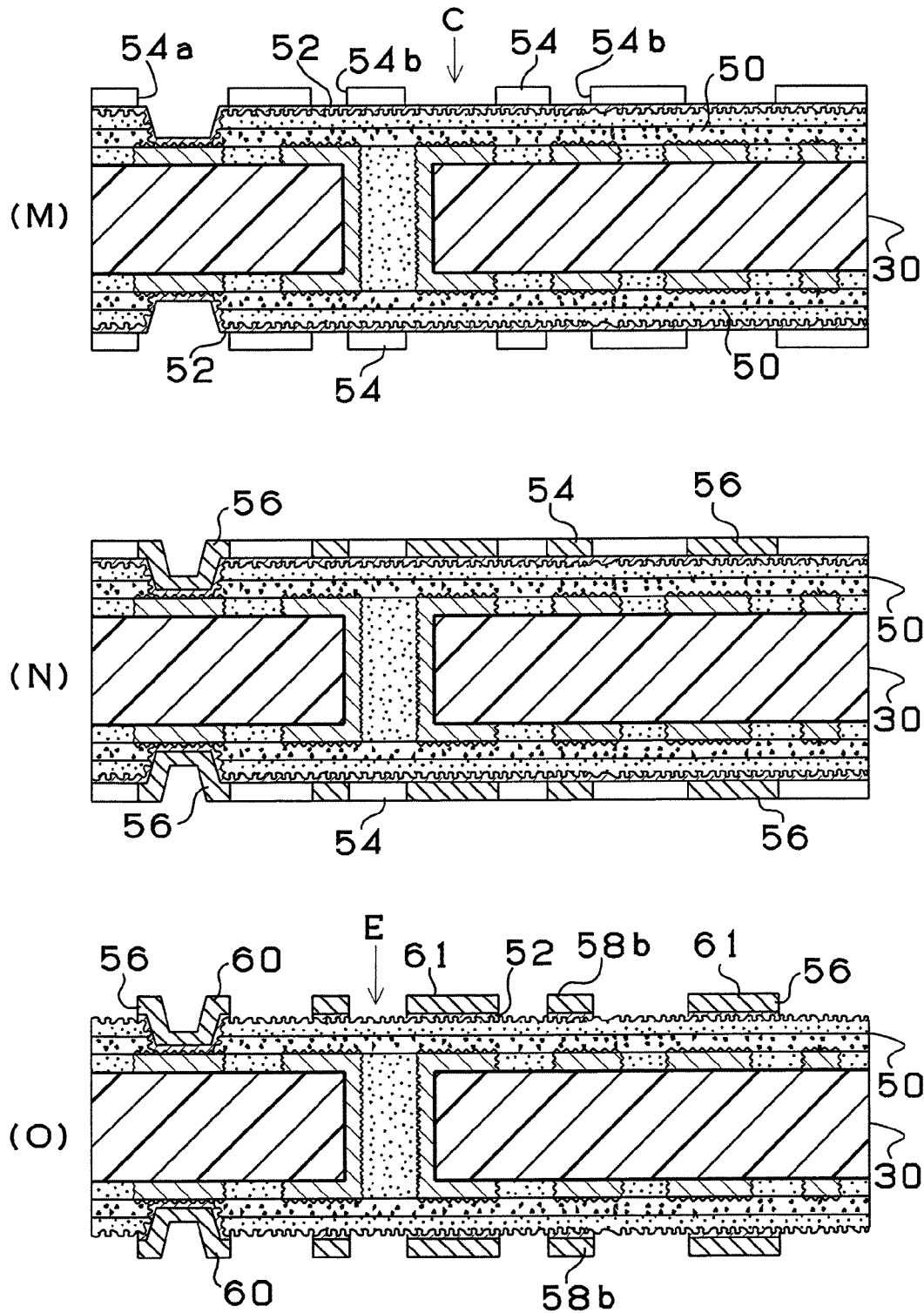
FIG. 4 is a process view of the manufacturing method of the multilayer printed wiring board in accordance with the first embodiment.
Figure 5:
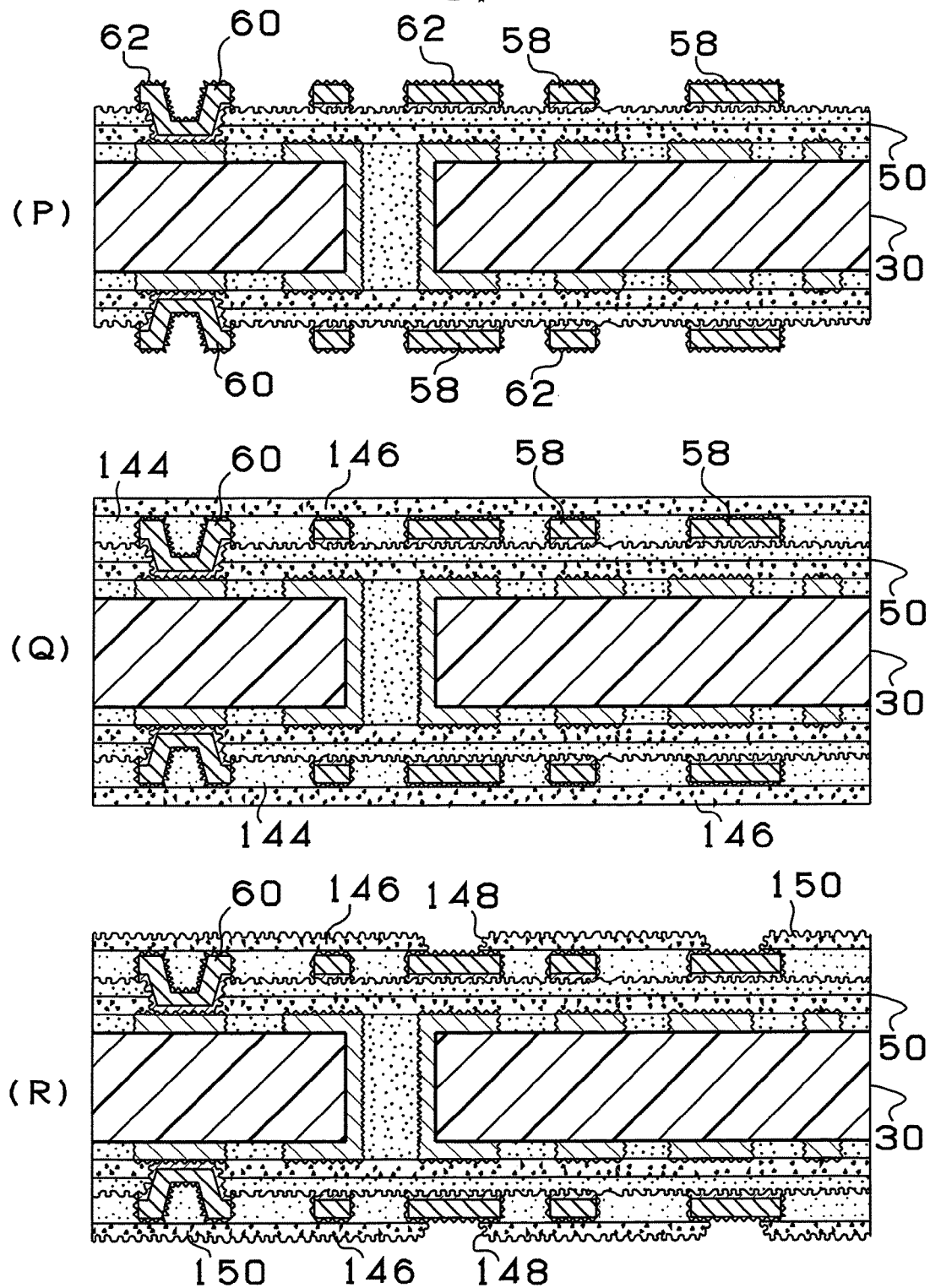
FIG. 5 is a process view of the manufacturing method of the multilayer printed wiring board in accordance with the first embodiment.
Figure 6:
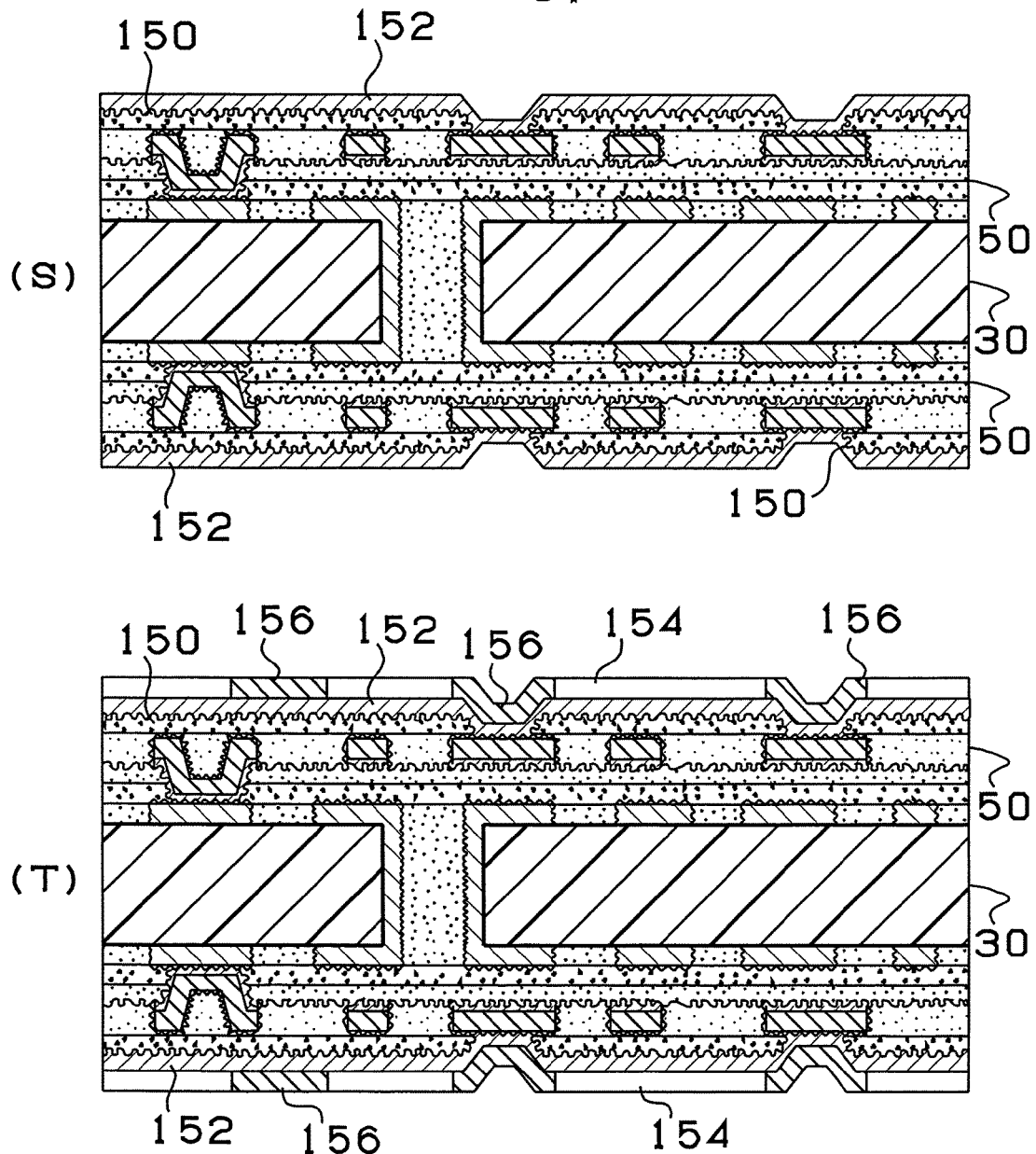
FIG. 6 is a process view of the manufacturing method of the multilayer printed wiring board in accordance with the first embodiment.

A manufacturing method of a multilayer printed wiring board in accordance with an embodiment of the present invention will next be explained with reference to the drawings.

Here, the explanation is made with respect to compositions of A. an adhesive for electroless plating, B. an interlayer resin insulating agent, and C. a resin filling agent used in the manufacturing method of the multilayer printed wiring board in accordance with the first embodiment.

A. Raw Material Composition Substance for Adjusting and Manufacturing an Adhesive for Electroless Plating (an Adhesive for an Upper Layer)

[Resin Composition Substance ①]

A resin composition substance is obtained by stirring and mixing 35 weight parts of a resin liquid, 3.15 weight parts of a photosensitive monomer (manufactured by TO-A GOSEI, Alonix M315), 0.5 weight part of an antifoaming agent (manufactured by SAN-NOPUKO, S-65) and 3.6 weight parts of NMP. In the resin liquid, 25% of a cresol novolak type epoxy resin (manufactured by NIHON KAYAKU, molecular weight 2500) and 80 wt % of an acrylic substance in concentration are dissolved to DMDG.

[Resin Composition Substance ②]

A resin composition substance is obtained by mixing 12 weight parts of polyether sulfone (PES), 7.2 weight parts of epoxy resin particles (manufactured by SANYO KASEI, polymer pole) having an average particle diameter of 1.0 μm, and 3.09 weight parts of epoxy resin particles having an average particle diameter of 0.5 μm, and then adding 30 weight parts of NMP to the mixed material and stirring and mixing these materials by a beads mill.

[Hardening Agent Composition Substance ③]

A hardening agent composition substance is obtained by stirring and mixing 2 weight parts of an imidazole hardening agent (manufactured by SHIKOKU KASEI, 2E4MZ-CN), 2 weight parts of an optical starting agent (manufactured by CHIBAGAIGI, Irugacure I-907), 0.2 weight part of a photosensitizer (manufactured by NIHON KAYAKU, DETX-S), and 1.5 weight parts of NMP.

B. Raw Material Composition Substance for Adjusting and Manufacturing an Interlayer Resin Insulating Agent (an Adhesive for a Lower Layer)

[Resin Composition Substance ①]

A resin composition substance is obtained by stirring and mixing 35 weight parts of a resin liquid, 4 weight parts of a photosensitive monomer (manufactured by TO-A GOSEI, Alonix M315), 0.5 weight part of an antifoaming agent (manufactured by SAN-NOPUKO, S-65) and 3.6 weight parts of NMP. In the resin liquid, 25% of a cresol novolak type epoxy resin (manufactured by NIHON KAYAKU, molecular weight 2500) and 80 wt % of an acrylic substance in concentration are dissolved to DMDG.

[Resin Composition Substance ②]

A resin composition substance is obtained by mixing 12 weight parts of polyether sulfone (PES) and 14.49 weight parts of epoxy resin particles (manufactured by SANYO KASEI, polymer pole) having an average particle diameter of 0.5 μm, and then adding 30 weight parts of NMP to the mixed material and stirring and mixing these materials by a beads mill.

[Hardening Agent Composition Substance ③]

A hardening agent composition substance is obtained by stirring and mixing 2 weight parts of an imidazole hardening agent (manufactured by SHIKOKU KASEI, 2E4MZ-CN), 2 weight parts of an optical starting agent (manufactured by CHIBAGAIGI, Irugacure I-907), 0.2 weight part of a photosensitizer (manufactured by NIHON KAYAKU, DETX-S), and 1.5 weight parts of NMP.

C. Raw Material Composition Substance for Adjusting and Manufacturing a Resin Filling Agent A filling agent used in the present invention is desirably constructed by at least one kind of bisphenol type epoxy resin selected from a bisphenol F-type epoxy resin and a bisphenol A-type epoxy resin, an imidazole hardening agent and inorganic particles.

The inorganic particles desirably have a particle diameter from 0.1 to 5.0 μm. A compounding amount of the inorganic particles is preferably set to 1.0 to 2.0 times that of the epoxy resin in weight ratio.

The inorganic particles are preferably constructed by silica, alumina, mullite, SiC, etc.

A coarsened layer is desirably formed in the inner wall of a through hole filled with the filling agent and desirably has an irregular height Rmax=0.01 to 5 μm.

[Resin Composition Substance ①]

100 weight parts of a bisphenol A-type epoxy monomer (manufactured by YUKA SHELL, Epicoat 828), 150 weight parts of spherical particles of $Al_2O_3$ each having an average particle diameter of 1.5 μm on its surface, 30 weight parts of N-methyl pyrrolidone (NMP), and 1.5 weight parts of a leveling agent (manufactured by SAN-NOPUKO, Pelenol S4) are stirred and mixed. Viscosity of this mixture is adjusted to 45,000 to 49,000 cps at 23±1° C.

[Hardening Agent Composition Substance ②]

A hardening agent composition substance is formed by 6.5 weight parts of an imidazole hardening agent (manufactured by SHIKOKU KASEI, 2E4MZ-CN).

Manufacture of the printed wiring board will be subsequently explained with reference to FIGS. 1 to 9.

(1) As shown in FIG. 1(A), a copper spreading laminating plate 30A is set to a starting material. In the copper spreading laminating plate 30A, a copper foil 32 having 12 μm in thickness is laminated with both faces of a substrate 30 constructed by glass epoxy resin or BT (bismaleimide triazine) resin having 1 mm in thickness. First, a passing hole is formed in this copper spreading laminating plate 30A by a drill and electroless plating 33 is deposited within the passing hole so that a through hole 36 is formed (FIG. 1(B)). As shown in FIG. 1(C), a conductor layer 34 is then formed in a core substrate 30 by etching the copper foil 32 in a pattern shape.

(2) This substrate 30 is then washed with water and is dried. Thereafter, as shown in FIG. 1(D), a coarsened layer 38 is formed on surfaces of the conductor layer 34 and the through hole 36 by oxidizing-reducing processing using NaOH (10 g/l), $NaClO_2$ (40 g/l) and $Na_3O_4$ (6 g/l) as an oxidizing bath (photographic bath), and NaOH (10 g/l) and $NaBH_4$ (6 g/l) as a reducing bath.

(3) The raw material composition materials for adjusting and manufacturing the resin filling agent in the above C are mixed and kneaded so that a resin filling agent is obtained.

(4) The through hole 36 of this core substrate 30 is filled with a filling agent 40 constructed by thermosetting resin. A surface of the core substrate 30 is simultaneously coated with the filling agent 40 (see FIG. 2(E)).

(5) The filling agent is thermally hardened and surfaces of a through hole land 36a and the conductor layer 34 are polished by a belt sander using belt abrasive paper of #400 (manufactured by SANKYO RIKAGAKU) such that no resin filling agent is left on these surfaces. Next, buff polishing for removing flaws caused by this belt sander polishing is performed by grinding particles of SiC. A series of such polishing processes is similarly performed on the other face of the substrate.

Next, the resin filling agent 40 is heated for one hour at 100° C. and one hour at 150° C. so that the resin filling agent 40 is hardened.

Thus, both the faces of the substrate 30 are smoothed by removing the coarsened layer from upper faces of a surface layer portion of the resin filling agent 40 filling the through hole 36, etc. and the through hole land 36a, etc.

(6) As shown in FIG. 2(G), a coarsened layer (an irregular layer) 42 constructed by a Cu—Ni—P alloy having 2.5 μm in thickness is formed on the upper faces of the through hole land 36a and the conductor layer 34 exposed by the processing of the above (5). Further, an unillustrated Sn layer having 0.3 μm in thickness can be formed on a surface of the coarsened layer 42.

This forming method is provided as follows. The substrate 30 is decreased with acid and is soft-etched. Next, the substrate 30 is processed by a catalyst solution constructed by palladium chloride and an organic acid and a Pd catalyst is given to the substrate 30 and is activated. Thereafter, the substrate 30 is plated by an electroless plating bath constructed by copper sulfate 8 g/l, nickel sulfate 0.6 g/l, citric acid 15 g/l, sodium hypophosphite 29 g/l, boric acid 31 g/l, surfactant 0.1 g/l, and pH=9 so that a coarsened layer 42 constructed by a Cu—Ni—P alloy is formed on the upper faces of the conductor layer 34 and the through hole land 36a.

Next, a Cu—Sn substitution reaction is caused in a conduction of tin borofluoride 0.1 mol/l, thiourea 1.0 mol/l, temperature 50° C. and pH=1.2 so that an Sn layer having 0.3 μm in thickness can be formed on a surface of the coarsened layer 42. The surfaces of the through hole land 36a and the conductor layer 34 instead of the coarsened layer 42 of this Cu—Ni—P alloy can be coarsened by an etching liquid constructed by compounding a second copper complex and an organic acid and can be also coarsened by oxidizing-reducing processing.

(7) The raw material composition substances for adjusting and manufacturing an interlayer resin insulating agent in the above composition substance B are stirred and mixed and viscosity of this mixture is adjusted to 1.5 Pa·s so that an interlayer resin insulating agent (for a lower layer) is obtained.

Next, the raw material composition substances for adjusting and manufacturing an adhesive for electroless plating in the above composition substance A are stirred and mixed and viscosity of this mixture is adjusted to 7 Pa·s so that an adhesive solution for electroless plating (for an upper layer) is obtained.

(8) As shown in FIG. 2(H), the interlayer resin insulating agent (for a lower layer) 44 obtained in the above (7) and having 1.5 Pa·s in viscosity is adjusted and manufactured on both faces of the substrate 30 (FIG. 2(G)) in the above (6). Thereafter, these both faces of the substrate 30 are coated with the interlayer resin insulating agent 44 by a roll coater within 24 hours and are left as they are for 20 minutes in a horizontal state. Both the faces of the substrate 30 are then dried (prebaked) for 30 minutes at 60° C. Next, the photosensitive adhesive solution (for an upper layer) 46 obtained in the above (7) and having 7 Pa·s in viscosity is adjusted and manufactured, and both the faces of the substrate 30 are coated with this photosensitive adhesive solution 46 within 24 hours. Both the faces of the substrate 30 are then left as they are for 20 minutes in a horizontal state and are dried (prebaked) for 30 minutes at 60° C. so that an adhesive layer 50 having 35 μm in thickness is formed.

(9) An unillustrated photomask film having a printed black circle of 85 μmφ is closely attached to both the faces of the substrate 30 having the adhesive layer 50 formed in the above (8) and is exposed by a superhigh pressure mercury lamp in 500 mJ/cm². This film is spray-developed by a DMTG solution and the substrate is further exposed by the superhigh pressure mercury lamp in 3000 mJ/cm². The substrate is heated (post baked) for one hour at 100° C. and one hour at 120° C. and is then heated (post baked) for three hours at 150° C. Thus, as shown in FIG. 3(I), an interlayer resin insulating layer (two-layer structure) 50 having 35 μm in thickness and having an opening (an opening for forming a via hole) 48 having 85 μmφ and an excellent size accuracy is formed in accordance with the photomask film. A tin plating layer can be partially exposed to the opening 48 forming the via hole.

(10) The substrate 30 forming the opening 48 therein is dipped into chromic acid for 19 minutes and epoxy resin particles existing on a surface of the interlayer resin insulating layer 50 are dissolved and removed therefrom. Thus, as shown in FIG. 3(J), the surface of the interlayer resin insulating layer 50 is set to a coarsened face 51. Thereafter, this interlayer resin insulating layer 50 is dipped into a neutralization liquid (manufactured by SHIPLAY Corporation) and is washed with water.

Further, catalyst nuclei are attached to the surface of the interlayer resin insulating layer 50 and an inner wall face of the opening 48 for the via hole by giving a palladium catalyst (manufactured by ATOTECH) to the surface of the coarsened substrate 30 (having a coarsening depth of 3 μm).

(11) The substrate is dipped into an electroless copper plating aqueous solution composed as follows and an electroless copper plating film 52 having 0.6 μm in thickness is formed on an entire coarse surface as shown in FIG. 3(K).

[Electroless Plating Aqueous Solution]

| | |
|---|---|
| EDTA | 150 g/l |
| copper sulfate | 20 g/l |
| HCHO | 30 ml/l |
| NaOH | 40 g/l |
| α,α'-bipyridyl | 80 mg/l |
| PEG | 0.1 g/l |

[Electroless Plating Condition]

An electroless plating condition is set to 30 minutes at a liquid temperature of 70° C.

(12) As shown in FIG. 3(L), a photosensitive dry film 54a sold at a market is spread and attached onto the electroless copper plating film 52 of the core substrate 30. A mask 53 having a pattern 53b for forming a wiring pattern and a black circle pattern 53a for forming a via hole and a land is arranged on the photosensitive dry film 54a. The mask 53 is then exposed in 100 mJ/cm² and is developed by 0.8% sodium carbonate so that a plating resist 54 having 15 μm in thickness is formed as shown in FIG. 4(M).

Figure 9:
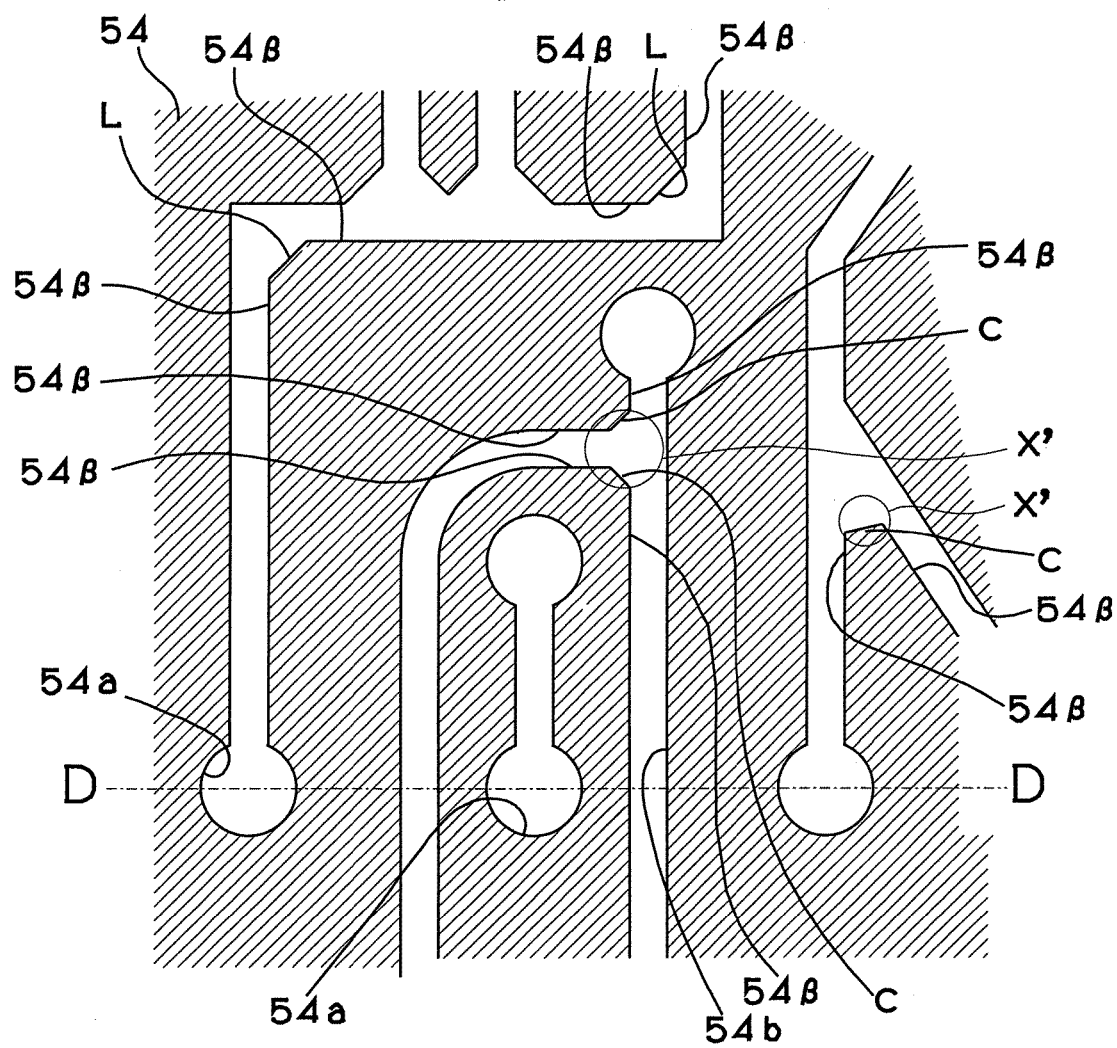
FIG. 9 is a view taken along an arrow C of a core substrate in a process shown in FIG. 4(M).

FIG. 9 shows a view taken along an arrow C of FIG. 4(M), i.e., a plan view of the core substrate 30 in which the plating resist 54 is formed. A D-D line in FIG. 9 is a line corresponding to a cutting end of FIG. 4(M). A circular opening portion 54a for forming the land or the via hole, and a linear opening portion 54b for forming a wiring pattern are formed in the plating resist 54. A corner portion C in a crossing portion X' of the opening portion 54b forming the wiring pattern at a crossing angle of a side wall 54β of this opening portion equal to or smaller than 90° is chamfered. Similarly, a corner portion L in a curving portion of the opening portion 54b forming the wiring pattern at a crossing angle of the side wall 54β of this curving portion equal to or smaller than 90° is also chamfered.

(13) Next, electrolytic copper plating is performed in a resist non-forming portion (opening portions 54a, 54b) in the following condition so that an electrolytic copper plating film 56 having 15 μm in thickness is formed as shown in FIG. 4(N).

| [Electrolytic plating aqueous solution] | |
|---|---|
| sulfuric acid | 180 g/l |
| copper sulfate | 80 g/l |
| additive (manufactured by ATOTECK JAPAN, Kaparashido GL) | 1 ml/l |
| [Electrolytic plating condition] | |
| Electric current density | 1 A/dm2 |
| time | 30 minutes |
| temperature | room temperature |

(14) As shown in FIG. 4(O), the plating resist 54 is separated and removed by 5% KOH. Thereafter, the electroless plating film 52 below the plating resist 54 is dissolved and removed by etching processing using a mixing solution of sulfuric acid and hydrogen peroxide. A wiring pattern 58b having 18 μm in thickness and constructed by the electroless copper plating film 52 and the electrolytic copper plating film 56, a via hole 60 and a land 61 are formed.

The above core substrate 30 is dipped into chromic acid of 800 g/l for three minutes at 70° C. and etching processing is performed by 1 μm on the surface of the adhesive layer 50 for electroless plating on which the wiring pattern 58b, the via hole 60 and the land 61 are not formed. Thus, the palladium catalyst is removed from this surface of the adhesive layer 50.

Figure 10:
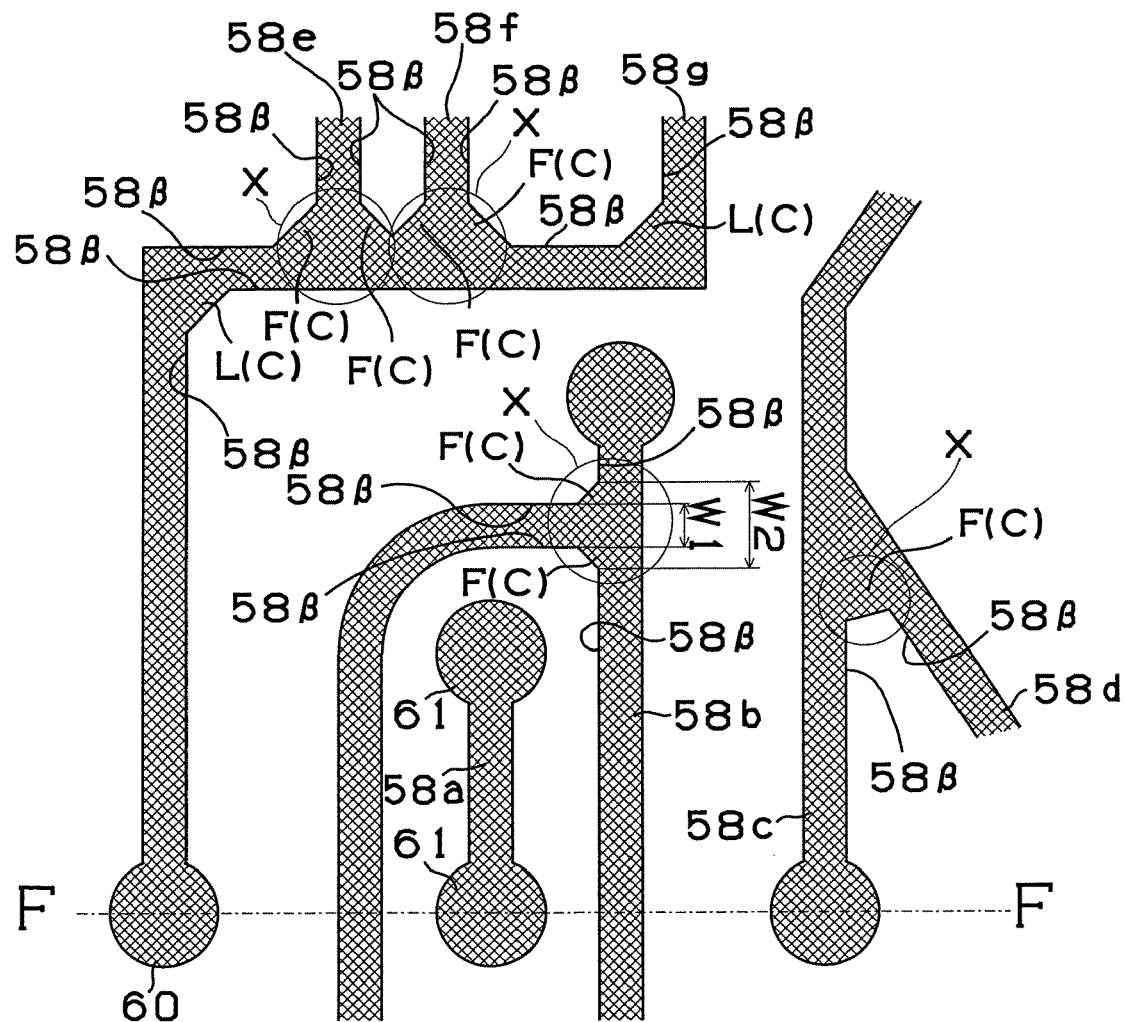
FIG. 10 is a view taken along an arrow E of the core substrate in a process shown in FIG. 4(O).

FIG. 10 shows a view taken along an arrow E of FIG. 4(O), i.e., a plan view of the core substrate 30. An F-F line in FIG. 10 is a line corresponding to a cutting end of FIG. 4(O). Wiring patterns 58a, 58b, 58c, 58d, 58e, 58f, 58g, a via hole 60 and a land 61 are formed in the core substrate 30. A filet F is added to a corner portion C in a crossing portion X of the wiring pattern 58b at a crossing angle of a side wall 58β of this wiring pattern equal to or smaller than 90°. Further, a filet F is added to a corner portion C in a crossing portion X of the wiring pattern (a signal line) 58c and the wiring pattern (a signal line) 58d at a crossing angle of side walls 58β of the wiring patterns 58c and 58d equal to or smaller than 90°. Further, a filet F is added to a corner portion C in a crossing portion X of the wiring pattern (a signal line) 58d, the wiring pattern (a signal line) 58e and the wiring pattern (a signal line) 58f at a crossing angle of side walls 58β of these wiring patterns equal to or smaller than 90°. Here, adjacent filets F added to the wiring pattern (a signal line) 58e and the wiring pattern (a signal line) 58f partially overlap each other. Further, a filet F is also added to a corner portion L in a curving portion of the wiring pattern 58g at a crossing angle (here a right angle) of a side wall 54β of this curving portion equal to or smaller than 90°.

In this first embodiment, the corner portion of the resist 54 mentioned above with reference to FIG. 9 is chamfered so as to add the filet F to the crossing portion X of the wiring pattern 58 such that a plating liquid is efficiently moved around this corner portion. Accordingly, it is possible to prevent generation of disconnection caused by making the wiring pattern thin in the crossing portion X in the prior art as mentioned above with reference to FIG. 33(A). Further, since the filet F is added to the crossing portion X of the wiring pattern 58, it is possible to prevent the generation of disconnection caused by concentration of stress caused when thermal contraction of the printed wiring board is repeated. Here, a line width of the wiring pattern is set to a line width equal to or smaller than 50 μm and is desirably set to a line width from 15 to 50 μm. A width of the filet F is set to range from 75 to 100 μm. When the width of the filet F is set to 70 μm or more, it is possible to prevent the generation of disconnection caused by concentration of stress caused when the thermal contraction of the printed wiring board is repeated. Therefore, no addition of the filet is required when the line width is set to 70 μm or more.

(15) A manufacturing process of the printed wiring board will be subsequently explained. The substrate 30 forming the wiring pattern 58 thereon is dipped into an electroless plating liquid of pH=9 constructed by copper sulfate 8 g/l, nickel sulfate 0.6 g/l, citric acid 15 g/l, sodium hypophosphite 29 g/l, boric acid 31 g/l, and surfactant 0.1 g/l. As shown in FIG. 5(P), a coarsened layer 62 constructed by copper, nickel and phosphorus and having 3 μm in thickness is formed on surfaces of the wiring pattern 58 and the via hole 60. The surfaces of the conductor circuit 58 and the via hole 60 instead of this coarsened layer 62 can be also coarsened by an etching liquid or oxidizing-reducing processing.

Next, a Cu—Sn substitution reaction is caused in a condition of tin borofluoride 0.1 mol/l, thiourea 1.0 mol/l, tempera ture 50° C. and pH=1.2 so that an Sn layer having 0.3 μm in thickness is formed on a surface of the coarsened layer 62. (No Sn layer is illustrated in the drawings.)

(16) An interlayer resin insulating layer and a conductor circuit of upper layers are further formed by repeating processes from (2) to (14). Namely, both faces of the substrate 30 are coated with an interlayer resin insulating agent (for a lower layer) by a roll coater so that an insulating material layer 144 is formed (FIG. 5(Q)). In this case, as mentioned above, the filet F is added to the crossing portion X of the wiring pattern 58. Therefore, different from the printed wiring board of the prior art mentioned above with reference to FIG. 33(B), there are no air bubbles left between the crossing portion X of the wiring pattern 58 and the interlayer resin insulating layer (insulating material layer) 144 so that reliability of the printed wiring board is improved. Further, this insulating agent layer 144 is coated with an adhesive for electroless plating (for an upper layer) by a roll coater so that an adhesive layer 146 is formed.

A photomask film is closely attached to both faces of the substrate 30 having the insulating agent layer 144 and the adhesive layer 146 and is exposed and developed so that an interlayer resin insulating layer 150 having an opening (an opening for forming a via hole) 148 is formed. Thereafter, a surface of the interlayer resin insulating layer 150 is set to a coarse face (see FIG. 5(R)). Thereafter, an electroless copper plating film 152 is formed on the coarsened surface of the substrate 30 (see FIG. 6(S)). A plating resist 154 is subsequently formed on the electroless copper plating film 152. Thereafter, an electrolytic copper plating film 156 is formed in a non-forming portion of the resist (see FIG. 6(T)). After the plating resist 154 is separated and removed by KOH, the electroless plating film 152 below the plating resist 154 is dissolved and removed, and an unillustrated conductor circuit, a land 161 and a via hole 160 are formed. Further, a coarsened layer 162 is formed on surfaces of the conductor circuit, the land 161 and the via hole 160 so that a multilayer printed wiring board is completely manufactured (see FIG. 7(U)). No Sn substitution is performed in this process for forming the conductor circuit in the upper layer.

(17) A soldering bump is formed in the above multilayer printed wiring board. First, the substrate 30 is coated with a solder resist composition substance such that this solder resist composition substance has 20 μm in thickness. The substrate 30 is then dried for 20 minutes at 70° C. and 30 minutes at 70° C. Thereafter, the substrate 30 is exposed by an ultraviolet ray of 1000 mJ/cm² and is DMTG-developed.

Further, the substrate 30 is heated in a condition of one hour at 80° C., one hour at 100° C., one hour at 120° C. and three hours at 150° C. Thus, as shown in FIG. 7(V), a solder resist layer (having 20 μm in thickness) 70 having an opening portion 71 (having an opening diameter of 200 μm) corresponding to a pad portion is formed.

(18) Next, the substrate 30 is dipped for 20 minutes into an electroless nickel plating liquid of pH=4.5 constructed by nickel chloride $2.31 \times 10^{-1}$ mol/l, sodium hypophosphite $2.8 \times 10^{-1}$ mol/l and sodium citrate $1.85 \times 10^{-1}$ mol/l. Thus, a nickel plating layer 72 having 5 μm in thickness is formed in the opening portion 71. Further, this substrate is dipped for 7 minutes and 20 seconds into an electroless gold plating liquid constructed by potassium gold cyanide $4.1 \times 10^{-2}$ mol/l, ammonium chloride $1.87 \times 10^{-1}$ mol/l, sodium citrate $1.16 \times 10^{-1}$ mol/l and sodium hypophosphite $1.7 \times 10^{-1}$ mol/l in a condition of 80° C. Thus, a gold plating layer 74 having 0.03 μm in thickness is formed on the nickel plating layer so that a soldering pad is formed in the via hole 160.

Thereafter, a reinforcing layer 78 of the solder resist 70 is covered.

(20) Soldering paste is printed on the opening portion 71 of the solder resist layer 70 and is reflowed at 200° C. so that a soldering bump 76 is formed. The printed wiring board having the soldering bump is thus manufactured.

Figure 11:
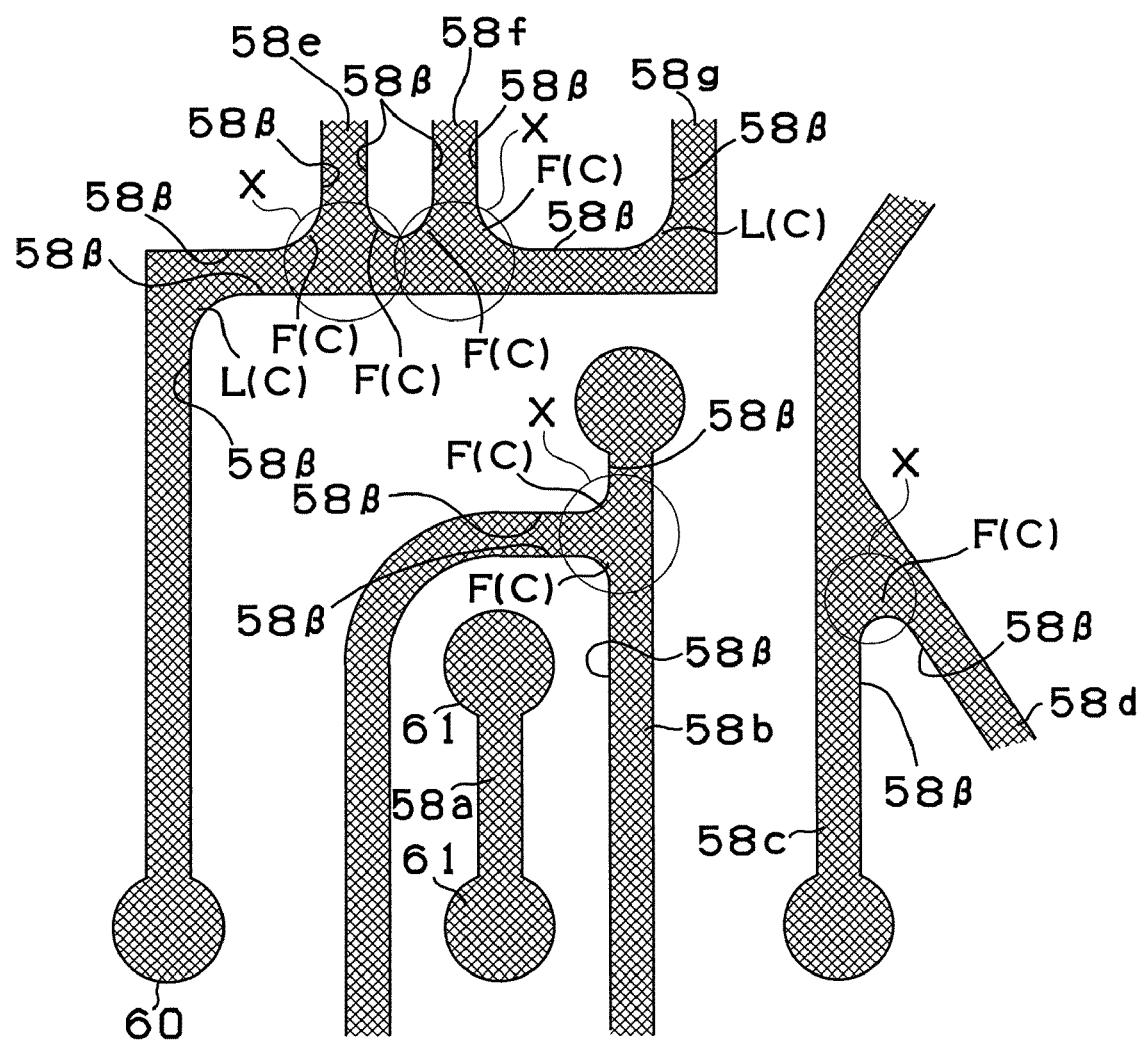
FIG. 11 is a plan view of the core substrate having a wiring pattern formed in a modifying example of the first embodiment.

A wiring pattern of the printed wiring board in a modifying example of the first embodiment will be subsequently explained with reference to FIG. 11. A triangular filet F is added to the printed wiring board in the first embodiment mentioned above with reference to FIG. 10. However, in this second embodiment, a filet F is added to the printed wiring board in a curving shape. Namely, the filet F is added to a corner portion C in a crossing portion X of a wiring pattern 58b at a crossing angle of a side wall 58β of this wiring pattern equal to or smaller than 90°. Further, a filet F is added to a corner portion C in a crossing portion X of a wiring pattern (a signal line) 58c and a wiring pattern (a signal line) 58d at a crossing angle of side walls 58β equal to or smaller than 90°. Further, a filet F is added to a corner portion C in a crossing portion X of the wiring pattern (a signal line) 58d, a wiring pattern (a signal line) 58e and a wiring pattern (a signal line) 58f at a crossing angle of side walls 58β of these wiring patterns equal to or smaller than 90°. Further, a filet F is added to a corner portion L in a curving portion of a wiring pattern 58g at a crossing angle of a side wall 54β of this curving portion equal to or smaller than 90°.

The filets in the modifying example have merits in that it is difficult to concentrate stress. In contrast to this, the filets in the mode shown in FIG. 10 have merits in that processing for adding the filets (processing for forming the pattern of a mask) is easily performed.

In the printed wiring board in the above first embodiment, the filet F is added to the corner portion C in the crossing portion X of the wiring patterns of the printed wiring board at a crossing angle equal to or smaller than 90°. Therefore, no disconnection is caused by stress concentration in the crossing portion. Further, no stress caused in the crossing portion of the wiring patterns causes a crack in the interlayer resin insulating layers 50, 150. Further, reliability of the printed wiring board is improved since no air bubbles are left between the crossing portion X of the wiring patterns 58 and the interlayer resin insulating layer 150.

Further, as shown in FIGS. 12(A) and 12(B), the filet F can be also added to the crossing portion when the wiring patterns 58 cross in shapes of X and K characters.

A multilayer build-up wiring board in accordance with a second embodiment of the present invention will next be explained with reference to the drawings.

Figure 13:
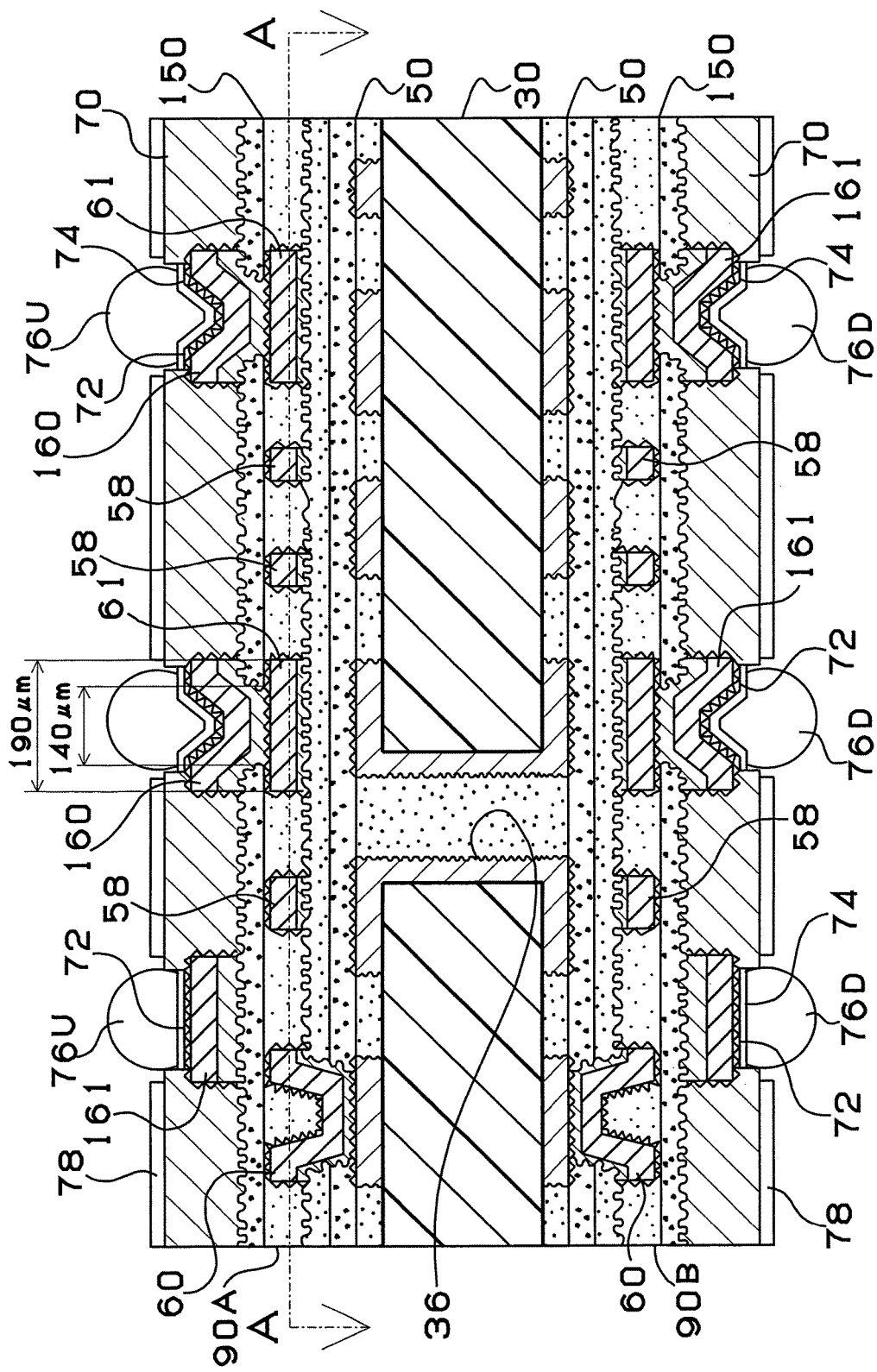
FIG. 13 is a view showing a section of a multilayer build-up wiring board in accordance with a second embodiment of the present invention.

FIG. 13 shows a section of the multilayer build-up wiring board in accordance with the second embodiment of the present invention. Build-up wiring layers 90A, 90B are formed on front and rear faces of a multilayer core substrate 30. The build-up layers 90A, 90B are constructed by interlayer resin insulating layers 50 and 150. A via hole 60, a via hole land 61 and a wiring pattern 58 are formed in the interlayer resin insulating layer 50. A via hole 160, a land 161 and an unillustrated wiring pattern are formed in the interlayer resin insulating layer 150. The via hole 160 in an upper layer is connected to the via hole land 61.

A soldering bump 76U for connection to an unillustrated bump of an IC chip is formed on a front (upper face) side of the printed wiring board. A soldering bump 76D for connection to an unillustrated bump of a mother board is formed on a rear (lower face) side of the printed wiring board. A wiring pattern from the soldering bump 76U connected to the IC chip is wired in an outer circumferential direction of the substrate within the multilayer build-up wiring board and is connected to the soldering bump 76D connected to a mother board side. The build-up layer 90A on the front side and the build-up layer 90B on the rear side are connected to each other through a through hole 36 formed in the core substrate 30.

FIG. 14(A) shows an A-A section of the multilayer build-up wiring board in FIG. 13. An X-X line in FIG. 14(A) corresponds to a cutting end of FIG. 13. In the multilayer build-up wiring board in the second embodiment, the via hole land 61 and the via hole 60 are formed such that diameters of the via hole land 61 and the via hole 60 range from 140 to 200 μm. In contrast to this, a narrow portion (hereinafter called a narrow width portion) 58b having 30 μm in width and a normal line width portion (hereinafter called a normal width portion) 58a having a width from 40 to 50 μm are formed in the wiring pattern 58 in accordance with a distance from an adjacent conductor portion (the via hole, the via hole land).

Namely, a portion located between the via hole lands 61 and 61 is set to the narrow width portion 58b with respect to two wiring patterns 58 located between the via hole lands 61 and 61. A portion capable of holding an insulating distance (here 40 μm) between the via hole lands of these two wiring patterns 58 is set to the normal width portion 58a formed such that this portion has a width from 40 to 50 μm. The insulating distances from both the via hole lands 61 are held by respectively narrowing the widths of the wiring patterns on sides opposed to the two via hole lands 61. On the other hand, all the wiring patterns 58 arranged between the via hole 60 and the via hole lands 61 are formed as the normal width portion 58a since the insulating distances (40 μm) from the via hole 60 and the via hole lands 61 can be held even in a most proximate portion.

In the multilayer build-up wiring board in the second embodiment, the insulating distance between the wiring pattern 58 and a conductor portion is held and density of the wiring pattern 58 is increased by narrowing the width of a portion (narrow width portion) 58a located between conductor portions (via hole lands 61). Therefore, the density of the wiring pattern 58 can be increased without increasing the number of build-up layers. Here, the portion capable of holding the insulating distance from the conductor portion, i.e., the portion (normal width portion) 58a unlocated between the via hole lands 61 is not narrowed in width. Therefore, possibility of disconnection is reduced in a manufacturing process described later and a reduction in yield can be prevented.

Further, a shape of the wiring pattern 58 in the second embodiment will be continuously explained with reference to FIGS. 14(B), 15(C), 15(D) and 16. In FIG. 14(B), one wiring pattern 58 is located between conductor portions (via hole lands or pads for mounting (hereinafter called pads) 61) and a narrow width portion 58b is narrowed in width on a central side of the wiring pattern. Namely, the insulating distances from both the conductor portions (via hole lands or pads 61) are held by narrowing the above width on the central side of the wiring pattern 58.

In FIG. 15C, when three wiring patterns are located between conductor portions (via hole lands or pads) 61, the width of a central wiring pattern 58 is narrowed on its central side and the widths of wiring patterns 58 on both sides of the central wiring pattern are respectively narrowed on sides opposed to the conductor portions (via hole lands or pads) 61. Namely, the width of the central wiring pattern is narrowed on the central side and the widths of the wiring patterns on both the sides are respectively narrowed on sides opposed to the conductor portions so that the insulating distances from both the conductor portions and the insulating distance between the wiring patterns are held.

In FIG. 15(D), similar to FIG. 15(C), narrow width portions 58a are formed in three wiring patterns 58 and wiring pattern sides of conductor portions (via hole lands or pads 61) are notched. Namely, the insulating distances between the wiring patterns and the via hole lands or pads 61 are held by notching the wiring pattern sides of the via hole lands or pads 61. This example shown in FIG. 15(D) is used only when no insulating distance of 40 μm can be held by simply narrowing the widths of the wiring patterns as shown in FIG. 15(C). Namely, when the diameter of a lower end face of an upper layer via hole 160 shown in FIG. 13 is set to 140 μm, a via hole land or pad 61 is formed such that this via hole land or pad 61 has a diameter of 190 μm greater by 50 μm than this diameter of the lower end face. This diameter of the via hole land or pad 61 is set so as to form the upper layer via hole 160 on the via hole land or pad 61 even when the upper layer via hole 160 is located in a most offset position since a position error of the upper layer via hole 160 is set to about ±25 μm with respect to the via hole land or pad 61. Further, this diameter of the via hole land or pad 61 is set since no via hole land or pad 61 is suitably connected to the upper layer via hole 160 in a certain case and yield is reduced when one portion of the via hole land or pad 61 is notched as in the example shown in FIG. 15(D).

Figure 16:
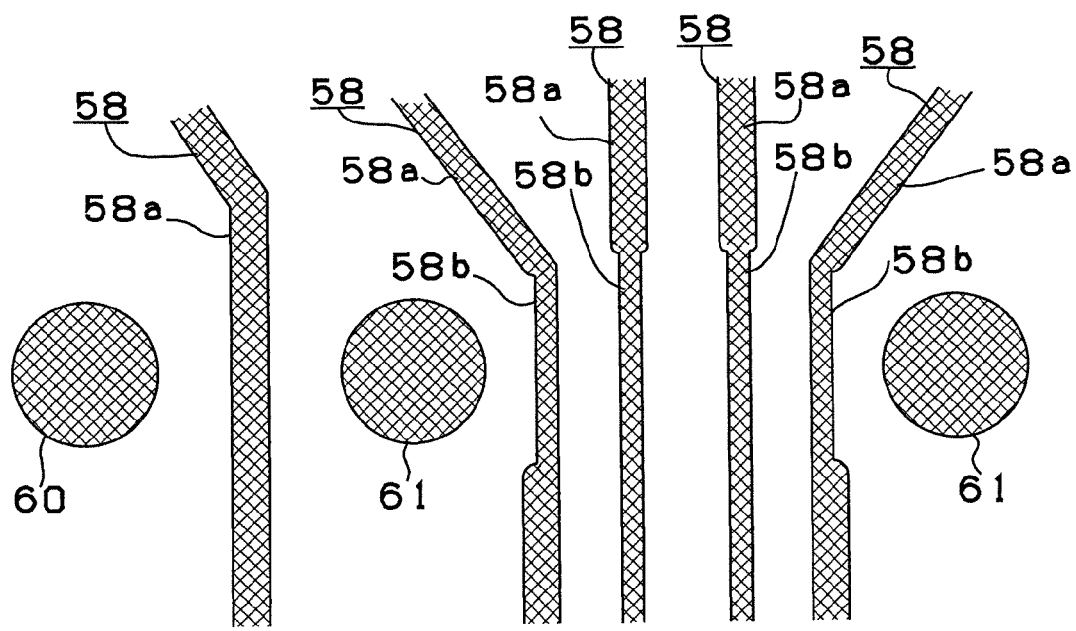
FIG. 16 is a plan view showing an example of the wiring pattern in the second embodiment.

Further, as shown in FIG. 16, when four or more wiring patterns 58 are located between conductor portions 61, insulating distances from both the conductor portions 61 and the insulating distances between the wiring patterns 58 can be held by narrowing a width of at least one portion of a central wiring pattern except for wiring patterns on both sides on a central side, and narrowing widths of the wiring patterns on both the sides on sides opposed to respective conductor portions.

A manufacturing method of the multilayer build-up wiring board in the second embodiment mentioned above with reference to FIG. 13 is similar to that in the first embodiment mentioned above with reference to FIGS. 1 to 8. Accordingly, an explanation of this manufacturing method is omitted here. As shown here in FIGS. 4(N) and 4(O), when a wiring pattern 58 is formed, the wiring pattern 58 is set in the multilayer build-up wiring board in the second embodiment such that the width of only a portion (narrow width portion) 58a located between conductor portions such as via hole lands 61, etc. is narrowed as mentioned above with reference to FIGS. 14(A) to 15(D) and 16. Namely, no width of a portion (normal width portion) 58a unlocated between the via hole lands 61 is narrowed. Therefore, the possibility of disconnection in the above process is reduced and yield is increased.

Further, in the above example, the wiring pattern is formed by electroless plating. However, a shape of the wiring pattern in the above second embodiment can be also applied when the wiring pattern is formed by copper foil etching. Further, in the above second embodiment, one portion of the wiring pattern located between the via hole lands or pads 61 is made thin. However, one portion of the wiring pattern located between via holes and solid layers or close to these portions can be similarly made thin.

A printed wiring board and its manufacturing method in accordance with a third embodiment of the present invention will next be explained with reference to the drawings.

First, the construction of the printed wiring board 10 in accordance with the third embodiment of the present invention will be explained with reference to FIGS. 17 and 18. FIG.

17 shows a state in which an IC chip 90 is mounted to the multilayer printed wiring board 10 and is attached to a daughter board 94.

Figure 17:
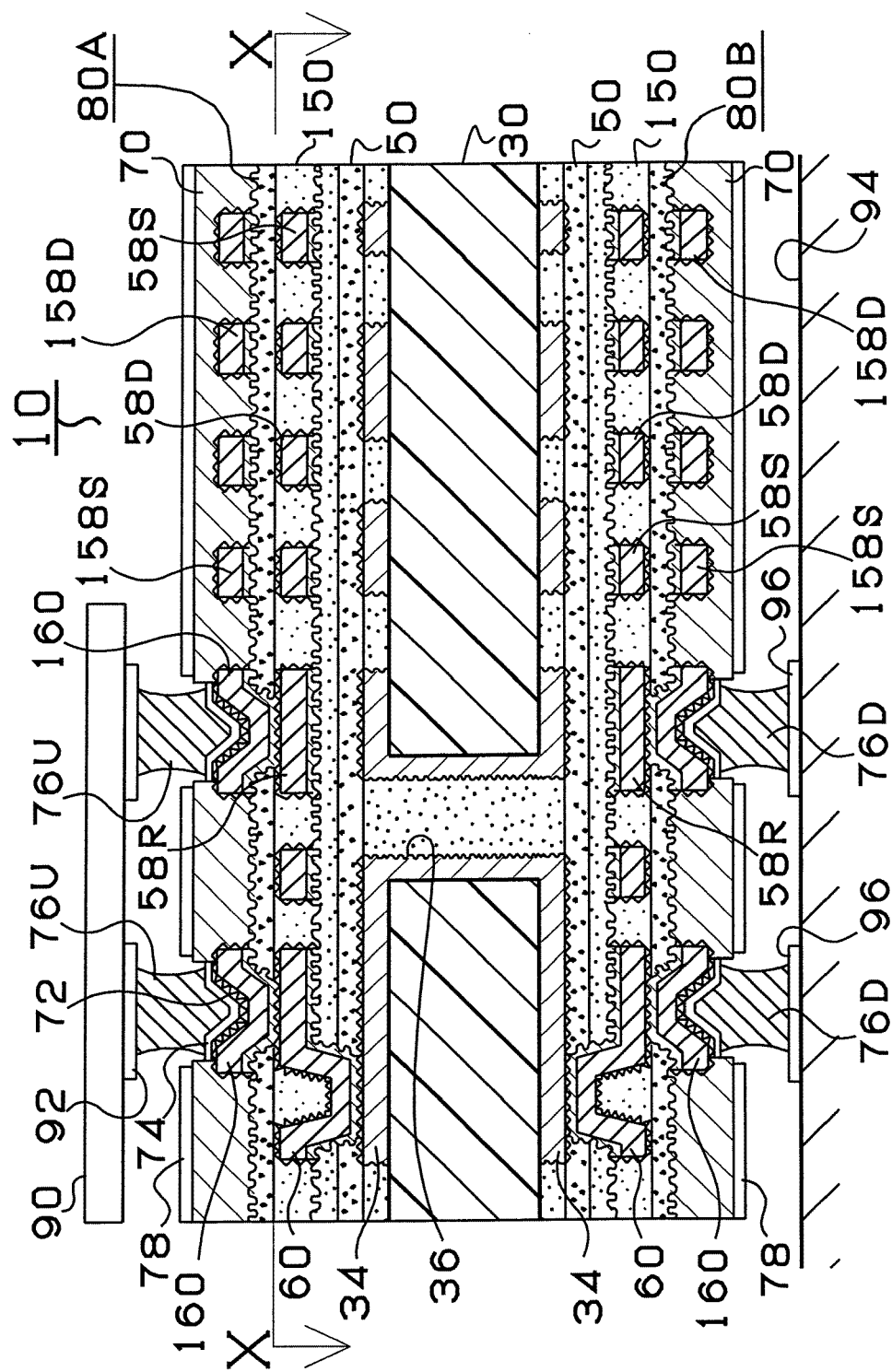
FIG. 17 is a cross-sectional view of a multilayer build-up wiring board in accordance with a third embodiment of the present invention.

As shown in FIG. 17, a through hole 36 is formed within a core substrate 30 in the printed wiring board 10, and a conductor circuit 34 is formed on each of both faces of the core substrate 30. A lower layer side interlayer resin insulating layer 50 is formed on the core substrate 30. A conductor layer constructed by a via hole 60, a wiring pattern 58S, a land 58R and a dummy conductor 58D is formed in the lower layer side interlayer resin insulating layer 50. An upper layer interlayer resin insulating layer 150 is arranged on the lower layer interlayer resin insulating layer 50. A conductor layer constructed by a via hole 160, a signal line 158S and a dummy conductor 158D is formed in the interlayer resin insulating layer 150.

A soldering bump 76U for connection to a land 92 of an IC chip 90 is arranged on an upper face side of the printed wiring board 10. The soldering bump 76U is connected to the through hole 36 through the via holes 160 and 60. A soldering bump 76D for connection to a land 96 of a daughter board 94 is arranged on a lower face side of the printed wiring board 10. The soldering bump 76D is connected to the through hole 36 through the via holes 160 and 60.

Figure 18:
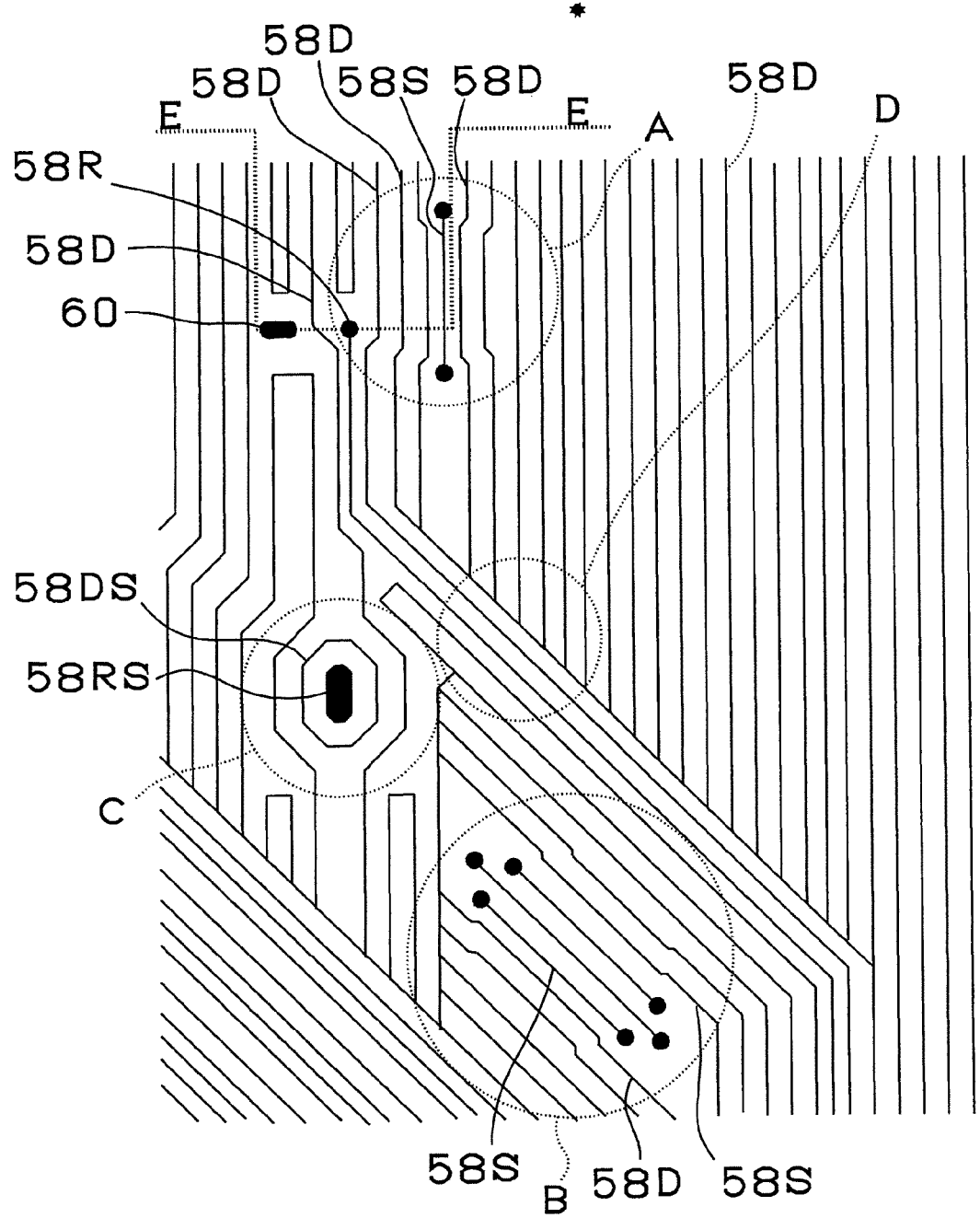
FIG. 18 is a transversal sectional view taken along line X-X of FIG. 17.

FIG. 18 shows an X-X transversal sectional face of FIG. 17, i.e., a plan view of a conductor layer formed on a surface of the lower layer interlayer resin insulating layer 50. An E-E section of FIG. 18 corresponds to FIG. 17. As shown in FIG. 18, a wiring pattern 58S, a land 58R, an isolated land 58RS, a dummy conductor 58D and a dummy conductor 58DS are formed as a conductor layer on the interlayer resin insulating layer 50.

FIG. 19(A) enlarged shows a portion surrounded by reference numeral A in FIG. 18. In the third embodiment, the dummy conductor 58D is arranged around the isolated wiring pattern 58S. In contrast to this, FIG. 19(B) shows an enlarged portion surrounded by reference numeral B of FIG. 18. Here, the dummy conductor 58D is arranged around three wiring patterns 58S. In the printed wiring board in the third embodiment, the dummy conductor 58D is arranged around the wiring pattern 58S. Accordingly, no concentration of an electric field is caused when the conductor layer is formed by electrolytic plating as described later. Further, no overetching is caused in light etching described later. Accordingly, the wiring pattern 58S can be formed in predetermined thickness (15 μm) and width (37 μm). Further, an isolated signal line and a signal line in a close portion can be formed in uniform thicknesses. Accordingly, the thickness of the interlayer resin insulating layer 150 in upper layers of these signal lines can be uniformed so that electric characteristics of the printed wiring board can be improved.

A width of the dummy conductor 58D is set to one to three times (37 to 111 μm) a minimum width (37 μm) of the wiring pattern 58S. If such a width of the dummy conductor 58D is set, no electric field is concentrated to the wiring pattern 58S and the dummy conductor 58D so that the signal lines and the dummy conductor can be formed in predetermined thicknesses. In contrast to this, a minimum distance D1 between the dummy conductor 58D and the wiring pattern 58S is set to one to three times (37 to 111 μm) the width of a signal line 38. Therefore, no concentration of an electric field is caused and the wiring pattern and the dummy conductor can be formed in predetermined thicknesses.

FIG. 20(C) shows an enlarged portion surrounded by reference numeral C in FIG. 18. An isolated land 58RS is surrounded by the dummy conductor 58DS. In the printed wiring board in the third embodiment, the dummy conductor 58DS is arranged so as to surround the isolated land 58RS so that no concentration of an electric field is caused when the conductor layer is formed by electrolytic plating as described later. Further, no overetching is caused in light etching described later. Accordingly, the isolated land 58RS can be formed in predetermined thickness (15 μm) and diameter (133 μm). Therefore, the isolated land 58DS and the land 58D in a close portion can be formed in uniform thicknesses. Further, the thickness of the interlayer resin insulating layer 150 in an upper layer of the wiring pattern can be uniformed so that electric characteristics of the printed wiring board can be improved.

A minimum width of the dummy conductor 58DS around the isolated land 58RS is set to ⅙ to 3 times (22 to 399 μm) a land diameter (133 μm). Therefore, no concentration of an electric field is caused and the land and the dummy conductor can be formed in predetermined thicknesses. Further, since the minimum distance D2 between the dummy conductor 58DS and the isolated land 58RS is set to ⅙ to 3 times (22 to 399 μm) the land diameter, no concentration of an electric field is caused and the land and the dummy conductor can be formed in predetermined thicknesses. Further, since a peripheral portion of the isolated land 58RS is surrounded by the dummy conductor 58DS, it is possible to reduce that the isolated land 58RS is influenced by noises, etc. from the exterior.

FIG. 20(C') shows an isolated land different from the isolated land shown in FIG. 20(C). In the example shown in FIG. 20(C'), a dummy conductor 58DS is connected to a via hole 60 and is also connected to an earth line on the side of a core substrate 30 (see FIG. 17). In this example, since the dummy conductor 58DS is connected to the earth, it is possible to prevent the isolated land 58RS from being influenced by noises, etc. from the exterior.

Figure 21:
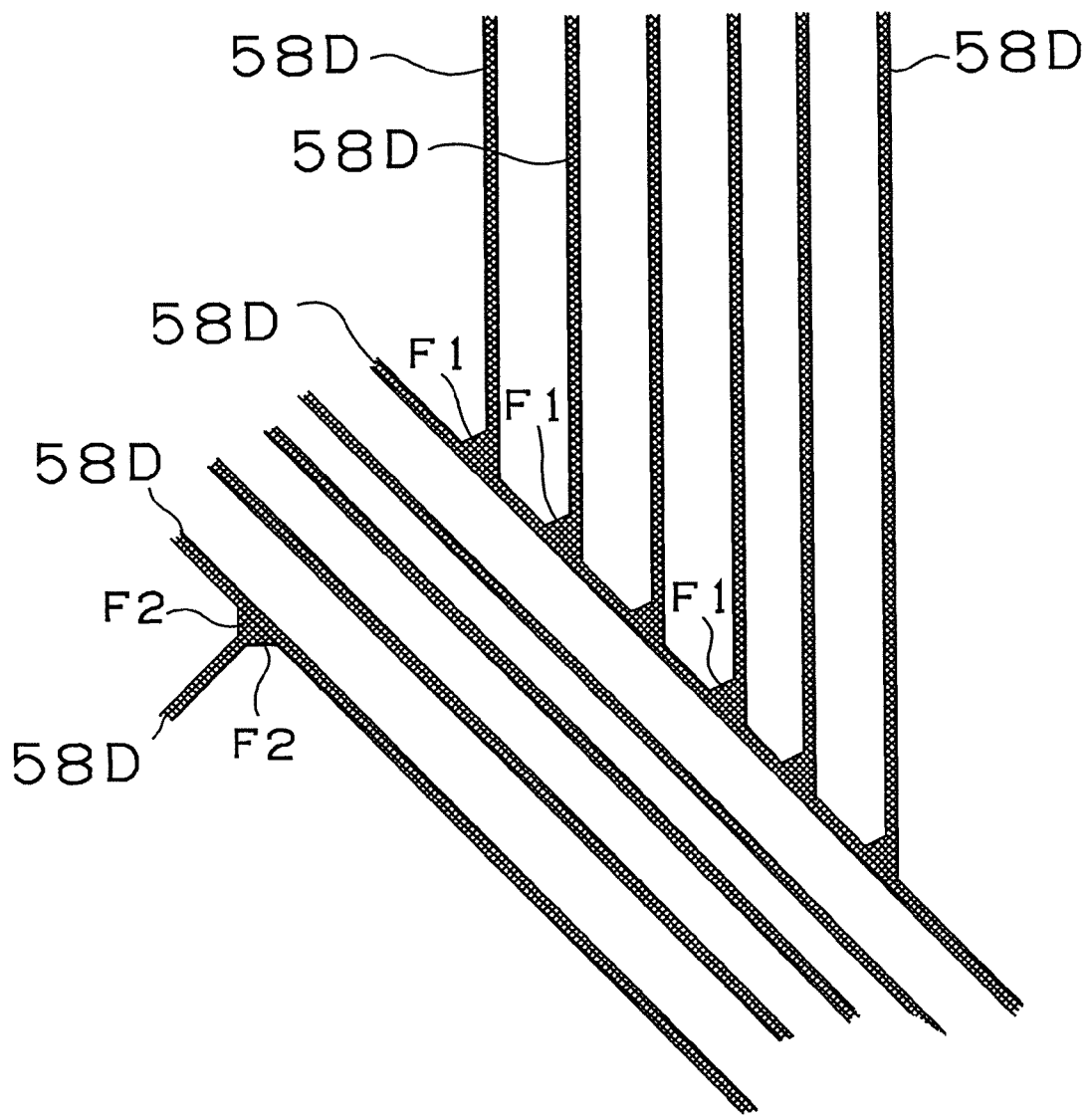
FIG. 21 is an enlarged view of a D-portion in FIG. 18.
Figure 23:
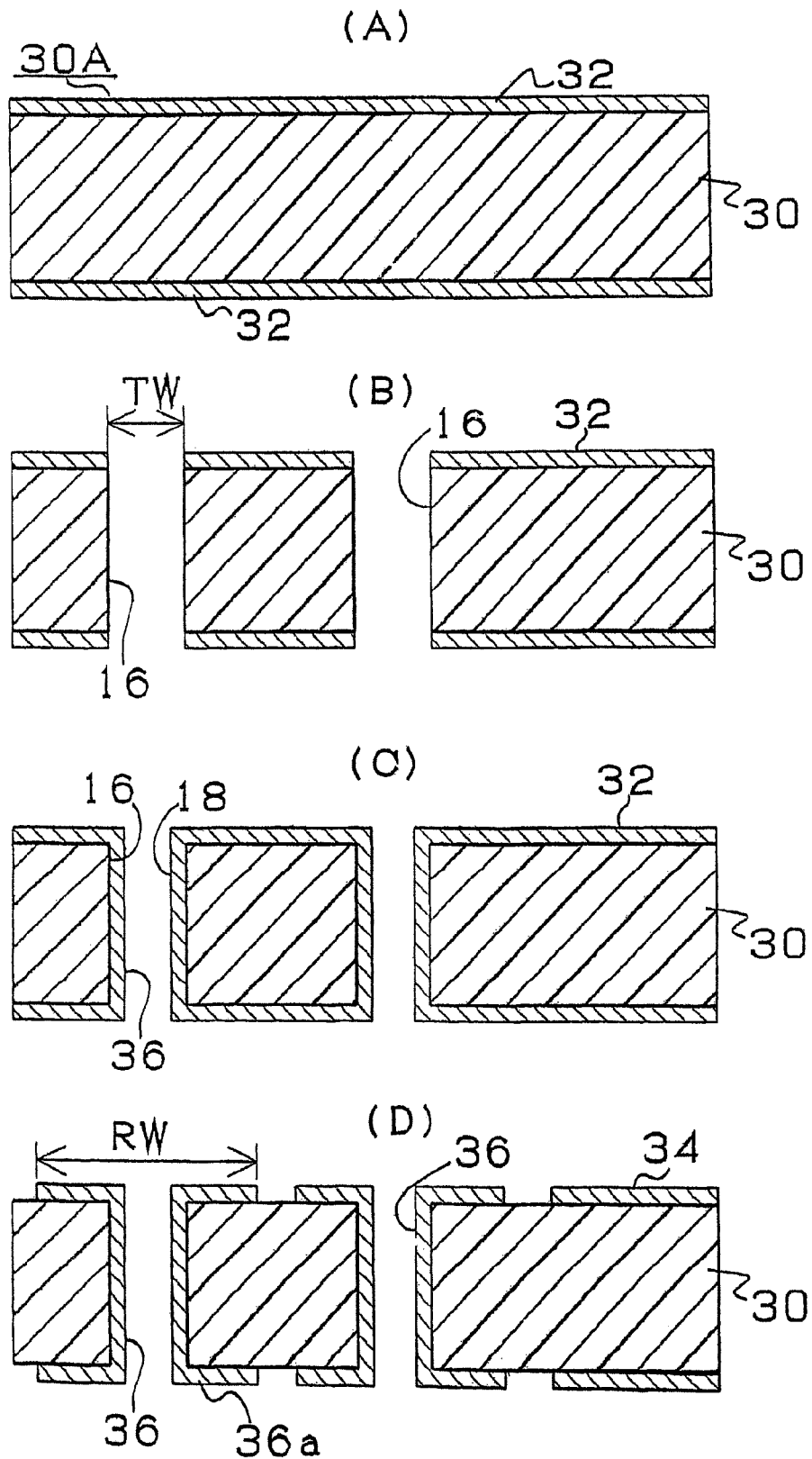
FIG. 23 is a manufacturing process view of a printed wiring board in accordance with a fourth embodiment of the present invention.
Figure 24:
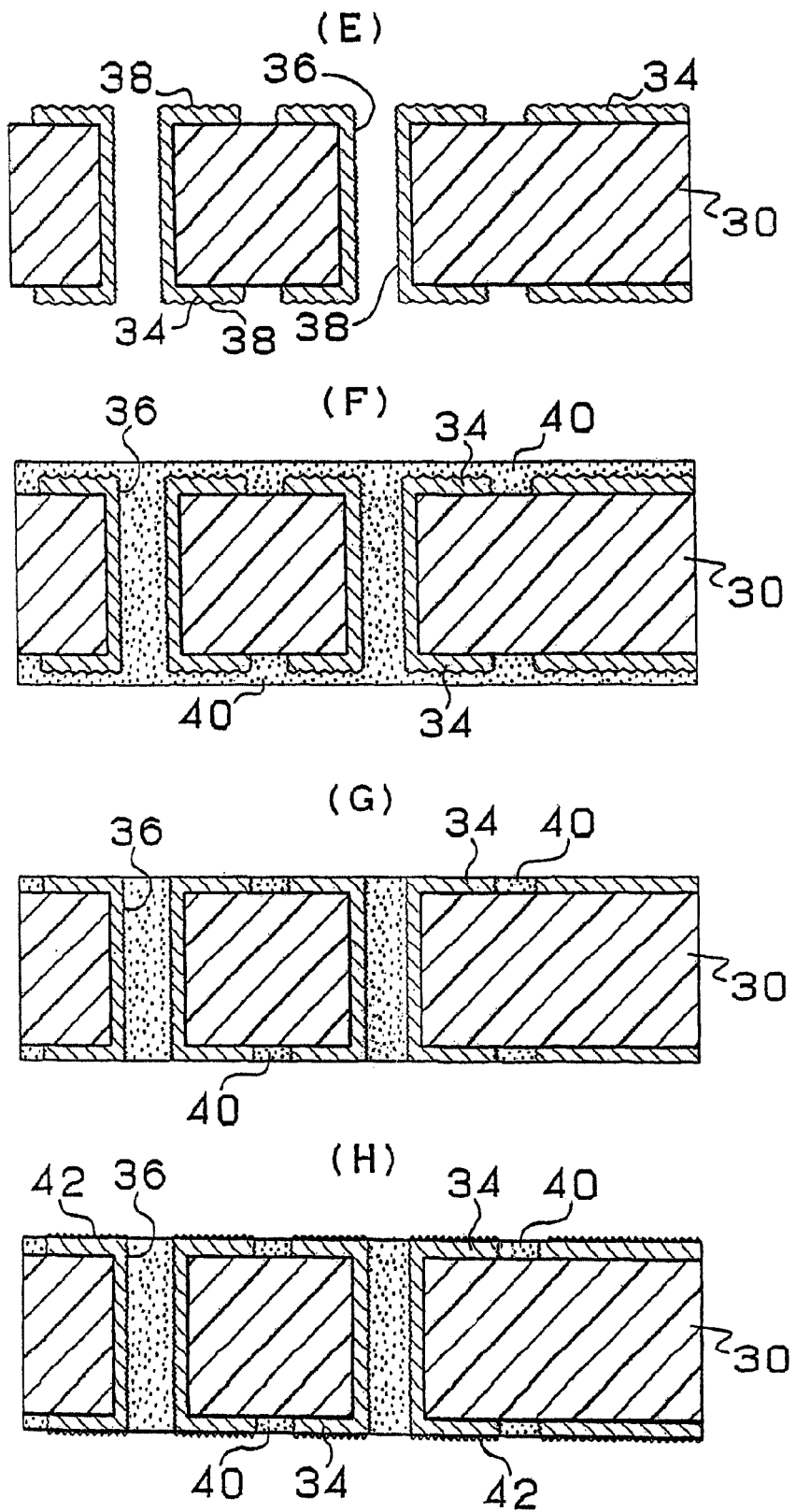
FIG. 24 is a manufacturing process view of the printed wiring board in accordance with the fourth embodiment.
Figure 25:
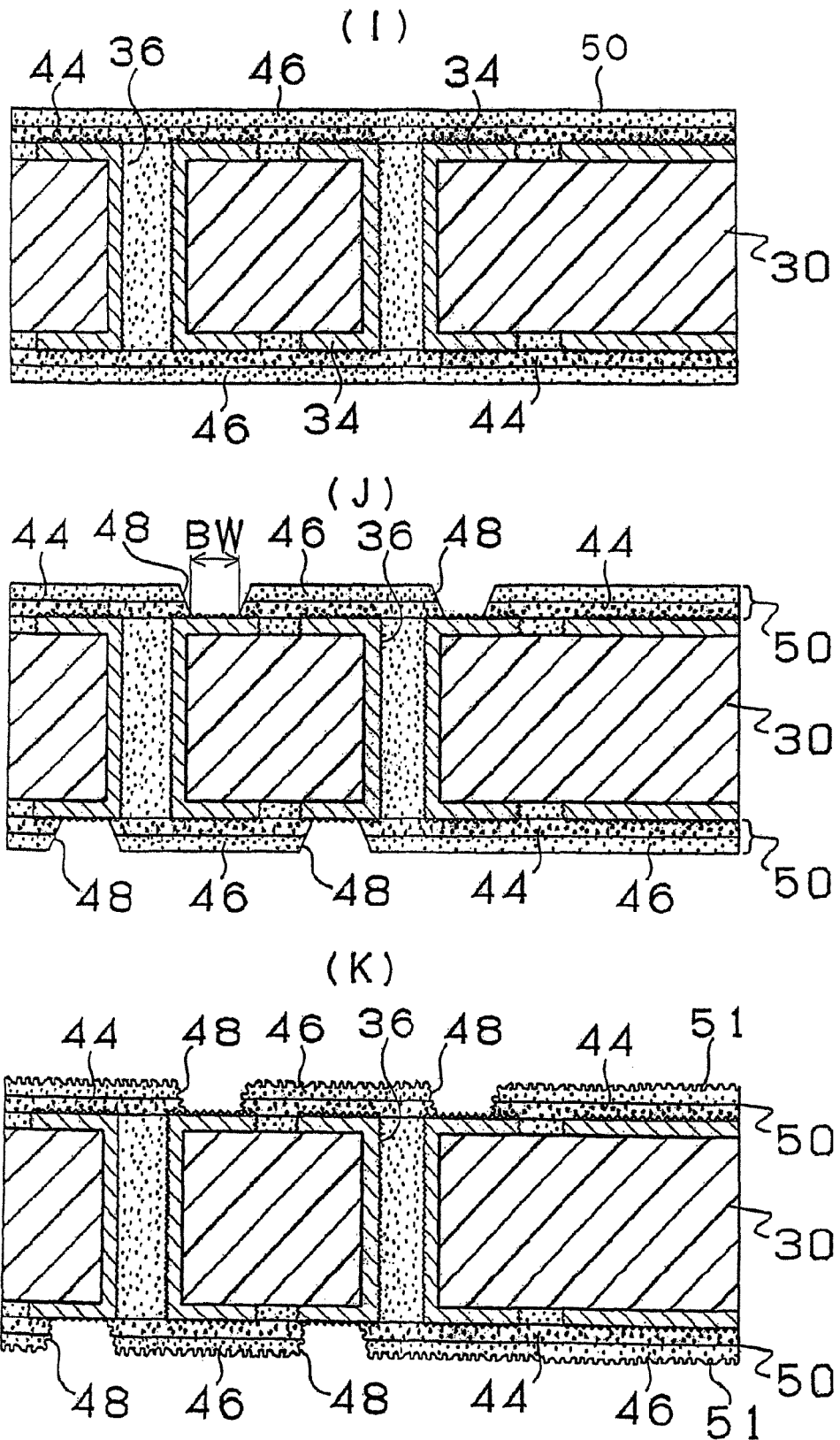
FIG. 25 is a manufacturing process view of a multilayer printed wiring board in accordance with the fourth embodiment.

FIG. 21 shows an enlarged portion surrounded by reference numeral D in FIG. 18. In a printed wiring board 10 in the third embodiment, a filet F2 is formed in a right angle portion in a crossing portion of dummy conductors 58D and 58D, and a filet F1 is formed in an acute angle portion in the crossing portion. Therefore, the dummy conductors can be properly connected to each other. Further, the right angle portion and the acute angle portion are not formed to prevent a crack which is caused by stress concentration caused by a corner portion. Namely, when there is a corner portion in one portion of the conductor layer, thermal stress is concentrated in a heat cycle and a crack is caused in the interlayer resin insulating layer with such a corner portion as a starting point in a certain case. However, it is possible to prevent such a crack from being caused in the printed wiring board in the third embodiment.

FIG. 22(E) shows a case in which the wiring pattern 58S and the isolated land 58RS are located in proximity to each other. In such a case, both the wiring pattern 58S and the isolated land 58RS can be surrounded by the dummy conductor 58D. In contrast to this, FIG. 22(F) shows a case in which a plain layer 58H for a power source layer exists in the vicinity of the wiring pattern 58S. In such a case, it is not necessary to particularly arrange a dummy conductor between the wiring pattern 58S and the plain layer 58H.

A manufacturing method of the printed wiring board in accordance with the above third embodiment is similar to that in the above first embodiment. Therefore, an explanation of this manufacturing method is omitted here.

In the printed wiring board in the third embodiment, similar to the first embodiment mentioned above with reference to FIG. 4, a conductor layer and a via hole 60 are formed by forming an electrolytic copper plating film 56 on an electroless copper plating film 52. As mentioned above with reference to FIG. 18, a wiring pattern 58S, a land 58R, an isolated land 58RS, a dummy conductor 58D and a dummy conductor 58DS are formed as this conductor layer. Here, in the third embodiment, the dummy conductors 58D, 58DS are arranged around the isolated wiring pattern 58S and the isolated land 58RS. Therefore, in the above electrolytic plating, no concentration of an electric field is caused and the wiring pattern 58S, the land 58R and the isolated land 58RS can be formed in uniform thicknesses.

When the electroless plating film 52 is removed by light etching, the dummy conductor 58D is arranged around the isolated wiring pattern 58S in the third embodiment. Therefore, an etching liquid is uniformly moved around the wiring pattern 58S so that the wiring pattern 58S can be formed in uniform thickness (15 μm) and width (37 μm).

A printed wiring board in accordance with a fourth embodiment of the present invention will next be explained with reference to the drawings.

Figure 30:
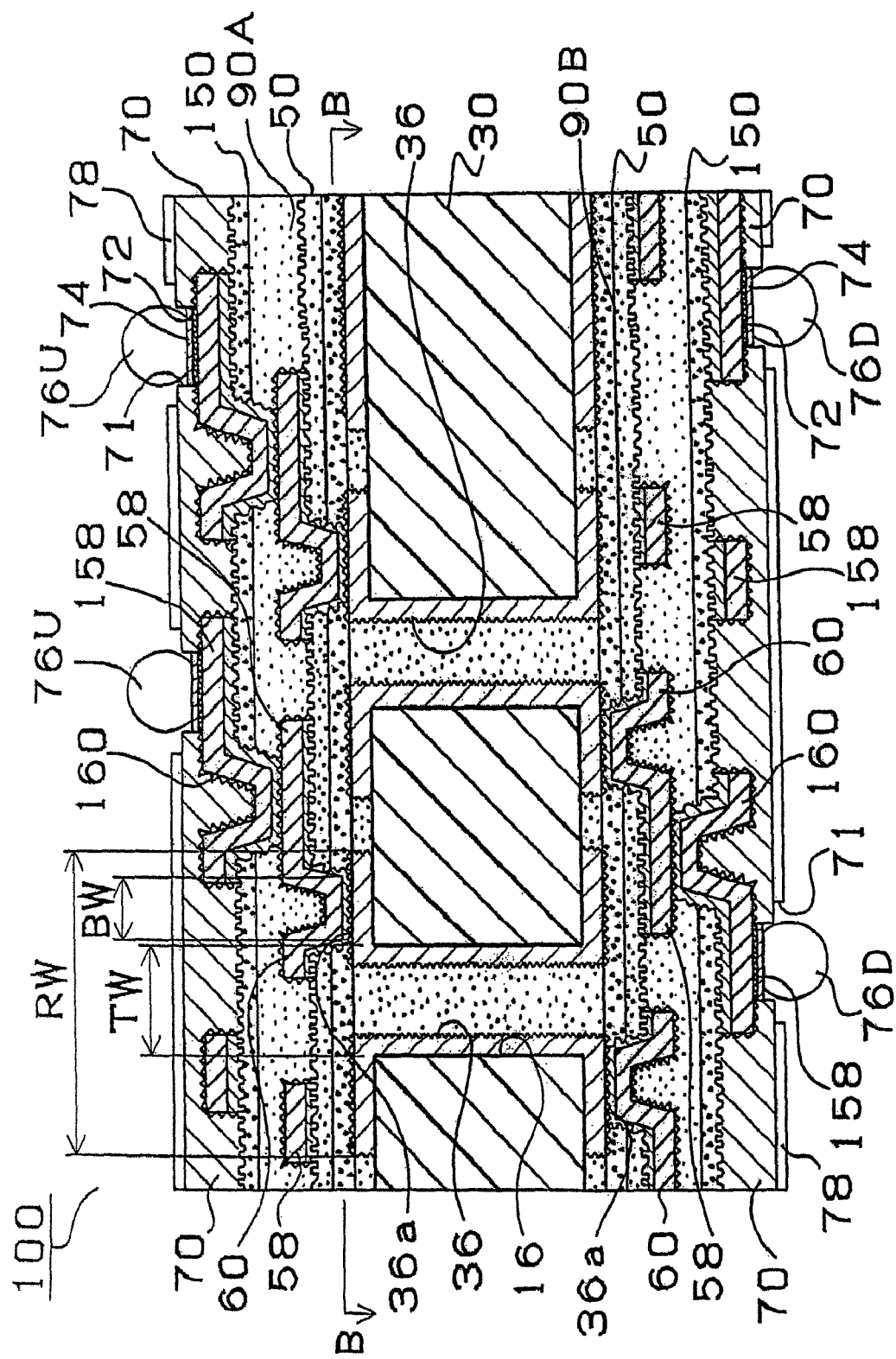
FIG. 30 is a cross-sectional view of a manufacturing method of the printed wiring board in accordance with the fourth embodiment of the present invention.

FIG. 30 shows a section of the printed wiring board in accordance with the fourth embodiment of the present invention. Build-up wiring layers 90A, 90B are formed on front and rear faces of a multilayer core substrate 30. The build-up layers 90A, 90B are constructed by interlayer resin insulating layers 50 and 150. A via hole 60 and a conductor circuit 58 are formed in the interlayer resin insulating layer 50. A via hole 160 and a conductor circuit 158 are formed in the interlayer resin insulating layer 150.

A soldering bump 76U for connection to an unillustrated bump of an IC chip is formed on a front side of the printed wiring board. A soldering bump 76D for connection to an unillustrated bump of a mother board is formed on a rear side of the printed wiring board. A conductor circuit from the soldering bump 76U connected to the IC chip is connected to the soldering bump 76D connected to a mother board side within the printed wiring board. The build-up layer 90A on the front side and the build-up layer 90B on the rear side are connected to each other through a through hole 36 formed in the core substrate 30.

A land 36a is formed in an opening of the through hole 36. The via hole 60 on an upper layer side is connected to the land 36a. The via hole 160 in an upper layer is connected to the conductor circuit 58 connected to the via hole 60. The soldering bumps 76U, 76D are formed in the conductor circuit 158 connected to the via hole 160.

Figure 31:
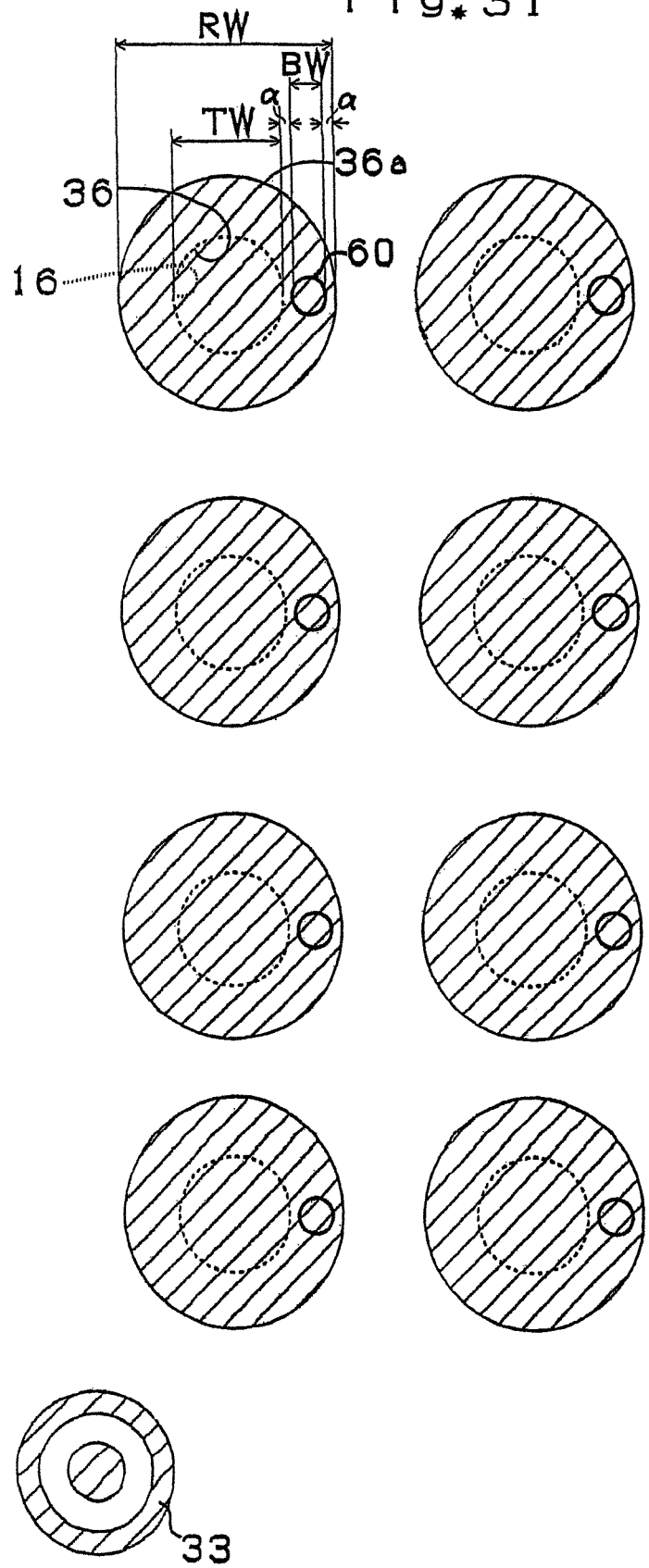
FIG. 31 is a cross-sectional view taken along line B-B of a core substrate shown in FIG. 30.
Figure 32:
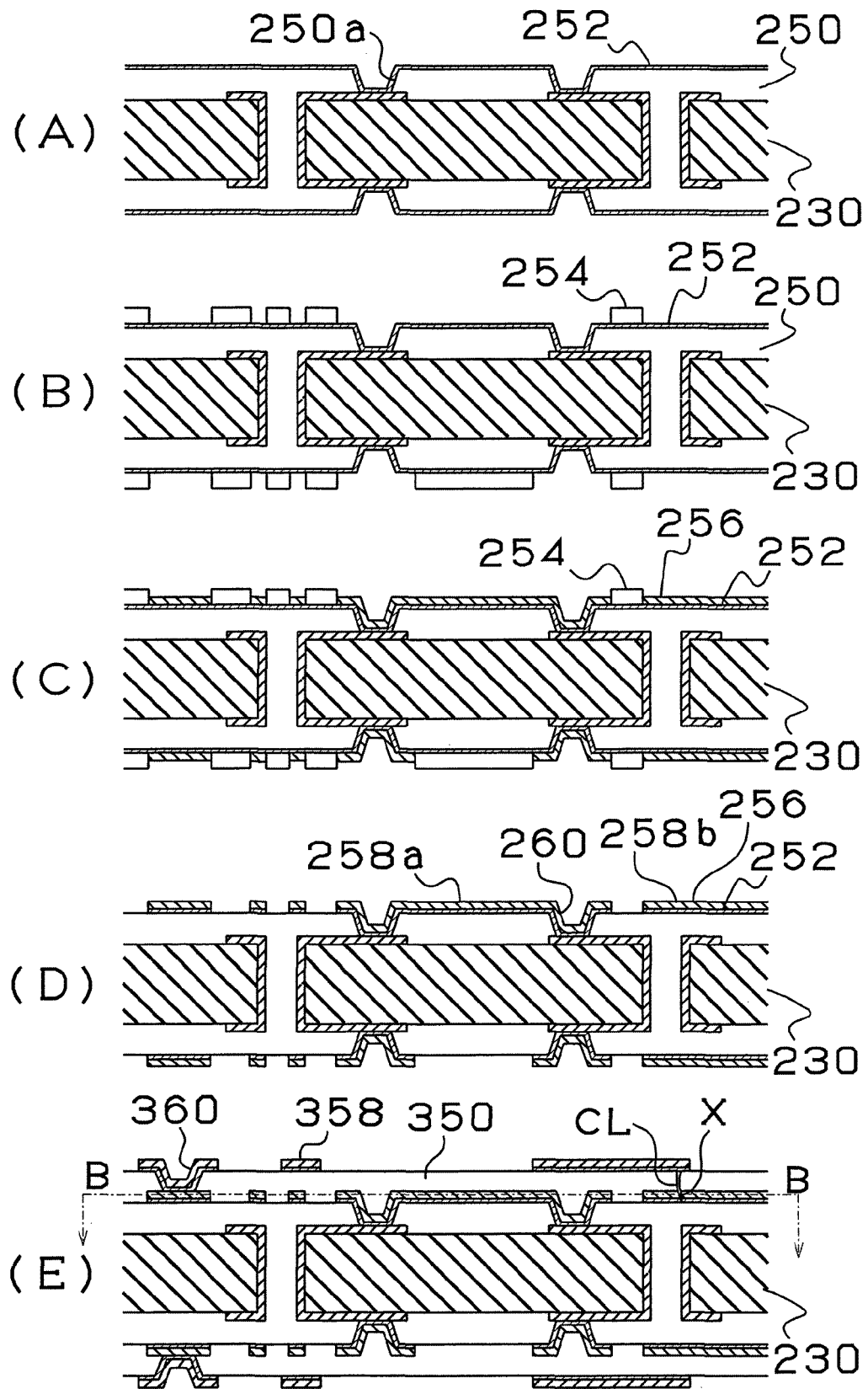
FIG. 32 is a process view of a manufacturing method of a multilayer printed wiring board in the prior art.

FIG. 31 shows a B-B section of the core substrate 30 of the printed wiring board in FIG. 30. Here, the land 36a formed in the opening of the through hole 36 is formed in a circular shape, and the via hole 60 is directly connected to the land 36a as mentioned above with reference to FIG. 30. In such connection, an area just above the land 36a functions as an inner layer pad of the prior art so that there is no dead space. Further, no inner layer pad 226b for connection from the land 36a to the via hole 60 is added. Accordingly, the land 36a of the through hole 36 can be formed in a circular shape. As a result, the number of through holes can be increased by improving an arranging density of the through hole 36 arranged within the multilayer core substrate 30.

Further, as mentioned above, wirings from plural bumps on the rear face of the printed wiring board are connected to bumps on the front side while these wirings on the rear face are integrated with each other. The wirings can be integrated with each other at the same pace in the build-up wiring layers 90A, 90B formed on the front and rear sides by forming the through holes at a required density. Thus, it is possible to reduce the number of build-up wiring layers 90A, 90B formed on the front and rear sides.

In the printed wiring board in the fourth embodiment, the via hole 60 is formed on the land 36a by setting a radius of the land 36a to be equal to or greater than a value provided by adding the diameter TW of a passing hole 16, an error range of the land 36a with respect to the passing hole 16 with respect to the land 36a, a diameter BW of the opening (via hole) 60, and an error range 2α of the opening 60. In contrast to this, the arranging density of the through holes is set to be increased by setting a diameter RW of the land 36a to be equal to or smaller than 700 μm in comparison with a construction in which a land for arranging the via hole is added to the land of the prior art.

A concrete numeric value of a radius of the passing hole 16 for a through hole is desirably set to be equal to or smaller than 175 μm and be equal to or greater than 125 μm. When the radius of the passing hole 16 exceeds 175 μm, the number of through holes arranged in the core substrate is reduced. In contrast to this, when the radius of the passing hole 16 is smaller than 125 μm, it is difficult to form the passing hole 16 by a drill. On the other hand, a radius of the land 36a is desirably set to be greater by 75 μm to 175 μm than the radius of the passing hole 16 for a through hole. This is because 75 μm is obtained in total as a minimum value able to be technically set by adding a diameter 25 μm of the via hole 60, an error ±12.5 (25 in total) μm of the opening for the via hole with respect to the land 36a, and an error 25 μm of the land 36a with respect to the passing hole 16. On the other hand, 175 μm is obtained in total as a minimum value able to be economically set in mass production by adding a diameter 35 μm of the via hole 60, an error ±20 (40 in total) μm of the opening 60 for the via hole, and an error 100 μm of the land 36a with respect to the passing hole 16. Namely, the via hole can be arranged technically and economically on the land by forming the land such that the radius of the land is greater by 75 μm to 175 μm than the radius of the through hole.

A manufacturing method of the printed wiring board in accordance with the fourth embodiment will be subsequently explained with reference to FIGS. 23 to 30.

The compositions of A. an adhesive for electroless plating, B. an interlayer resin insulating agent, and C. a resin filling agent used in the manufacturing method of the printed wiring board in the fourth embodiment are similar to those in the first embodiment. Therefore, an explanation of these compositions is omitted here.

(1) As shown in FIG. 23(A), a copper spreading laminating material 30A is set to a starting material. In the copper spreading laminating material 30A, both faces of a substrate 30 are laminated with a copper foil 32 having 18 μm in thickness. First, a hole is formed by a drill in this copper spreading laminating plate 30A so that a passing hole 16 having 300 μm in diameter (TW) is formed (FIG. 23(B)). The diameter of the passing hole 16 for a through hole is desirably set to be equal to or smaller than 350 μm and be equal to or greater than 250 μm. When the diameter of the passing hole 16 exceeds 350 μm, the number of through holes arranged in the core substrate is reduced. In contrast to this, when the diameter of the passing hole 16 is smaller than 250 μm, it is difficult to form the passing hole 16 by a drill. Next, electroless plating processing is performed with respect to the entire substrate, and an electroless plating copper film 18 is deposited in an inner wall of the passing hole 16 and a through hole 36 is formed (FIG. 23(C)). A land 36a of the through hole, a conductor circuit 34 and a position aligning mark 33 (see FIG. 31) are subsequently formed by etching the substrate in a pattern shape (FIG. 23(B)). Here, the land 36a is formed such that this land 36a has 600 μm in diameter (RW).

(2) This substrate 30 is washed with water and is dried. Thereafter, a coarsened layer 38 is formed by oxidizing-reducing processing on surfaces of the conductor circuit 34, the through hole 36 and the land 36a as shown in FIG. 24(E).

(3) Raw material composition substances for adjusting and manufacturing the resin filling agent in the above-mentioned C are mixed and kneaded and the resin filling agent is obtained.

(4) The core substrate 30 is printed by using a mask, and the interior of the through hole 36 is filled with the filling agent 40, and a surface of the substrate 30 is coated with the filling agent 40 (see FIG. 24(F)). Thereafter, the filling agent 40 is thermally hardened.

(5) The substrate 30 completely processed in the above (4) is polished by a belt sander so as not to leave the resin filling agent on surfaces of the land 36a of the through hole 36 and the conductor circuit 34. Next, the resin filling agent 40 is hardened by heating processing. The coarsened layer on an upper face of the substrate 30 is removed therefrom and both faces of the substrate 30 are smoothed as shown in FIG. 24(G).

(6) A coarsened layer (irregular layer) 42 is formed on upper faces of the through hole land 36a and the conductor circuit 34 exposed in the processing of the above (5) as shown in FIG. 24(H).

(7) Raw material composition substances for adjusting and manufacturing an interlayer resin insulating agent of the composition substance B are stirred and mixed and are adjusted to 1.5 Pa·s in viscosity so that the interlayer resin insulating agent (for a lower layer) is obtained.

Next, raw material composition substances for adjusting and manufacturing an adhesive for electroless plating of the composition substance A are stirred and mixed and are adjusted to 7 Pa·s in viscosity so that an adhesive solution (for an upper layer) for electroless plating is obtained.

(8) As shown in FIG. 25(I), both the faces of the substrate 30 (FIG. 24(H)) in the above (6) are coated with the interlayer resin insulating agent (for a lower layer) 44 having 1.5 Pa·s in viscosity and obtained in the above (7) and are dried. Next, both the faces of the substrate 30 are coated with the photosensitive adhesive solution (for an upper layer) 46 having 7 Pa·s in viscosity and obtained in the above (7) and are dried. Thus, an adhesive layer 50 having 35 μm in thickness is formed.

(9) An unillustrated photomask film is closely attached to both the faces of the substrate 30 having the adhesive layer 50 formed in the above (8), and is exposed. This film is spray-developed and the substrate is further exposed and heated (post baked). Thus, as shown in FIG. 25(J), an interlayer resin insulating layer (two-layer structure) 50 having 35 μm in thickness is formed. This interlayer resin insulating layer 50 has an opening (an opening for forming a via hole) 48 having 30 μmφ in diameter (BW) and an excellent size accuracy corresponding to the photomask film.

In the formation of this opening 48, a position of the photomask film is aligned with the position aligning mark 33 shown in FIG. 31 as a reference. Since the above passing hole 16 for a through hole is mechanically formed by a drill, it is difficult to improve position accuracy. Therefore, the land 36a formed in the passing hole is formed in a position accuracy of 90 μm (±45 μm) with respect to the passing hole. The position accuracy of the land 36a is relatively high since this land is optically formed as mentioned above. Therefore, a position accuracy of the opening 48 with respect to the land 36a is set to ±15 μm by setting this position accuracy twice or more.

Here, positioning marks 33 shown in FIG. 31 are arranged by the above required accuracy obtained with respect to the core substrate 30 for multiple chamfering together with the land 36a, and the position accuracy is improved by aligning the position of the photomask film with the positioning marks 33 as references. For example, when the land is formed, the photomask film is aligned with position aligning references (positioning marks) of four corners of one multiple chamfering substrate (e.g., corresponding to 36 substrates). In contrast to this, when the opening 48 is formed, the photomask film is aligned with position aligning references (positioning marks) arranged at four corners of some divided substrates (e.g., corresponding to 8 substrates) so that the required accuracy is achieved.

Here, the opening 48 can be formed on the land 36a by setting the radius of the land 36a to be greater by 140 μm or more than the radius of the passing hole 16 for a through hole. This is because 75 μm is obtained in total as a minimum value able to be technically set by adding a diameter 25 μm of the via hole 60, an error ±12.5 (25 in total) μm of the opening for the via hole with respect to the land, and an error 25 μm of the land 36a with respect to the passing hole 16. On the other hand, the multilayer printed wiring board can be formed with high yield by forming the land 36a at a large size of about 175 μm. This is because 175 μm is obtained in total as a minimum value able to be economically set in mass production by adding a diameter 35 μm of the via hole 60, an error ±20 (40 in total) μm of the opening 60 for the via hole, and an error 100 μm of the land 36a with respect to the passing hole 16. In the printed wiring board in the fourth embodiment, the via hole can be arranged technically and economically on the land by forming the land such that the radius of the land is greater by 140 μm to 175 μm than the radius of the through hole.

Here, the opening 48 is formed by etching, but can be similarly formed by using a laser beam.

(10) The substrate 30 forming the opening 48 therein is dipped into chromic acid. As shown in FIG. 25(K), a surface of the interlayer resin insulating layer 50 is set to a coarsened layer 51 and is then dipped into a neutralization liquid and is washed with water.

Further, catalyst nuclei are attached to the surface of the interlayer resin insulating layer 50 and an inner wall face of the opening 48 for the via hole.

(11) The substrate is dipped into an electroless copper plating aqueous solution and an electroless copper plating film 52 having 0.6 μm in thickness, which is formed on an entire coarse surface of the substrate as shown in FIG. 26(L).

(12) After a resist film sold at a market is stuck to the electroless copper plating film 52, a mask is arranged on the resist film and this resist film is exposed and developed so that a plating resist 54 having 15 μm in thickness is formed as shown in FIG. 26(M).

(13) An electrolytic plating copper film 56 having 15 μm in thickness is formed by performing electrolytic copper plating (FIG. 27(N)).

(14) After the plating resist 56 is separated and removed from the substrate by 5% KOH, the electroless plating film 52 below this plating resist 56 is dissolved and removed by etching processing using a mixing liquid of sulfuric acid and hydrogen peroxide. As shown in FIG. 27(O), a conductor circuit 58 and a via hole 60 having 15 μm in thickness and constructed by the electroless copper plating film 52 and the electrolytic copper plating film 56 are thus formed. Further, an adhesive layer surface for electroless plating between the conductor circuit 58 and the via hole 60 is etched by 1 μm so that a palladium catalyst is removed from this surface.

(15) The substrate 30 forming the conductor circuit 58 thereon is dipped into an electroless plating liquid. As shown in FIG. 28(P), a coarsened layer 62 constructed by copper, nickel and phosphorus and having 3 μm in thickness is formed on surfaces of the conductor circuit 58 and the via hole 60. The surfaces of the conductor circuit 58 and the via hole 60 can be also coarsened by an etching liquid or oxidizing-reducing processing instead of this coarsened layer 62.

An Sn layer having 0.3 μm in thickness can be formed on a surface of the coarsened layer 62 by causing a Cu—Sn substitution (no Sn layer is illustrated in the drawings).

(16) An interlayer resin insulating layer 150, a via hole 160 and a conductor circuit 158 in an upper layer are further formed by repeating processes from (2) to (15) (FIG. 28(Q)).

(17) Both faces of the wiring board obtained in the above (16) are coated with a solder resist composition substance sold at a market and having 20 μm in thickness. Next, after the wiring board is dried, the wiring board is exposed and developed. Further, the wiring board is heated and a solder resist layer (having 20 μm in thickness) 70 is formed (see FIG. 29(R)). A pad portion 71 (having an opening diameter of 200 μm) is opened in this solder resist layer 70.

(18) A peripheral portion of an opening group of the solder resist is subsequently coated with a resin composition substance for reinforcing the solder resist layer so that a reinforcing layer 78 having 40 μm in thickness is formed.

(19) The substrate 30 forming the solder resist layer 70 thereon is next dipped into an electroless nickel plating liquid and a nickel plating layer 72 having 5 μm in thickness is formed in the opening portion 71. Further, this substrate 30 is dipped into an electroless gold plating liquid and a gold plating layer 74 having 0.03 μm in thickness is formed on the nickel plating layer 72 (FIG. 29(S)).

(20) Soldering paste is then printed on the opening portion 71 of the solder resist layer 70 and soldering bumps 76U, 76D are formed by reflowing the soldering paste at 200° C. so that a printed wiring board having the soldering bumps is manufactured (FIG. 30).

The invention claimed is:

1. A printed wiring board comprising:
    a core substrate;
    a build-up layer formed over the core substrate and comprising a first insulating layer, a conductor layer formed over the first insulating layer, and a second insulating layer formed over the conductor layer; and
    at least one wiring pattern formed over the first insulating layer, wherein the conductor layer includes a plurality of conductor portions, and the conductor portions are electrically independent from the wiring pattern and have notched portions, respectively, facing each other across the wiring pattern.

2. The printed wiring board according to claim 1, wherein the wiring pattern has a narrow width portion, and the notched portions of the conductor portions face each other across the narrow width portion of the wiring pattern.

3. The printed wiring board according to claim 2, wherein the wiring pattern has a width narrowed on sides opposing the conductor portions.

4. The printed wiring board according to claim 1, wherein the conductor portions are via hole lands or pads for mounting.

5. The printed wiring board according to claim 1, wherein the at least one wiring pattern comprises a plurality of wiring patterns.

6. The printed wiring board according to claim 5, wherein the wiring patterns have narrow width portions, respectively, and the notched portions of the conductor portions face each other across the narrow width portions of the wiring patterns.

7. The printed wiring board according to claim 5, wherein the conductor portions are via hole lands or pads for mounting.

8. The printed wiring board according to claim 5, wherein the first insulating layer, the conductor layer and the second insulating layer are laminated into a multilayer structure.

9. The printed wiring board according to claim 1, wherein the first insulating layer, the conductor layer and the second insulating layer are laminated into a multilayer structure.

\* \* \* \* \*